(12) United States Patent (10) Patent No.: US 8,987,694 B2
Han et al. (45) Date of Patent: Mar. 24, 2015

(54) SEMICONDUCTOR DEVICES HAVING A VERTICAL DIODE AND METHODS OF MANUFACTURING THE SAME

(71) Applicant: Samsung Electronics Co., Ltd., Suwon-Si, Gyeonggi-Do (KR)

(72) Inventors: Jae-Jong Han, Seoul (KR); Kong-Soo Lee, Hwaseong-gum (KR); Yoon-Goo Kang, Yongin-si (KR); Ho-Kyun An, Seoul (KR); Seong-Hoon Jeong, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 140 days.

(21) Appl. No.: 13/729,742

(22) Filed: Dec. 28, 2012

(65) Prior Publication Data

US 2013/0175491 A1 Jul. 11, 2013

(30) Foreign Application Priority Data

Jan. 6, 2012 (KR) .................... 10 2012 0002085

(51) Int. Cl.
| | |
|---|---|
| *H01L 29/02* | (2006.01) |
| *H01L 45/00* | (2006.01) |
| *H01L 27/102* | (2006.01) |
| *H01L 27/24* | (2006.01) |
| *H01L 27/10* | (2006.01) |

(52) U.S. Cl.
CPC ............ *H01L 45/04* (2013.01); *H01L 27/1021* (2013.01); *H01L 27/2409* (2013.01); *H01L 27/101* (2013.01); *H01L 45/06* (2013.01); *H01L 45/124* (2013.01); *H01L 45/141* (2013.01); *H01L 45/143* (2013.01); *H01L 45/144* (2013.01)

USPC ..... 257/2; 257/3; 257/4; 257/5; 257/E29.002; 438/102; 438/103; 438/104

(58) Field of Classification Search
CPC ......... H01L 45/04; H01L 29/00; H01L 27/24; G11C 13/0004
USPC .................. 257/1–5, E29.002; 438/102–104; 365/163
See application file for complete search history.

(56) References Cited

U.S. PATENT DOCUMENTS

| | | | |
|---|---|---|---|
| 7,858,960 B2 | 12/2010 | Chang | |
| 2010/0117048 A1* | 5/2010 | Lung et al. ........................ | 257/4 |
| 2010/0117049 A1* | 5/2010 | Lung et al. ........................ | 257/4 |
| 2013/0240871 A1* | 9/2013 | Shimoda et al. ................ | 257/43 |
| 2014/0151626 A1* | 6/2014 | Phatak ............................. | 257/4 |

FOREIGN PATENT DOCUMENTS

| | | |
|---|---|---|
| KR | 10094579 B1 | 3/2010 |
| KR | 100972075 B1 | 7/2010 |

* cited by examiner

*Primary Examiner* — Jami M Valentine
(74) *Attorney, Agent, or Firm* — Harness, Dickey & Pierce, P.L.C.

(57) ABSTRACT

Semiconductor devices, and methods of manufacturing the same, include a field region in a semiconductor substrate to define an active region. An interlayer insulating layer is on the semiconductor substrate. A semiconductor pattern is within a hole vertically extending through the interlayer insulating layer. The semiconductor pattern is in contact with the active region. A barrier region is between the semiconductor pattern and the interlayer insulating layer. The barrier region includes a first buffer dielectric material and a barrier dielectric material. The first buffer dielectric material is between the barrier dielectric material and the semiconductor pattern, and the barrier dielectric material is spaced apart from both the semiconductor pattern and the active region.

20 Claims, 67 Drawing Sheets

SEMICONDUCTOR DEVICES HAVING A VERTICAL DIODE AND METHODS OF MANUFACTURING THE SAME

CROSS-REFERENCE TO RELATED APPLICATION

This application claims priority under 35 U.S.C. §119 to Korean Patent Application No. 10-2012-0002085 filed on Jan. 6, 2012 in the Korean Intellectual Property Office, the disclosure of which is hereby incorporated by reference in its entirety.

BACKGROUND

1. Field

Example embodiments relate to a semiconductor device, a method of fabricating the same, and a memory device, memory card, electronic apparatus and electronic system adopting the semiconductor device.

2. Description of Related Art

With an increase in integration density of semiconductor devices, research into a technique of reducing a planar area occupied by elements of a semiconductor device has been conducted.

To increase the integration density of semiconductor devices, a phase-change random access memory (PRAM) has adopted a vertical diode as a switching device.

In a silicon (Si) diode, impurities (e.g., boron (B)) may easily diffuse from a P-type semiconductor region into an interlayer insulating layer disposed around the P-type semiconductor region. Accordingly, the concentration of B contained in the P-type semiconductor region of the Si diode disposed close to the interlayer insulating layer may be reduced.

As the width of the Si diode is on the decrease, a reduction in the concentration of B contained in the P-type semiconductor region of the Si diode gradually affects the electrical properties of the Si diode. For example, with the reduction in the concentration of B contained in the P-type semiconductor region of the Si diode, a resistance of the P-type semiconductor region of the Si diode may increase, and an on-current $I_{on}$ of the Si diode may be reduced.

SUMMARY

Example embodiments relate to a semiconductor device, a method of fabricating the same, and a memory device, memory card, electronic apparatus and electronic system adopting the semiconductor device.

Example embodiments provide a semiconductor device adopting a vertical diode as a switching device.

Other example embodiments provide a semiconductor device adopting a diode, which may improve integration density without degrading electrical properties.

Other example embodiments provide methods of fabricating the semiconductor devices.

Other example embodiments provide an electronic apparatus and electronic system having the semiconductor devices.

Example embodiments should not be limited by the above description, and other unmentioned aspects will be clearly understood by one of ordinary skill in the art from example embodiments described herein.

In accordance with example embodiments, a semiconductor device is provided. The device includes a field region in a semiconductor substrate to define an active region. An interlayer insulating layer is on the semiconductor substrate. A semiconductor pattern is within a hole vertically extending through the interlayer insulating layer. The semiconductor pattern is in contact with the active region. A barrier region is between the semiconductor pattern and the interlayer insulating layer. The barrier region includes a first buffer dielectric material and a barrier dielectric material. The first buffer dielectric material is between the barrier dielectric material and the semiconductor pattern, and the barrier dielectric material is spaced apart from both the semiconductor pattern and the active region.

The semiconductor pattern may include a first semiconductor region, and a second semiconductor region under the first semiconductor region. The first semiconductor region may include impurities of a first conductivity type, and the second semiconductor region may include impurities of a second conductivity type different from the first conductivity type of the first semiconductor region.

The barrier region may further include a second buffer dielectric material between the barrier dielectric material and the active region.

The field region may include a trench in the semiconductor substrate and a isolation pattern filling the trench.

The barrier region may include a first portion between the active region and the interlayer insulating layer, and a second portion between the isolation pattern and the interlayer insulating layer. The first portion may have a first vertical thickness, and the second portion may have a second vertical thickness less than the first vertical thickness.

The semiconductor device may further include a lower insulating layer between the interlayer insulating layer and the active region, and between the interlayer insulating layer and the isolation pattern. A vertical thickness of the lower insulating layer may be greater than a horizontal width of the barrier region.

A portion of the isolation pattern may extend upward and penetrate the interlayer insulating layer.

A top surface of the active region, which is spaced apart from the semiconductor pattern and close to the barrier region, may be disposed at a higher level than a bottom end of the semiconductor pattern.

The first buffer dielectric material may include silicon oxide, and the barrier dielectric material may include a doped silicon oxide having a higher dielectric constant than the first buffer dielectric material.

The semiconductor pattern may have first and second side surfaces disposed opposite each other. The active region may have a line shape having first and second side surfaces disposed opposite each other. The first and second side surfaces of the active region may be vertically aligned with the first and second side surfaces of the semiconductor pattern.

The semiconductor pattern may partially fill the hole. The barrier region may be between the semiconductor pattern and the interlayer insulating layer and extend on a sidewall of the hole at a higher level than the semiconductor pattern.

In accordance with other example embodiments, a semiconductor device is provided. The device includes an active region in a semiconductor substrate. A lower insulating layer and an upper insulating layer are sequentially stacked on the active region. A semiconductor pattern extends through the upper and lower insulating layers. The semiconductor pattern includes a first semiconductor region and a second semiconductor region under the first semiconductor region. A barrier region is on side surfaces of the first semiconductor region of the semiconductor pattern. The barrier region includes a doped silicon oxide.

The barrier region may be a portion of the upper insulating layer close to the semiconductor pattern.

The semiconductor device may further include an oxide region between the semiconductor pattern and the lower insulating layer.

The barrier region may have a higher dielectric constant than the upper insulating layer, and the lower insulating layer may have a higher dielectric constant than the barrier region.

In accordance with still other example embodiments, a semiconductor device, including a semiconductor substrate having an active region and a field region delimiting the active region, an interlayer insulating layer on the semiconductor substrate, a barrier layer structure extending along side surfaces of the interlayer insulating layer, and a semiconductor pattern extending through the interlayer insulating layer and in contact with the active region, the barrier layer structure is configured to prevent diffusion of impurities from the semiconductor pattern into the interlayer insulating layer. The barrier layer structure includes a barrier dielectric material and a first buffer dielectric material insulating the barrier dielectric material from the active region and the semiconductor pattern.

The barrier dielectric material may be integrally formed with the first buffer dielectric material.

The barrier layer structure may be a two or three layer structure.

The barrier layer structure may have a height equal to, or greater than, a height of the semiconductor pattern.

The interlayer insulating layer extends into the active region.

Specific particulars of other example embodiments are included in detailed descriptions and drawings.

BRIEF DESCRIPTION OF THE DRAWINGS

Example embodiments will be more clearly understood from the following detailed description taken in conjunction with the accompanying drawings.

FIG. 1 is a plan view of a semiconductor device according to example embodiments;

FIG. 53 is a block diagram of an electronic system including a semiconductor device according to example embodiments.

DETAILED DESCRIPTION OF EXAMPLE EMBODIMENTS

Figure 1:
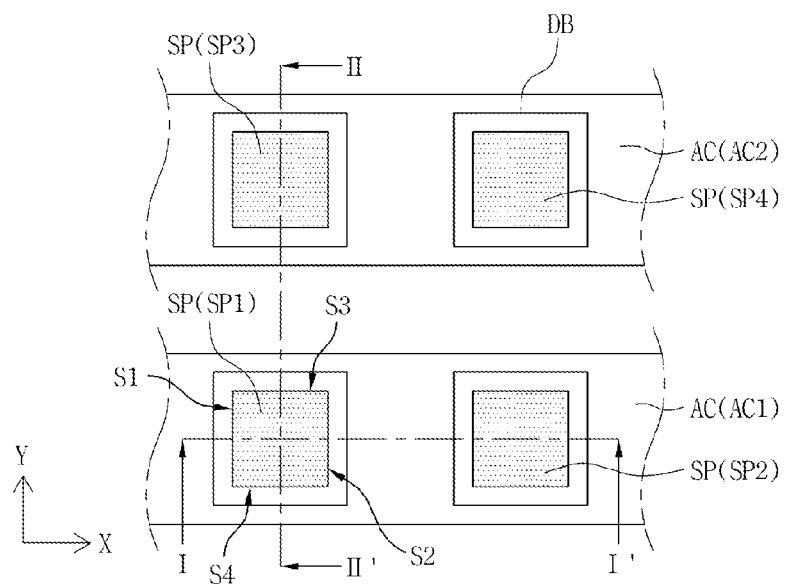
FIGS. 1-53 represent non-limiting, example embodiments as described herein. In the drawings.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to a semiconductor device, a method of fabricating the same, and a memory device, memory card, electronic apparatus and electronic system adopting the semiconductor device.

Figure 2:
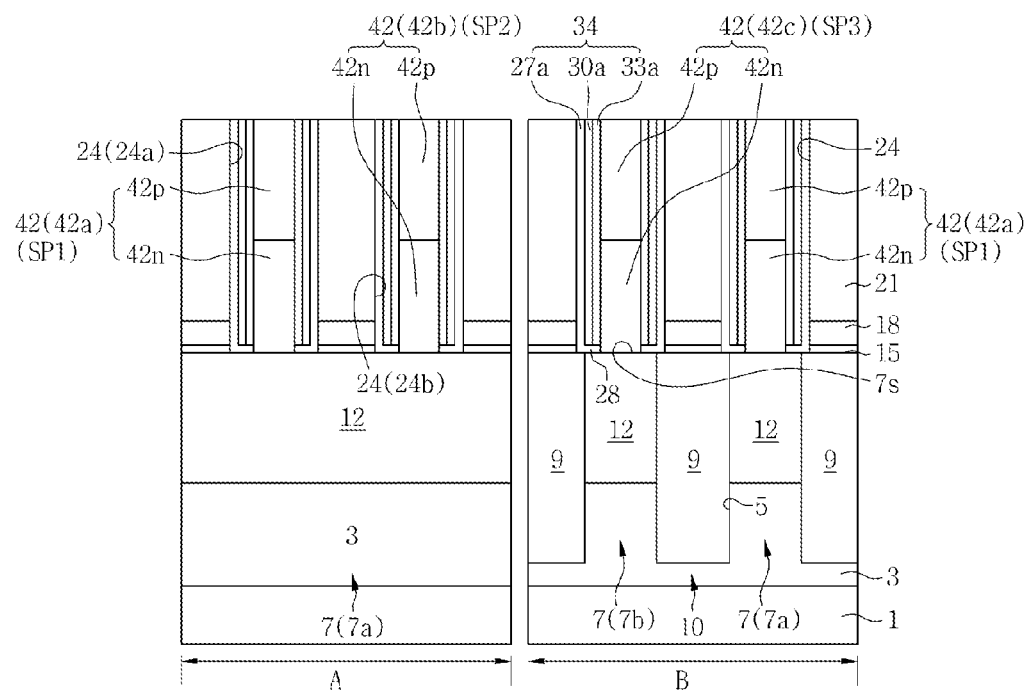
FIG. 2 is a cross-sectional view of the semiconductor device shown in FIG. 1.

FIG. 1 is a plan view of a semiconductor device according to example embodiments, and FIG. 2 is a cross-sectional view of the semiconductor device shown in FIG. 1. FIGS. 3 through 23 are cross-sectional views of modified examples of the semiconductor device shown in FIGS. 1 and 2.

In FIGS. 2 through 23, portion "A" is a region taken along line I-I' of FIG. 1, and portion "B" is a region taken along line II-II' of FIG. 1.

To begin with, the semiconductor device according to example embodiments will now be described with reference to FIGS. 1 and 2.

Referring to FIGS. 1 and 2, a semiconductor substrate 1 may be provided. The semiconductor substrate 1 may be a silicon substrate. A well region 3 may be provided in the semiconductor substrate 1. A field region 10 defining active regions 7 (AC) may be provided in the semiconductor substrate 1. Each of the active regions 7 (AC) may have a line shape. A plurality of active regions 7 may be provided. For example, a first active region 7a (AC1) and a second active region 7b (AC2) may be provided. For example, the first active region 7a (AC1) and the second active region 7b (AC2) may have line shapes disposed parallel to and apart from each other.

The field region 10 may include an isolation pattern 9 filling a trench 5 disposed in the semiconductor substrate 1. The isolation pattern 9 may be formed of an insulating material, such as silicon oxide (e.g., a high-density plasma (HDP) oxide).

A lower impurity region 12 may be provided in an upper region of the active region 7 (AC). The lower impurity region 12 may have a different conductivity type from the well region 3. For instance, the well region 3 may be a P type, while the lower impurity region 12 may be an N type.

A lower insulating layer 15 and 18 and an upper insulating layer 21 may be sequentially stacked on the substrate 1 having the active region AC and the field region 10. The lower insulating layer 15 and 18 may include a first insulating layer 15 and a second insulating layer 18 stacked sequentially. The second insulating layer 18 may be thicker than the first insulating layer 15. The upper insulating layer 21 may be thicker than the second insulating layer 18. The upper insulating layer 21 may be thicker than the lower insulating layer 15 and 21. The upper insulating layer 21 may be defined as an interlayer insulating layer.

The second and first insulating layers 18 and 15 may be formed of a material having a different dielectric constant from the upper insulating layer 21. For example, when the first insulating layer 15 is formed of silicon oxide, the second insulating layer 18 may be formed of silicon nitride having a higher dielectric constant than silicon oxide. Also, when the upper insulating layer 21 is formed of silicon oxide or a low-k dielectric material having a lower dielectric constant than silicon oxide, the second insulating layer 18 may be formed of silicon nitride having a higher dielectric constant than silicon oxide.

A semiconductor pattern 42 (SP) may be provided within a hole 24 sequentially formed through the upper insulating layer 21 and the lower insulating layer 15 and 18.

The semiconductor pattern 42 (SP) may be connected to the active region AC. The semiconductor pattern 42 (SP) may be in contact with the active region AC. The semiconductor pattern 42 (SP) may be electrically connected to the lower impurity region 12 of the active region AC.

The semiconductor pattern 42 (SP) may be formed of crystalline silicon. For example, the semiconductor pattern 42 (SP) may be formed of single crystalline silicon or polycrystalline silicon (poly-Si).

The semiconductor pattern 42 (SP) may include a first semiconductor region 42p and a second semiconductor region 42n disposed under the first semiconductor region 42p. For example, the first semiconductor region 42p may be provided in an upper region of the semiconductor pattern 42 (SP), while the second semiconductor region 42n may be provided in a lower region of the semiconductor pattern 42 (SP). The first and second semiconductor regions 42p and 42n may have different conductivity types. For instance, the first semiconductor region 42p may have a P conductivity type, while the second semiconductor region 42n may have an N conductivity type. For example, the first semiconductor region 42p may have a P conductivity type doped with boron (B), while the second semiconductor region 42n may have an N conductivity type containing phosphorus (P) or arsenic (As).

A plurality of semiconductor patterns 42 (SP) may be provided. For example, a first semiconductor pattern 42a (SP1) and a second semiconductor pattern 42b (SP2) may be provided on the line-shaped first active region 7a (AC1). The first semiconductor pattern 42a (SP1) may be provided within a first hole 24a formed through the upper insulating layer 21 and the lower insulating layer 15 and 18, while the second semiconductor pattern 42b (SP2) may be provided within a second hole 24b formed through the upper insulating layer 21 and the lower insulating layer 15 and 18. The second semiconductor pattern 42b (SP2) may be spaced apart from the first semiconductor pattern 42a (SP1). Similarly, a third semiconductor pattern 42c (SP3) and a fourth semiconductor pattern 42d (SP4) may be provided on the second active region 7b (AC2) and spaced apart from each other.

A barrier region 34 (DB) may be provided between the semiconductor pattern 42 (SP) and the upper insulating layer 21. The barrier region 34 (DB) may be interposed between the semiconductor pattern 42 (SP) and the upper insulating layer 21 and extend between the semiconductor pattern 42 (SP) and the second insulating layer 18. Furthermore, the barrier region 34 (DB) may extend between the semiconductor pattern 42 (SP) and the first insulating layer 15.

The barrier region 34 (DB) may include a first dielectric material 27a, a second dielectric material 30a, and a third dielectric material 33a.

The second dielectric material 30a may be interposed between the upper insulating layer 21 and the semiconductor pattern 42 (SP), extend between the lower insulating layer 15 and 18 and the semiconductor pattern 42 (SP), and be spaced apart from the active region AC. The first dielectric material 27a may be interposed between a sidewall of the hole 24 and the second dielectric material 30a, while the third dielectric material 33a may be interposed between side surfaces of the semiconductor pattern 42 (SP) and the second dielectric material 30a. The second and third dielectric materials 30a and 33a may be spaced apart from a surface 7s of the active region AC. The first dielectric material 27a may include a bottom portion 28 extending between bottom ends of the second and third dielectric materials 30a and 33a and the surface 7s of the active region AC.

The second dielectric material 30a may include a different material from the first and third dielectric materials 27a and 33a. For example, the second dielectric material 30a may be formed of a silicon-nitride-based material capable of preventing or cutting off diffusion of impurities (e.g., boron (B)) from the first semiconductor region 42p into the upper insulating layer 21. For example, the second dielectric material 30a may be formed of at least one material selected from the group consisting of silicon nitride (SiN), silicon carbon nitride (SiCN), silicon boron nitride (SiBN), silicon oxynitride (SiON), and silicon boron carbon nitride (SiBCN). Accordingly, the second dielectric material 30a may be defined as a barrier dielectric material.

The first and third dielectric materials 27a and 33a may be formed of a material capable of protecting the semiconductor pattern 42 (SP) and the active region AC from the second dielectric material 30a, for example, silicon oxide.

The barrier region 34 (DB) may be provided to surround side surfaces of the first semiconductor region 42p disposed in the semiconductor pattern 24. The second dielectric material (i.e., barrier dielectric material) 30a disposed in the barrier region 34 (DB) may prevent diffusion of impurities (e.g., boron (B)) from the first semiconductor region 42p into the upper insulating layer 21. Accordingly, an increase in resistance caused by a reduction in the concentration of the impurities (e.g., B) contained in the first semiconductor region 42p may be prevented.

The first dielectric material 27a disposed in the barrier region 34 (DB) may prevent the second dielectric material 30a from contacting the active region AC and be defined as a first buffer dielectric material. Also, the third dielectric material 33a disposed in the barrier region 34 (DB) may prevent the second dielectric material 30a from contacting the semiconductor pattern 42 (SP) and be defined as a second buffer dielectric material.

Figure 3:
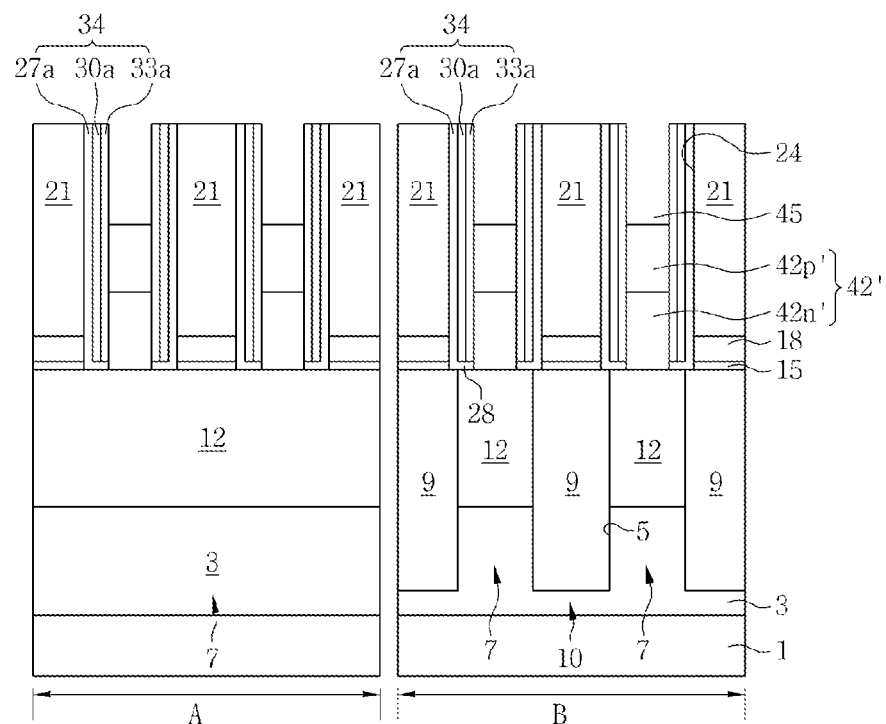
FIG. 3 is a cross-sectional view of a modified example of the semiconductor device according to the example embodiments.

Although FIG. 2 illustrates that the semiconductor pattern 42 (SP) fills the hole 24 and has a top surface disposed at the same level as a top surface of the upper insulating layer 21, example embodiments are not limited thereto. For example, as shown in FIG. 3, a modified semiconductor pattern 42' (SP) may be provided to partially fill the hole 24. The modified semiconductor pattern 42' (SP) may partially fill the hole 24 and be disposed at a lower level than the top surface of the upper insulating layer 21 such that a trench 45 is formed between adjacent barrier regions 34 (DB). Also, the modified semiconductor pattern 42' (SP) may include a first semiconductor region 42p' and a second semiconductor region 42n' disposed under the first semiconductor region 42p', which may constitute a PN diode. The first semiconductor region 42p' may be provided in an upper region of the semiconductor pattern 42' (SP), while the second semiconductor region 42n' may be provided in a lower region of the semiconductor pattern 42' (SP). Accordingly, although subsequent example embodiments describe that a top surface of a semiconductor pattern is disposed at the same level as a top surface of an upper insulating layer, example embodiments are not limited thereto, and it will be understood that the top surface of the semiconductor pattern may be disposed at a lower level than the top surface of the upper insulating layer.

The example embodiments are not limited to the barrier region 34 (DB) described with reference to FIGS. 1 and 2. For example, example embodiments may provide variously modified barrier regions as shown in FIGS. 4 through 7. Hereinafter, modified portions will chiefly be described.

Next, a modified example of the semiconductor device according to the example embodiments will be described with reference to FIG. 4.

Figure 4:
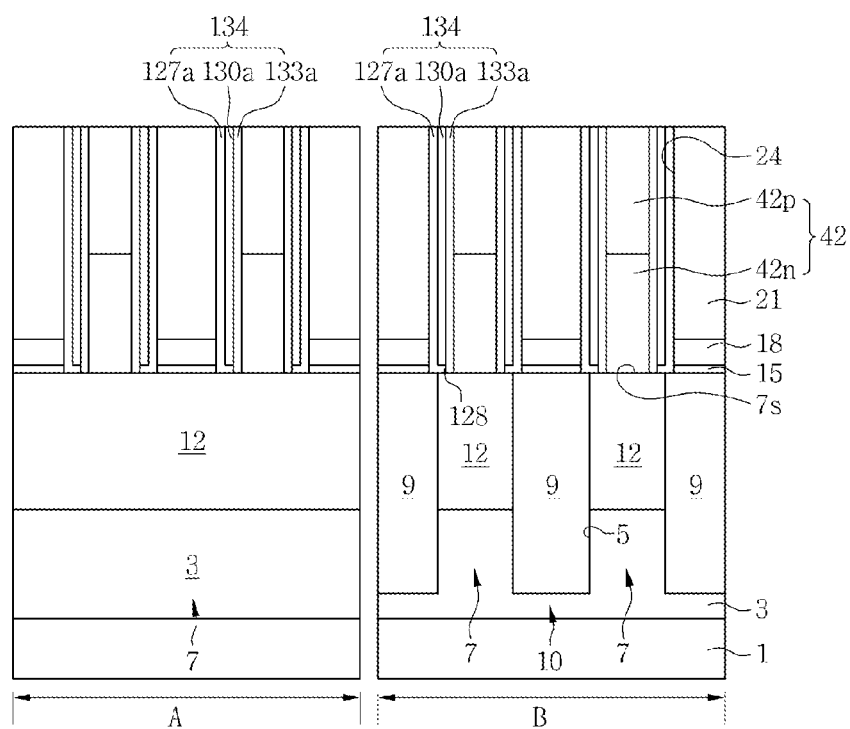
FIG. 4 is a cross-sectional view of another modified example of the semiconductor device according to the example embodiments.

Referring to FIGS. 1 and 4, a modified barrier region 134 of the barrier region 34 (DB) described with reference to FIG. 2 may be provided.

The modified barrier region 134 may be interposed between the semiconductor pattern 42 and the upper insulating layer 21, and extend between the semiconductor pattern 42 and the lower insulating layer 15 and 18. The barrier region 134 may include a first dielectric material 127a, a second dielectric material 130a, and a third dielectric material 133a. The second dielectric material 130a may be a silicon-nitride-based material capable of preventing or cutting off the diffusion of impurities (e.g., boron (B)) from the first semiconductor region 42p into the upper insulating layer 21. For example, the second dielectric material 130a may be a barrier dielectric material including at least one of SiN, SiCN, SiBN, SiON, SiOCN, or SiBCN. The first and third dielectric materials 127a and 133a may be formed of silicon oxide.

The second dielectric material 130a may be interposed between the upper insulating layer 21 and the semiconductor pattern 42, extend between the lower insulating layer 15 and 18 and the semiconductor pattern 42, and be spaced apart from the active region 7. The second dielectric material 130a may be provided between the first and third dielectric materials 127a and 133a.

The first dielectric material 127a may be interposed between a sidewall of the hole 24 and the second dielectric material 130a, while the third dielectric material 133a may be interposed between a sidewall of the semiconductor pattern 42 and the second dielectric material 130a.

The second dielectric material 130a may be spaced apart from the surface 7s of the active region 7. The first dielectric material 127a may include a bottom portion 128 extending between a bottom end of the second dielectric material 130a and the surface 7s of the active region 7.

The third dielectric material 133a may be interposed between the sidewall of the semiconductor pattern 42 and the second dielectric material 130a, and extend between the bottom portion 128 of the first dielectric material 127a and the semiconductor pattern 42. Accordingly, the first and third dielectric materials 127a and 133a may prevent or inhibit the second dielectric material 130a from directly contacting the semiconductor pattern 42 and the active region 7. The first and third dielectric materials 127a and 133a may be defined as buffer dielectric materials.

Next, another modified example of the semiconductor device according to the example embodiments will be described with reference to FIG. 5.

Figure 5:
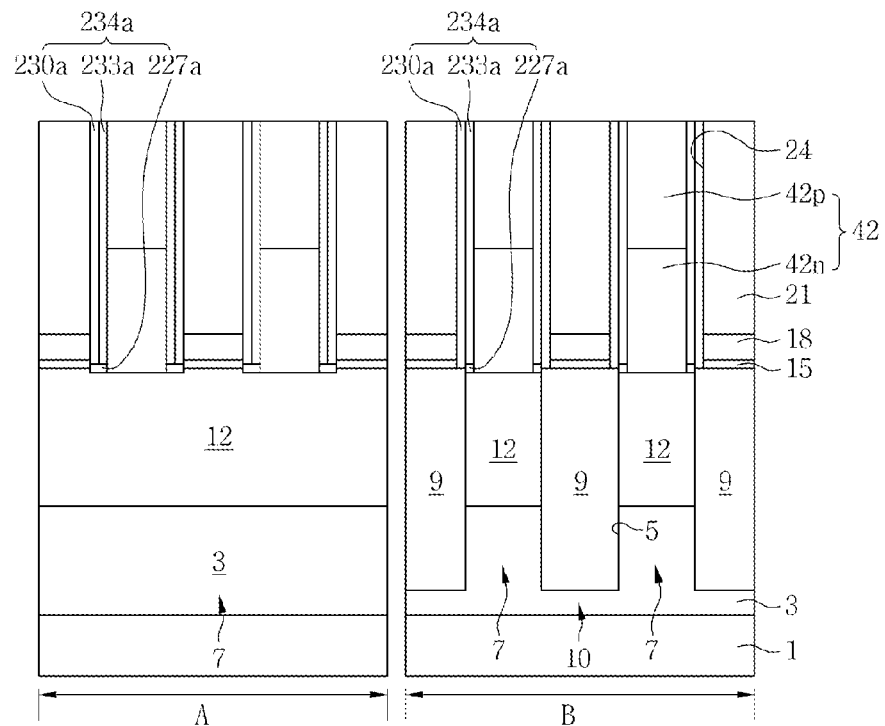
FIG. 5 is a cross-sectional view of another modified example of the semiconductor device according to the example embodiments.

Referring to FIGS. 1 and 5, a modified barrier region 234a of the barrier region 34 (DB) described with reference to FIG. 2 may be provided.

The modified barrier region 234a may be interposed between the semiconductor pattern 42 and the upper insulating layer 21 and extend between the semiconductor pattern 42 and the lower insulating layer 15 and 18. The modified barrier region 234a may include a first dielectric material 227a, a second dielectric material 230a, and a third dielectric material 233a. The second dielectric material 230a may include a different material from the first and third dielectric materials 227a and 233a. For instance, the first and third dielectric materials 227a and 233a may be formed of silicon oxide, while the second dielectric material 230a may be formed of a silicon-nitride-based material capable of preventing or cutting off the diffusion of impurities (e.g., boron (B)) from the first semiconductor region 42p into the upper insulating layer 21. For example, the second dielectric material 230a may be formed of a barrier dielectric material including at least one of SiN, SiCN, SiBN, SiON, SiOCN, or SiBCN. The first dielectric material 227a may be silicon oxide formed using a thermal oxidation process, while the third dielectric material 233a may be silicon oxide formed using a deposition process. The first and third dielectric materials 227a and 233a may be buffer dielectric materials.

The second dielectric material 230a may be interposed between the upper insulating layer 21 and the semiconductor pattern 42, extend between the lower insulating layer 15 and 18 and the semiconductor pattern 42, and be spaced apart from the active region 7. The third dielectric material 233a may be provided between the second dielectric material 230a and the semiconductor pattern 42. The first dielectric material 227a may be provided between the second and third dielectric materials 230a and 233a and the active region 7. The second dielectric material 230a may be spaced apart from the active region 7 and the semiconductor pattern 42 by the first and third dielectric materials 227a and 233a.

Next, another modified example of the semiconductor device according to the example embodiments will be described with reference to FIG. 6.

Figure 6:
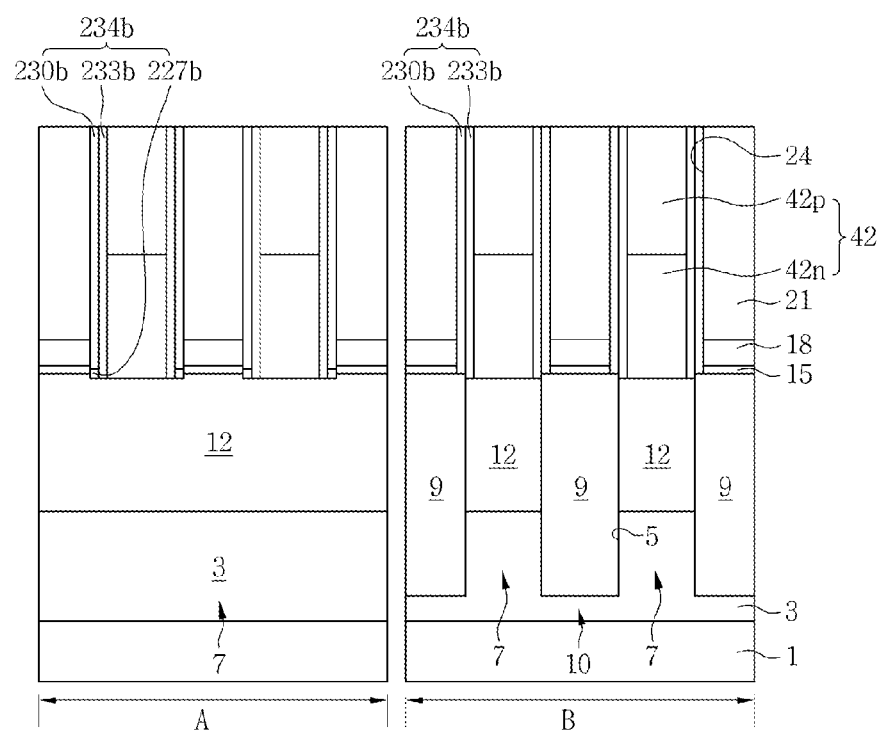
FIG. 6 is a cross-sectional view of another modified example of the semiconductor device according to the example embodiments.

Referring to FIGS. 1 and 6, a modified barrier region 234b of the barrier region 34 (DB) described with reference to FIG. 2 may be provided.

The modified barrier region 234b may be interposed between the semiconductor pattern 42 and the upper insulating layer 21 and extend between the semiconductor pattern 42 and the lower insulating layer 15 and 18. The modified barrier region 234b may include a first dielectric material 227b, a second dielectric material 230b, and a third dielectric material 233b. The second dielectric material 230b may include a different material from the first and third dielectric materials 227b and 233b. For instance, the first and third dielectric materials 227b and 233b may be buffer dielectric materials formed of silicon oxide, while the second dielectric material 230b may be formed of a silicon-nitride-based material capable of preventing or cutting off the diffusion of impurities (e.g., boron (B)) from the first semiconductor region 42p into the upper insulating layer 21. For example, the second dielectric material 230b may be a barrier dielectric material including at least one of SiN, SiCN, SiBN, SiON, SiOCN, or SiBCN.

The second dielectric material 230b may be interposed between the upper insulating layer 21 and the semiconductor pattern 42, extend between the lower insulating layer 15 and 18 and the semiconductor pattern 42, be spaced apart from the active region 7. The third dielectric material 233b may be provided between the second dielectric material 230b and the semiconductor pattern 42. The first dielectric material 227b may be provided between the second dielectric material 230b and the active region 7. The second dielectric material 230b may be spaced apart from the active region 7 and the semiconductor pattern 42 by the first and third dielectric materials 227b and 230b.

Next, another modified example of the semiconductor device according to the example embodiments will be described with reference to FIG. 7.

Figure 7:
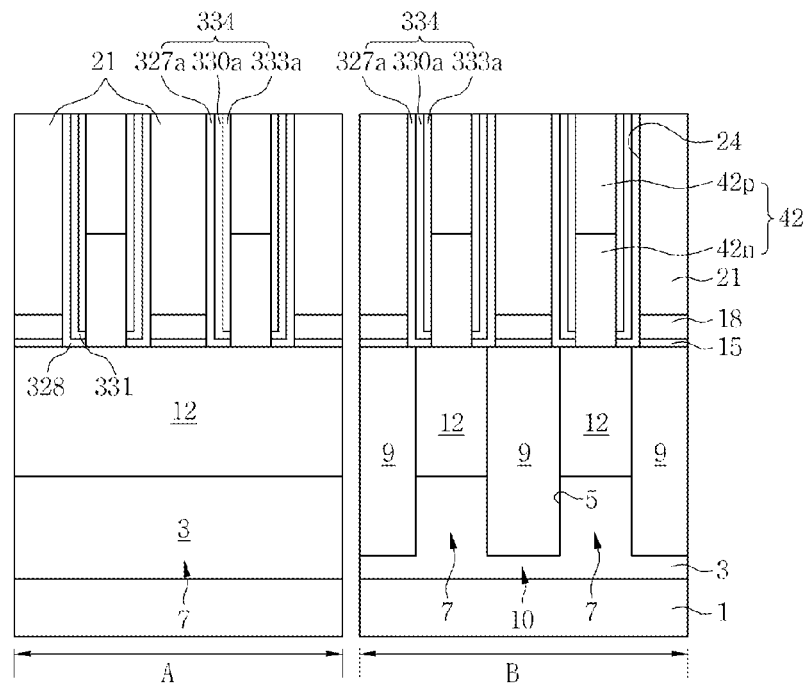
FIG. 7 is a cross-sectional view of another modified example of the semiconductor device according to the example embodiments.

Referring to FIGS. 1 and 7, a modified barrier region 334 of the barrier region 34 (DB) described with reference to FIG. 2 may be provided.

The modified barrier region 334 may be interposed between the semiconductor pattern 42 and the upper insulating layer 21 and extend between the semiconductor pattern 42 and the lower insulating layer 15 and 18.

The modified barrier region 334 may include a first dielectric material 327a, a second dielectric material 330a, and a third dielectric material 333a. The second dielectric material 330a may include a different material from the first and third dielectric materials 327a and 333a. For instance, the first and third dielectric materials 327a and 333a may be buffer dielectric materials formed of silicon oxide, while the second dielectric material 330a may be formed of a silicon-nitride-based material capable of preventing or cutting off the diffusion of impurities (e.g., boron (B)) from the first semiconductor region 42p into the upper insulating layer 21. For example, the second dielectric material 330a may be a barrier dielectric material including at least one of SiN, SiCN, SiBN, SiON, SiOCN, or SiBCN.

The second dielectric material 330a may be interposed between the upper insulating layer 21 and the semiconductor pattern 42, extend between the lower insulating layer 15 and 18 and the semiconductor pattern 42, and be spaced apart from the active region 7. The third dielectric material 333a may be provided between the second dielectric material 330a and the semiconductor pattern 42. The first dielectric material 327a may be interposed between the sidewall of the hole 24 and the second dielectric material 330a. The second dielectric material 330a may include a bottom portion 331 extending between a bottom end of the third dielectric material 333a and the active region 7. The first dielectric material 327a may include a bottom portion 328 extending between the bottom portion 331 of the second dielectric material 330a and the active region 7.

Next, another modified example of the semiconductor device according to the example embodiments will be described with reference to FIG. 8. Here, modified portions of the semiconductor device described with reference to FIG. 2 will be chiefly described.

Figure 8:
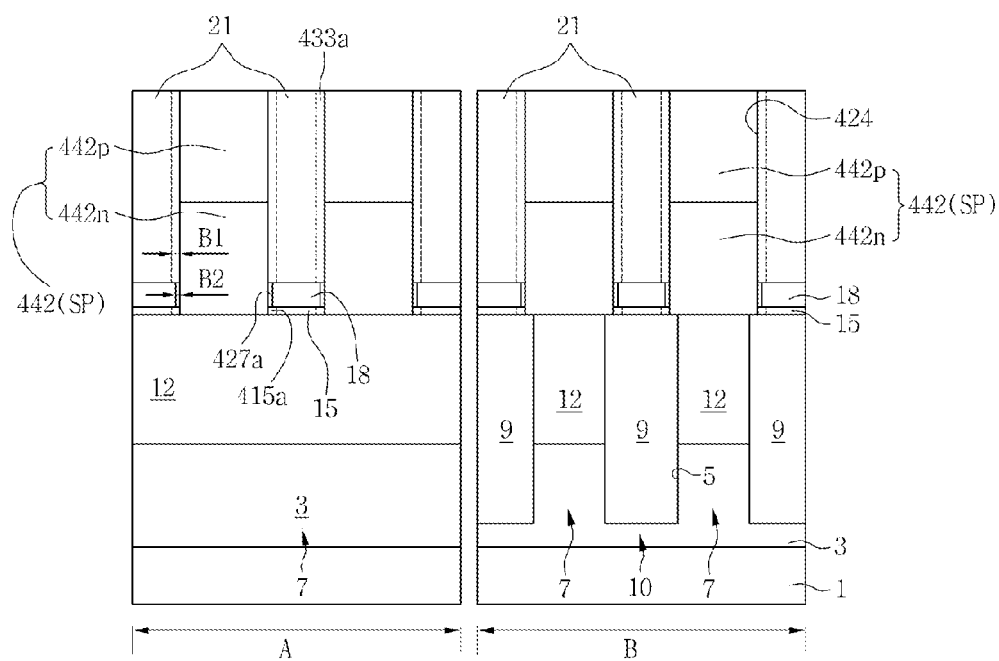
FIG. 8 is a cross-sectional view of another modified example of the semiconductor device according to the example embodiments.

Referring to FIGS. 1 and 8, a semiconductor substrate 1 having an active region 7 and a field region 10 may be provided as described with reference to FIG. 2.

A lower insulating layer 15 and 18 and an upper insulating layer 21 may be sequentially stacked on the substrate 1 having the active region 7 and the field region 10. The lower insulating layer 15 and 18 may include a first insulating layer 15 and a second insulating layer 18 stacked sequentially.

The second insulating layer 18 may be formed of a material having a different dielectric constant from the first insulating layer 15 and the upper insulating layer 21. For example, when the first insulating layer 15 is formed of silicon oxide, the second insulating layer 18 may be formed of silicon nitride having a higher dielectric constant than silicon oxide. Also, when the upper insulating layer 21 is formed of silicon oxide or a low-k dielectric material having a lower dielectric constant than silicon oxide, the second insulating layer 18 may be formed of silicon nitride having a higher dielectric constant than silicon oxide.

A semiconductor pattern 442 (SP) may be provided within a hole 424 sequentially formed through the upper insulating layer 21 and the lower insulating layer 15 and 18.

The semiconductor pattern 442 (SP) may be connected to the active region 7 (AC). The semiconductor pattern 442 (SP) may be in direct contact with the active region 7 (AC). The semiconductor pattern 442 (SP) may be electrically connected to the lower impurity region 12 of the active region 7 (AC). The semiconductor pattern 442 (SP) may be formed of crystalline silicon. For example, the semiconductor pattern 442 (SP) may be formed of single crystalline silicon or poly-Si.

The semiconductor pattern 442 (SP) may include a first semiconductor region 442p and a second semiconductor region 442n disposed under the first semiconductor region 442p. For example, the first semiconductor region 442p may be provided in an upper region of the semiconductor pattern 442 (SP), while the second semiconductor region 442n may be provided in a lower region of the semiconductor pattern 442 (SP). The first and second semiconductor regions 442p and 442n may have different conductivity types and constitute a PN diode. For example, the first semiconductor region 442p may have a P conductivity type doped with boron (B), while the second semiconductor region 442n may have an N conductivity type containing phosphorous (P) or arsenic (As).

A barrier region 433a (DB) may be provided to surround side surfaces of the semiconductor pattern 442 (SP). The barrier region 433a (DB) may be a portion of the upper insulating layer 21, which may be close to the semiconductor pattern 442 (SP). The barrier region 443a (DB) may be provided in the upper insulating layer 21 close to the semiconductor pattern 442 (SP). The barrier region 433a (DB) may surround side surfaces of the first semiconductor region 442p of the semiconductor pattern 442 (SP) and be provided to surround side surfaces of the second semiconductor region 442n disposed at a higher level than the second insulating layer 18.

The barrier region 433a (DB) may include a different material from the upper insulating layer 21. The barrier region 433a (DB) may include a material capable of preventing or cutting off the diffusion of impurities (e.g., boron (B)) from the first semiconductor region 442p into the upper insulating layer 21. For instance, the upper insulating layer 21 may be formed of silicon oxide, and the barrier region 433a (DB) may be formed of a doped silicon oxide formed by doping at least one of nitrogen (N), carbon (C), chlorine (Cl), fluorine (F), argon (Ar) or xenon (Xe) into silicon oxide.

The barrier region 433a (DB) may include a material having a different dielectric constant from the upper insulating layer 21. For instance, when the upper insulating layer 21 is formed of silicon oxide or a low-k dielectric material, the barrier region 433a (DB) may be formed of N-doped silicon oxide having a higher dielectric constant than the upper insulating layer 21.

Meanwhile, the second insulating layer 18 may be formed of a material having a higher dielectric constant than the barrier region 433a (DB). For example, the barrier region 433a (DB) may be formed of N-doped silicon oxide, and the second insulating layer 18 may be formed of silicon nitride having a higher dielectric constant than N-doped silicon oxide. Meanwhile, a vertical thickness of the second insulating layer 18 may be greater than a horizontal width of the barrier region 433a (DB).

An oxide region 427a may be provided between the second insulating layer 18 of the lower insulating layer 15 and 18 and the semiconductor pattern 442 (SP). The oxide region 427a may be a doped oxide region. The oxide region 427a may be a doped oxide region formed by doping any one of N, C, Cl, F, Ar, or Xe into oxide grown from side surfaces of the second insulating layer 18.

The oxide region 427a may prevent the second insulating layer 18 formed of silicon nitride from directly contacting the semiconductor pattern 442 (SP). Accordingly, the degradation of the semiconductor device due to the second insulating layer 18 may be prevented.

A width B1 of the barrier region 433a (DB) may be different from a width B2 of the oxide region 427a. For example, the width B1 of the barrier region 433a (DB) may be greater than the width B2 of the oxide region 427a.

A doped insulating region 415a may be provided in the first insulating layer 15 disposed under the oxide region 427a. The doped insulating region 415a may be a doped silicon oxide formed by doping any one of N, C, Cl, F, Ar, or Xe into silicon oxide.

Figure 9:
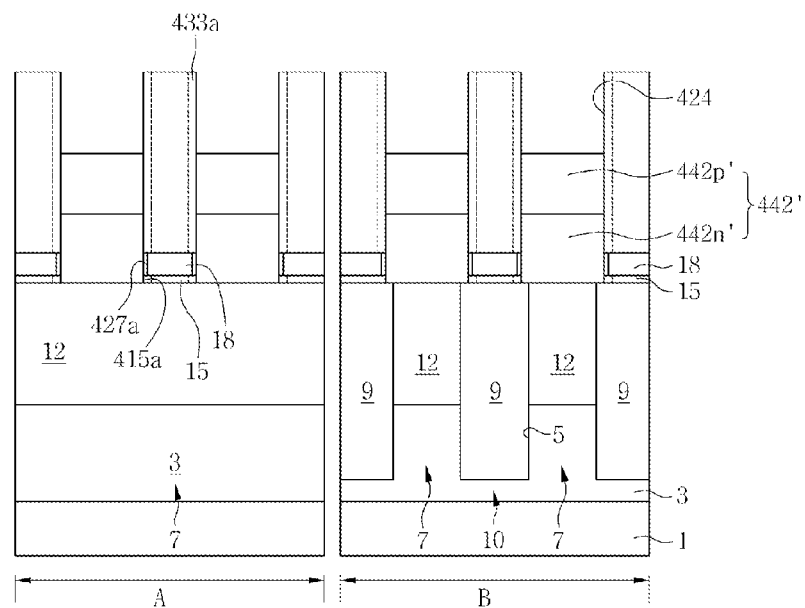
FIG. 9 is a cross-sectional view of another modified example of the semiconductor device according to the example embodiments.

The semiconductor pattern 442 (SP) may have a top surface disposed at substantially the same level as the upper insulating layer 21, but example embodiments are not limited thereto. For instance, as shown in FIG. 9, a modified semiconductor pattern 442' may be provided at a lower level than a top surface of the upper insulating layer 21 and partially fill the hole 424. The modified semiconductor pattern 442' may include a first semiconductor region 442p' and a second semiconductor region 442n disposed under the first semiconductor region 442p'.

Next, another modified example of the semiconductor device according to the example embodiments will be described with reference to FIG. 10.

Figure 10:
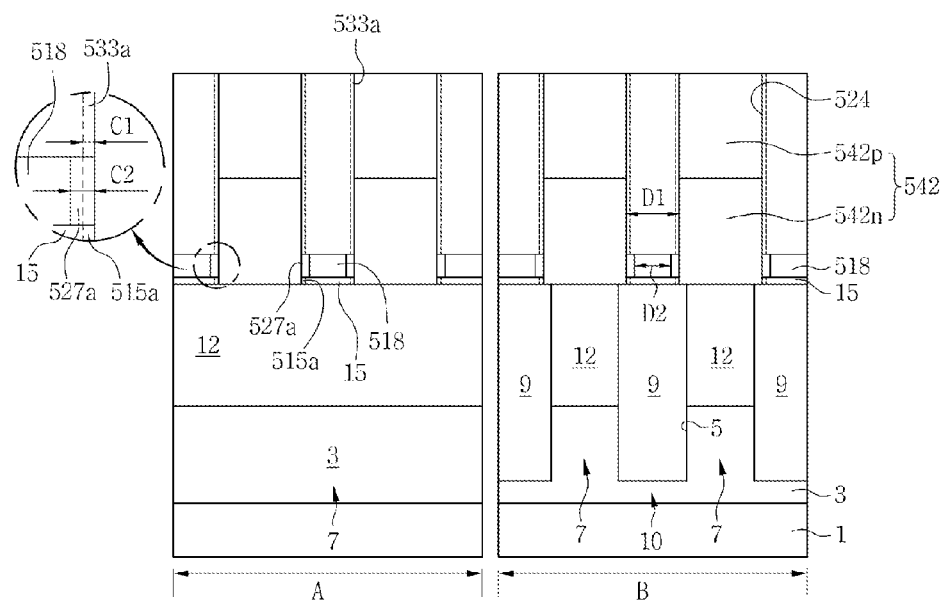
FIG. 10 is a cross-sectional view of another modified example of the semiconductor device according to the example embodiments.

Referring to FIGS. 1 and 10, a semiconductor substrate 1 having an active region 7 and a field region 10 may be provided as described with reference to FIG. 2. A lower insulating layer 15 and 518 and an upper insulating layer 21 may be sequentially stacked on the substrate 1 having the active region 7 and the field region 10. The lower insulating layer 15 and 518 may include a first insulating layer 15 and a second insulating layer 518 stacked sequentially.

As described with reference to FIG. 8, a semiconductor pattern 542 may be provided within a hole 524 sequentially formed through the upper insulating layer 21 and the lower insulating layer 15 and 518. As described with reference to FIG. 8, a barrier region 533a may be provided to surround side surfaces of the semiconductor pattern 542. The barrier region 533a may be provided in the upper insulating layer 21 close to the semiconductor pattern 542.

A width D2 of the second insulating layer 518 may be different from a width D1 of the upper insulating layer 21 between two close (or adjacent) semiconductor patterns 542. For example, the width D1 of the upper insulating layer 21 may be greater than the width D2 of the second insulating layer 518 between two adjacent or close semiconductor patterns 542a and 542b.

An oxide region 527a may be provided between the second insulating layer 518 of the lower insulating layer 15 and 518 and the semiconductor pattern 542. The oxide region 527a may be a doped oxide region formed by doping any one of N, C, Cl, F, Ar, or Xe into oxide grown from side surfaces of the second insulating layer 518. A top surface of the oxide region 527a may be in contact with a bottom surface of the upper insulating layer 21. A horizontal width C1 of the barrier region 533a may be less than a horizontal width C2 of the oxide region 527a.

A doped insulating region 515a may be provided in the first insulating layer 15 disposed under the oxide region 527a. The doped insulating region 515a may be a doped silicon oxide formed by doping any one of N, C, Cl, F, Ar or Xe into silicon oxide.

Next, another modified example of the semiconductor device according to the example embodiments will be described with reference to FIG. 11.

Figure 11:
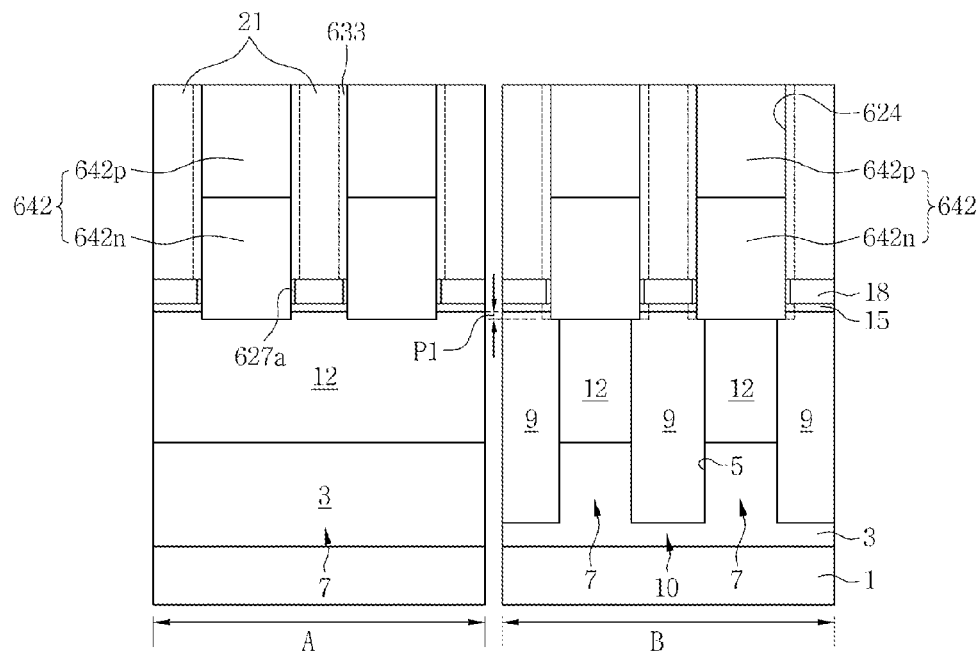
FIG. 11 is a cross-sectional view of another modified example of the semiconductor device according to the example embodiments.

Referring to FIGS. 1 and 11, a semiconductor substrate 1 having the active region 7 and the field region 10 may be provided as described with reference to FIG. 2.

A lower insulating layer 15 and 18 and an upper insulating layer 21 may be sequentially stacked on the substrate 1 having the active region 7 and the field region 10. The lower insulating layer 15 and 18 may include a first insulating layer 15 and a second insulating layer 18 stacked sequentially. As described with reference to FIG. 8, a semiconductor pattern 642 may be provided within a hole 624 sequentially formed through the upper insulating layer 21 and the lower insulating layer 15 and 18.

Similarly to that shown in FIG. 8, a barrier region 633 may be provided to surround side surfaces of the semiconductor pattern 642. The barrier region 633 may be provided in the upper insulating layer 21 close to the semiconductor pattern 642.

A surface of the active region 7 interposed between two close semiconductor patterns 642 may be at a higher level than a bottom surface of the semiconductor pattern 642. For instance, the bottom surface of the semiconductor pattern 642 may be lower than the surface of the active region 7 interposed between the two close semiconductor patterns 642 by a first size P1.

An oxide region 627a may be provided between the second insulating layer 18 of the lower insulating layer 15 and 18 and the semiconductor pattern 642. The oxide region 627a may be a doped oxide region formed by doping any one of N, C, Cl, F, Ar, or Xe into oxide grown from side surfaces of the second insulating layer 18.

Next, another modified example of the semiconductor device according to the example embodiments will be described with reference to FIG. 12.

Figure 12:
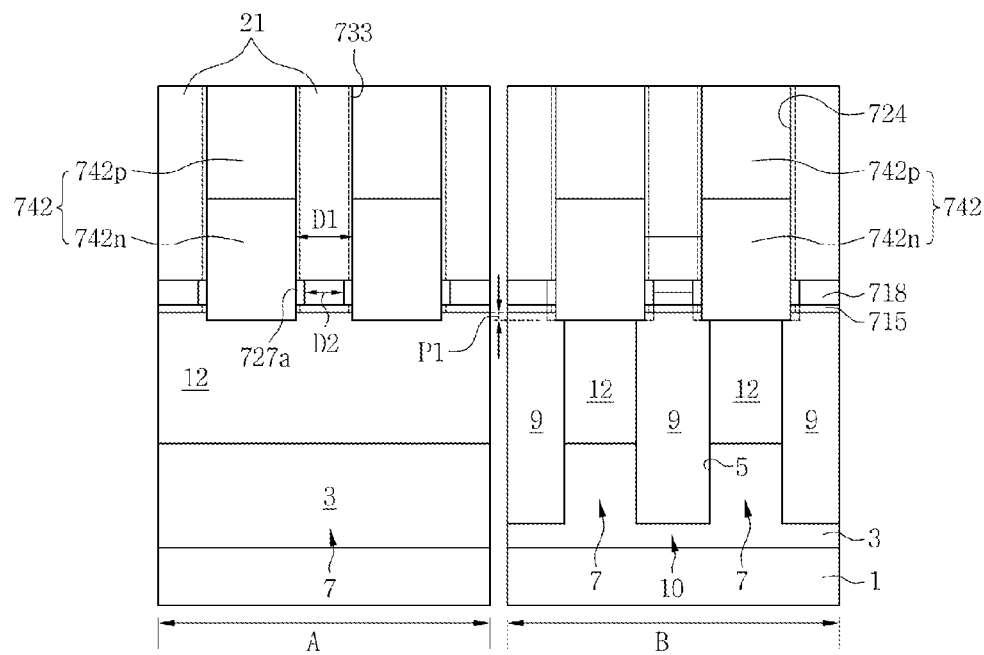
FIG. 12 is a cross-sectional view of another modified example of the semiconductor device according to the example embodiments.

Referring to FIGS. 1 and 12, a semiconductor substrate 1 having the active region 7 and the field region 10 may be provided as described with reference to FIG. 2. A lower insulating layer 715 and 718 and an upper insulating layer 21 may be sequentially stacked on the semiconductor substrate 1 having the active region 7 and the field region 10. The lower insulating layer 715 and 718 may include a first insulating layer 715 and a second insulating layer 718 stacked sequentially. As described with reference to FIG. 8, a semiconductor pattern 742 may be provided within a hole 724 sequentially formed through the upper insulating layer 21 and the lower insulating layer 715 and 718. Similarly to that shown in FIG. 8, a barrier region 733 may be provided to surround side surfaces of the semiconductor pattern 742. The barrier region 733 may be provided in the upper insulating layer 21 close to the semiconductor pattern 742.

Similarly to that shown in FIG. 11, a surface of the active region 7 interposed between two adjacent or close semiconductor patterns 742 may be disposed at a higher level than a bottom surface of the semiconductor pattern 742 by a first size P1.

A width D2 of the second insulating layer 718 may be different from a width D1 of the upper insulating layer 21 between the two close semiconductor patterns 742. For example, the width D1 of the upper insulating layer 21 may be greater than the width D2 of the second insulating layer 718 between the two close semiconductor patterns 742.

An oxide region 727a may be provided between the second insulating layer 718 of the lower insulating layer 715 and 718 and the semiconductor pattern 742. The oxide region 727a may be a doped oxide region formed by doping any one of N, C, Cl, F, Ar, or Xe into oxide grown from side surfaces of the second insulating layer 718. A top surface of the oxide region 727a may be in contact with a bottom surface of the upper insulating layer 21.

Next, another modified example of the semiconductor device according to the example embodiments will be described with reference to FIG. 13.

Figure 13:
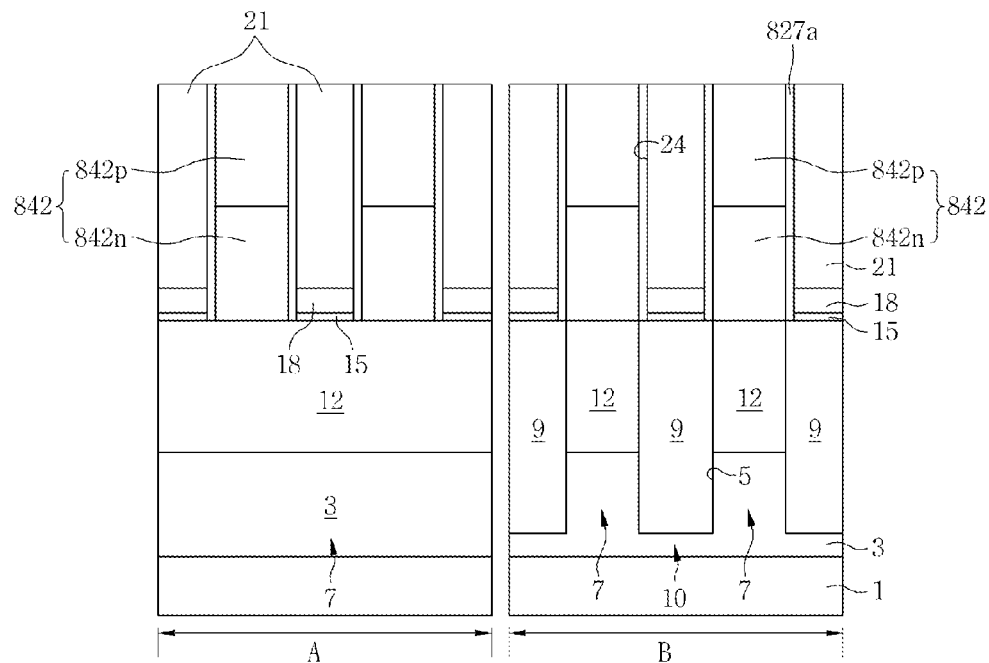
FIG. 13 is a cross-sectional view of another modified example of the semiconductor device according to the example embodiments.

Referring to FIGS. 1 and 13, a semiconductor substrate 1 having the active region 7 and the field region 10 may be provided as described with reference to FIG. 2. A lower insulating layer 15 and 18 and an upper insulating layer 21 may be sequentially stacked on the substrate 1 having the active region 7 and the field region 10. The lower insulating layer 15 and 18 may include a first insulating layer 15 and a second insulating layer 18 stacked sequentially. As described with reference to FIG. 8, a semiconductor pattern 842 may be provided within a hole 24 sequentially formed through the upper insulating layer 21 and the lower insulating layer 15 and 18. The semiconductor pattern 842 may include a first semiconductor region 842p and a second semiconductor region 842n disposed under the first semiconductor region 842p.

A barrier region 827a may be provided between the semiconductor pattern 842 and the upper insulating layer 21. The barrier region 827a may include a doped silicon oxide. For example, the barrier region 827a may be formed by doping any one of N, C, Cl, F, Ar or Xe into silicon oxide.

The barrier region 827a may be interposed between the semiconductor pattern 842 and the upper insulating layer 21 and extend between the semiconductor pattern 842 and the lower insulating layer 15 and 18.

Next, another modified example of the semiconductor device according to the example embodiments will be described with reference to FIG. 14.

Figure 14:
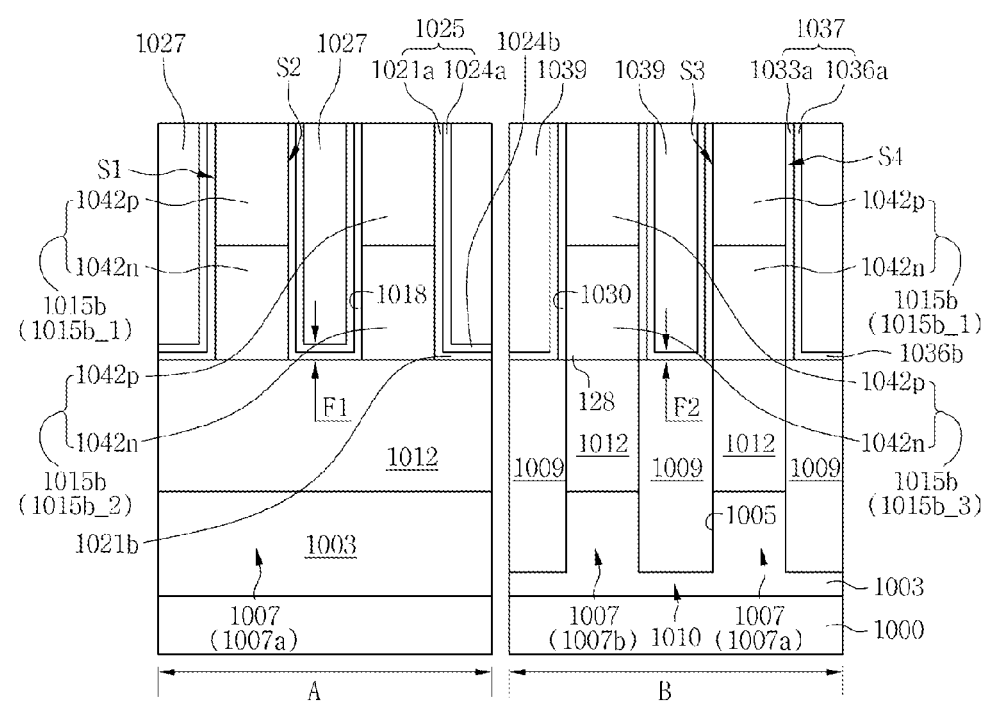
FIG. 14 is a cross-sectional view of another modified example of the semiconductor device according to the example embodiments.

Referring to FIGS. 1 and 14, a semiconductor substrate 1000 may be provided. The semiconductor substrate 1000 may be a silicon substrate. A well region 1003 may be provided in the semiconductor substrate 1000. Similarly to that shown in FIG. 2, a field region 1010 defining an active region 1007 (AC) may be provided in the semiconductor substrate 1000. The active region 1007 (AC) may have a line shape. A plurality of active regions 1007 (AC) may be provided. For example, a first active region 1007a (AC1) and a second active region 1007b (AC2) may be provided. For example, the first active region 1007a (AC1) and the second active region 1007b (AC2) may have line shapes disposed parallel to and apart from each other. The field region 1010 may include an isolation pattern 1009 filling a trench 1005 formed in the semiconductor substrate 1000. A lower impurity region 1012 may be provided in an upper region of the active region 1007.

A semiconductor pattern 1015b (SP) may protrude from the active region 1007. The semiconductor pattern 1015b (SP) may be connected to the active region 1007. The semiconductor pattern 1015b (SP) may be electrically connected to the lower impurity region 1012 of the active region 1007. The semiconductor pattern 1015b (SP) may include crystalline silicon. For instance, the semiconductor pattern 1015b (SP) may be formed of single crystalline silicon or poly-Si.

The semiconductor pattern 1015b (SP) may have first and second side surfaces S1 and S2 disposed opposite each other, and third and fourth side surfaces S3 and S4 disposed opposite each other. The first and second side surfaces S1 and S2 may be vertical to a first direction X, while the third and fourth side surfaces S3 and S4 may be vertical to a second direction Y. The first direction X may be a direction crossing or vertical to the second direction Y.

The semiconductor pattern 1015b (SP) may include a first semiconductor region 1042p and a second semiconductor region 1042n disposed under the first semiconductor region 1042n. For instance, the first semiconductor region 1042p may be provided in an upper region of the semiconductor pattern 1015b (SP), while the second semiconductor region 1042n may be provided in a lower region of the semiconductor pattern 1015b (SP). The first and second semiconductor regions 1042p and 1042n may have different conductivity types. For instance, the first semiconductor region 1042p may have a P conductivity type, while the second semiconductor region 1042n may have an N conductivity type. For example, the first semiconductor region 1042p may have a P conductivity type doped with boron (B), and the second semiconductor region 1042n may have an N conductivity type containing phosphorous (P) or arsenic (As).

A plurality of the semiconductor patterns 1015b (SP) may be provided. For instance, a first semiconductor pattern 1015b_1 and a second semiconductor pattern 1015b_2 may protrude from a top surface of the first active region 1007a and be spaced apart from each other. A third semiconductor pattern 1015b_3 and a fourth semiconductor pattern 1015b_4 may protrude from a top surface of the second active region 1007b and spaced apart from each other.

A first insulating pattern 1027 may be provided on the active region 1007 between the semiconductor patterns 1015b (SP) spaced apart from each other. A second insulating pattern 1039 may be provided on the field region 1010 between the semiconductor patterns 1015b (SP) spaced apart from each other. For example, the first insulating pattern 1027 may be provided on the first active region 1007a between the first and second semiconductor patterns 1015b_1 and 1015b_2, while the second insulating pattern 1039 may be provided on the field region 1010 between the first and third semiconductor patterns 1015b_1 and 1015b_3.

The first and second insulating patterns 1027 and 1039 may be formed of silicon oxides formed using different processes, but example embodiments are not limited thereto. For example, the first and second insulating patterns 1027 and 1039 may be formed of the same silicon oxide obtained using the same process.

Holes 1018 and 1030 may be defined by the first and second insulating patterns 1027 and 1039. Accordingly, the semiconductor pattern 1015b (SP) may be provided within the holes 1018 and 1030.

A first barrier region 1025 may be provided between the first insulating pattern 1027 and the semiconductor 1015b (SP). A second barrier region 1037 may be provided between the second insulating pattern 1039 and the semiconductor 1015b (SP).

The first barrier region 1025 may be provided on the first and second side surfaces S1 and S2 of the semiconductor pattern 1015b (SP), while the second barrier region 1037 may be provided on the third and fourth side surfaces S3 and S4 of the semiconductor pattern 1015b (SP). Accordingly, the side surfaces S1, S2, S3, and S4 of the semiconductor pattern 1015b (SP) may be surrounded with the first and second barrier regions 1025 and 1037. The first and second barrier regions 1025 and 1037 may be formed of an insulating material and correspond to reference character "DB" of FIG. 1.

The first barrier region 1025 may include a first dielectric material 1021a and a second dielectric material 1024a. The second barrier region 1037 may include a third dielectric material 1033a and a fourth dielectric material 1036a.

The first dielectric material 1021a may be interposed between the first and second side surfaces S1 and S2 of the semiconductor pattern 1015b (SP) and the first insulating pattern 1027, and include a lower portion 1021b extending between the first insulating pattern 1027 and the active region 1007. The second dielectric material 1024a may be interposed between the first dielectric material 1021a and the first insulating pattern 1027. The second dielectric material 1024a may include a bottom portion 1024b disposed under the first insulating pattern 1027.

The third dielectric material 1033a may be interposed between the third and fourth side surfaces S3 and S4 of the semiconductor pattern 1015b (SP) and the second insulating pattern 1039. The fourth dielectric material 1036a may be interposed between the third dielectric material 1033a and the second insulating pattern 1039, and include a bottom portion 1036b interposed between the second insulating pattern 1039 and the isolation pattern 1009.

A thickness F1 of the dielectric materials 1021b and 1024b provided between the first insulating pattern 1027 and the active region 1007 may be greater than a thickness F2 of the dielectric material 1036b provided between the second insulating pattern 1039 and the isolation pattern 1009.

The first and third dielectric materials 1021a and 1033a may be formed of silicon oxide, for example, silicon oxide obtained using a thermal oxidation process, and defined as buffer dielectric materials. The second and fourth dielectric materials 1024a and 1036a may be formed of a silicon-nitride-based material capable of preventing the diffusion of impurities, such as boron (B), from the first semiconductor region 1042p into the first and second insulating patterns 1027 and 1039, for example, at least one of SiN, SiCN, SiBN, SiON, SiOCN, or SiBCN. The second and fourth dielectric materials 1024a and 1036a may be defined as barrier dielectric materials.

Figure 15:
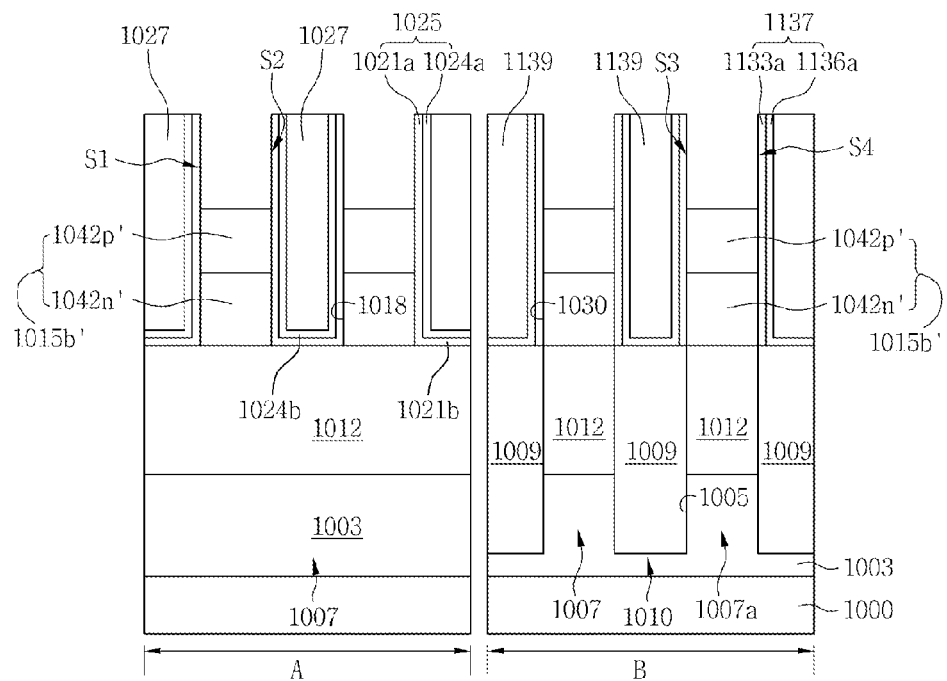
FIG. 15 is a cross-sectional view of another modified example of the semiconductor device according to the example embodiments.

In FIG. 14, the semiconductor pattern 1015b (SP) may be provided within the holes 1018 and 1030 and have a top surface disposed at the same level as the top surfaces of the first and second insulating patterns 1025 and 1039, but example embodiments are not limited thereto. For example, as shown in FIG. 15, a modified semiconductor pattern 1015b' may be provided to partially fill the holes 1018 and 1030. The modified semiconductor pattern 1015b' may be disposed at a lower level than the top surfaces of the first and second insulating patterns 1025 and 1139 to partially fill the holes 1018 and 1030. Also, the modified semiconductor pattern 1015b' may include a first semiconductor region 1042p' and a second semiconductor region 1042n' disposed under the first semiconductor region 1042p', which may constitute a PN diode.

Next, another modified example of the semiconductor device according to the example embodiments will be described with reference to FIG. 16.

Figure 16:
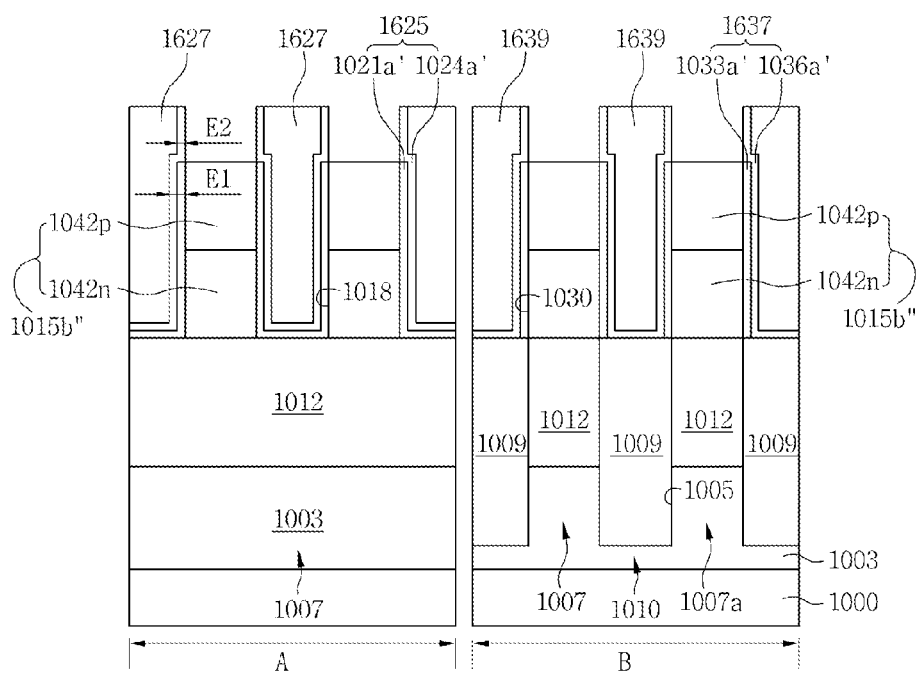
FIG. 16 is a cross-sectional view of another modified example of the semiconductor device according to the example embodiments.

Referring to FIGS. 1 and 16, similarly to that shown in FIG. 14, a semiconductor substrate 1000 having the active region 1007 and the field region 1010 may be provided. The field region 1010 may include an isolation pattern 1009 filling a trench 1005 disposed in the semiconductor substrate 1000. A lower impurity region 1012 may be provided in an upper region of the active region 1007.

A first insulating pattern 1627 and a second insulating pattern 1639 may be provided on the semiconductor substrate 1000 having the active region 1007 and the field region 1010. The first and second insulating patterns 1627 and 1639 may be formed of a silicon-oxide-based insulating material. Holes 1018' and 1030' may be defined by the first and second insulating patterns 1627 and 1639. The first and second insulating patterns 1627 and 1639 may be formed of silicon oxides formed using different processes, but example embodiments are not limited thereto. For example, the first and second insulating patterns 1627 and 1639 may be formed of the same silicon oxide obtained using the same process.

A semiconductor pattern 1015" (SP) may be provided within the holes 1018' and 1030'. The semiconductor pattern 1015" (SP) may protrude from the active region 1007 and partially fill the holes 1018' and 1030'. The semiconductor pattern 1015b" (SP) may include a first semiconductor region 1042p and a second semiconductor region 1042n disposed under the first semiconductor region 1042n. The semiconductor pattern 1015b" (SP) may be disposed at a lower level than the top surfaces of the first and second insulating patterns 1627 and 1639.

Upper regions of the first and second insulating patterns 1627 and 1639 may be different from lower regions thereof. For instance, regions of the first and second insulating patterns 1627 and 1639 close to the semiconductor pattern 1015b" may have a first width, while regions of the first and second insulating patterns 1627 and 1639 disposed at a higher level than the semiconductor pattern 1015b" may have a second width greater than the first width.

The first insulating pattern 1627 may be provided on the active region 1007 between the semiconductor patterns 1015" (SP) spaced apart from each other. The second insulating pattern 1639 may be provided on the field region 1010 between the semiconductor patterns 1015b" (SP) spaced apart from each other.

A first barrier region 1625 may be provided between the first insulating pattern 1627 and the semiconductor 1015b" (SP). A second barrier region 1637 may be provided between the second insulating pattern 1639 and the semiconductor 1015b" (SP).

Side surfaces of the semiconductor pattern 1015b" (SP) may be surrounded with the first and second barrier regions 1625 and 1637. The first and second barrier regions 1625 and 1637 may be formed of an insulating material and correspond to reference character "DB" of FIG. 1.

The first barrier region 1625 may be interposed between the semiconductor pattern 1015b" and the first insulating pattern 1627 and have a first width E1. Furthermore, the first barrier region 1625 may have a portion extending onto side surfaces of the first insulating pattern 1627 disposed at a higher level than the semiconductor pattern 1015b". The extending portion of the first barrier region 1625 may have a second width E2 less than the first width E1. Also, the first barrier region 1625 may extend between the first insulating pattern 1627 and the active region 1007.

The first barrier region 1625 may include a first dielectric material 1021a' and a second dielectric material 1024a', which are interposed between the semiconductor pattern 1015b" and the first insulating pattern 1627, and between the first insulating pattern 1627 and the active region 1007. The second dielectric material 1024a' may be disposed on side surfaces of the first insulating pattern 1627 disposed at a higher level than the semiconductor pattern 1015b".

The second barrier region 1637 may be interposed between the semiconductor pattern 1015b" and the second insulating pattern 1639 and have a first width E1. Furthermore, the second barrier region 1637 may have a first portion extending on side surfaces of the second insulating pattern 1639 disposed at a higher level than the semiconductor pattern 1015b". Also, the second barrier region 1637 may have a second portion extending between the second insulating pattern 1639 and the field region 1010. Here, the first and second portions of the second barrier region 1637 may have a second width E2 less than the first width E1.

The second barrier region 1637 may include a third dielectric material 1033a' and 1036a' interposed between the semiconductor pattern 1015b" and the second insulating pattern 1639. Also, the fourth dielectric material 1036a' may be further disposed in the first and second portions of the second barrier region 1637.

The first dielectric material 1021a' may be closer to the semiconductor pattern 1015b" and the active region 1007 than the second dielectric material 1024a', and the third dielectric material 1033a' may be closer to the semiconductor pattern 1015b" than the fourth dielectric material 1036'.

The first and third dielectric materials 1021a' and 1033a' may be formed of silicon oxide, for example, silicon oxide obtained using a thermal oxidation process, and defined as buffer dielectric materials. The second and fourth dielectric materials 1024a' and 1036a' may be formed of a silicon-nitride-based material capable of preventing the diffusion of impurities, such as boron (B), from the first semiconductor region 1042p into the first and second insulating patterns 1627 and 1639, for instance, at least one of SiN, SiCN, SiBN, SiON, SiOCN, or SiBCN. The second and fourth dielectric materials 1024a' and 1036a' may be defined as barrier dielectric materials.

Next, another modified example of the semiconductor device according to the example embodiments will be described with reference to FIG. 17.

Figure 17:
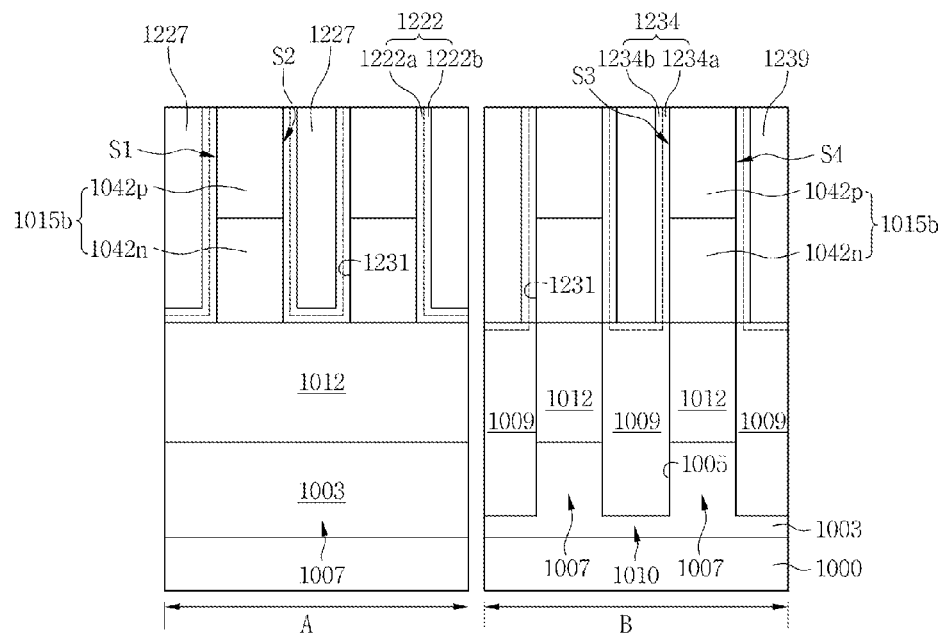
FIG. 17 is a cross-sectional view of another modified example of the semiconductor device according to the example embodiments.

Referring to FIGS. 1 and 17, modified first and second barrier regions 1222 and 1234 of the first and second barrier regions 1025 and 1037 of FIG. 14 may be provided. For instance, the first and second barrier regions 1222 and 1234 may include doped silicon oxides. The first barrier region 1222 may include a first buffer dielectric region 1222a and a first barrier dielectric region 1222b. The second barrier region 1234 may include a second buffer dielectric region 1234a and a second barrier dielectric region 1234b. The first buffer dielectric region 1222a may be near to the semiconductor pattern 1015b than the first barrier dielectric region 1222b. Also, the second buffer dielectric region 1234a may be near to the semiconductor pattern 1015b than the second barrier dielectric region 1234b. The first and second buffer dielectric regions 1222a, 1234a may include silicon oxide, and the first and second barrier dielectric regions 1222b and 1234b may include a doped silicon oxide obtained by doping any one of N, C, Cl, F, Ar or Xe.

Next, another modified example of the semiconductor device according to the example embodiments will be described with reference to FIG. 18.

Figure 18:
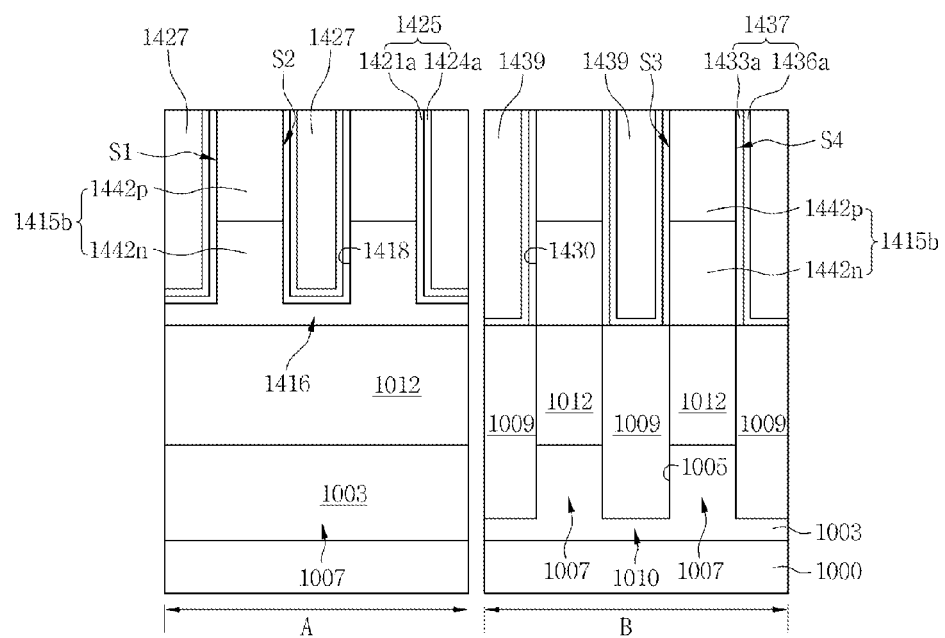
FIG. 18 is a cross-sectional view of another modified example of the semiconductor device according to the example embodiments.

Referring to FIGS. 1 and 18, a semiconductor substrate 1000 having the active region 1007 and the field region 1010 may be provided as described with reference to FIG. 14. The field region 1010 may include an isolation pattern 1009 filling a trench 1005 disposed in the semiconductor substrate 1000. A lower impurity region 1012 may be provided in an upper region of the active region 1007.

A semiconductor pattern 1415b (SP) may protrude from the active region 1007. The semiconductor pattern 1415b may have first and second side surfaces S1 and S2 disposed opposite each other, and third and fourth side surfaces S3 and S4 disposed opposite each other.

A plurality of the semiconductor patterns 1415b may be provided. A subsidiary semiconductor pattern 1416 may be provided on the active region 1007 between the plurality of semiconductor patterns 1415b. The subsidiary semiconductor pattern 1416 may connect lower regions of the plurality of semiconductor patterns 1415b on each of active regions 1007a. The subsidiary semiconductor pattern 1416 may continuously connect the lower regions of the plurality of semiconductor patterns 1415b on each of the active regions 1007a.

The subsidiary semiconductor patterns 1416 may prevent the occurrence of failures, such as the collapse of the semiconductor patterns 1415b or a lift between the semiconductor patterns 1415b and the active region 1007.

First and second insulating patterns 1427 and 1439 corresponding to the first and second insulating patterns 1027 and 1039 described with reference to FIG. 14 may be provided. The first insulating pattern 1427 may be provided on the opposite first and second side surfaces S1 and S2 of the semiconductor pattern 1415b. The first insulating pattern 1427 may be provided on the subsidiary semiconductor pattern 1416 disposed on the active region 1007. The second insulating pattern 1439 may be provided on the opposite third and fourth side surfaces S3 and S4 of the semiconductor pattern 1415b. The second insulating pattern 1439 may be provided on the field region 1010. A hole 1431 may be defined by the first and second insulating patterns 1427 and 1439. Accordingly, the semiconductor pattern 1415b (SP) may be provided within the hole 1431.

A first barrier region 1425 may be provided between the first insulating pattern 1427 and the semiconductor pattern 1415b (SP). Furthermore, the first barrier dielectric region 1425 may extend between the first insulating pattern 1427 and the subsidiary semiconductor pattern 1416. A second barrier region 1437 may be provided between the second insulating pattern 1439 and the semiconductor pattern 1015b (SP). Furthermore, the second barrier region 1437 may extend between the second insulating pattern 1439 and the isolation pattern 1009. The first and second barrier regions 1425 and 1437 may be formed of an insulating material and correspond to reference character "DB" of FIG. 1.

The first barrier region 1425 may include a first buffer dielectric material 1421a and a first barrier dielectric material 1424a, and the second barrier region 1437 may include a second buffer dielectric material 1433a and a second barrier dielectric material 1436a. The first buffer dielectric material 1421a may be provided between the first barrier dielectric material 1424a and the semiconductor pattern 1415b and between the first barrier dielectric material 1424a and the subsidiary semiconductor pattern 1416. The second buffer dielectric material 1433a may be provided between the second barrier dielectric material 1436a and the semiconductor pattern 1415b, while the second barrier dielectric material 1436a may extend between the second insulating pattern 1439 and the isolation pattern 1009.

The first and second buffer dielectric materials 1421a and 1433a may be formed of silicon oxide. The first and second barrier dielectric materials 1424a and 1436a may be formed of a silicon-nitride-based material, for example, at least one material of SiN, SiCN, SiBN, SiON, SiOCN, or SiBCN.

Next, another modified example of the semiconductor device according to the example embodiments will be described with reference to FIG. 19.

Figure 19:
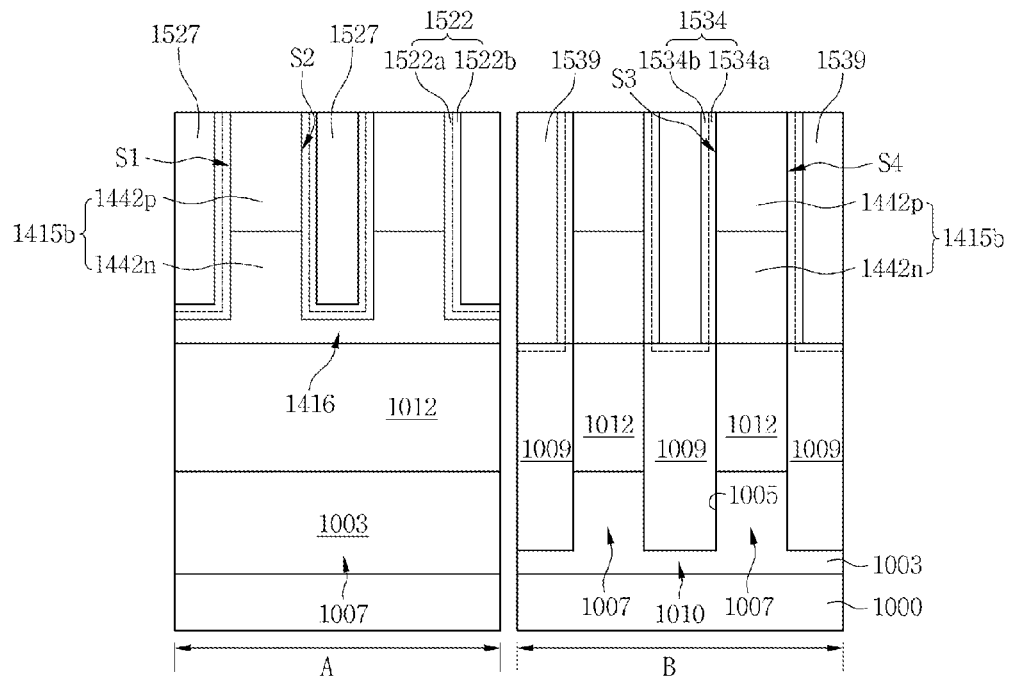
FIG. 19 is a cross-sectional view of another modified example of the semiconductor device according to the example embodiments.

Referring to FIGS. 1 and 19, modified first and second barrier regions 1522 and 1534 of the first and second barrier regions 1425 and 1437 of FIG. 18 may be provided. For instance, the first and second barrier regions 1522 and 1534 may be formed of doped silicon oxides. The first barrier region 1522 may include a first buffer dielectric region 1522a and a first barrier dielectric region 1522b. The second barrier region 1534 may include a second buffer dielectric region 1534a and a second barrier dielectric region 1534b. The first buffer dielectric region 1522a may be closer to the semiconductor pattern 1415b than the first barrier dielectric region 1522b. Also, the second buffer dielectric region 1434a may be closer to the semiconductor pattern 1415b than the second barrier dielectric region 1434b. The first and second buffer dielectric regions 1522a, 1534a may include silicon oxide, while the first and second barrier dielectric regions 1522b and 1534b may include a doped silicon oxide obtained by doping any one of N, C, Cl, F, Ar or Xe.

Meanwhile, in FIG. 18, the semiconductor pattern 1415b (SP) may be provided within the hole 1430 and have a top surface disposed at the same level as top surfaces of the first and second insulating patterns 1427 and 1439, but example embodiments are not limited thereto. For example, a modified semiconductor pattern may be provided at a lower level than top surfaces of the first and second insulating patterns 1527 and 1539. The modified semiconductor pattern 1415b may include a first semiconductor region 1442p and a second semiconductor region 1442n disposed under the first semiconductor region 1442. The first and second semiconductor regions 1442p and 1442n may constitute a PN diode.

Next, another modified example of the semiconductor device according to the example embodiments will be described with reference to FIG. 20.

Figure 20:
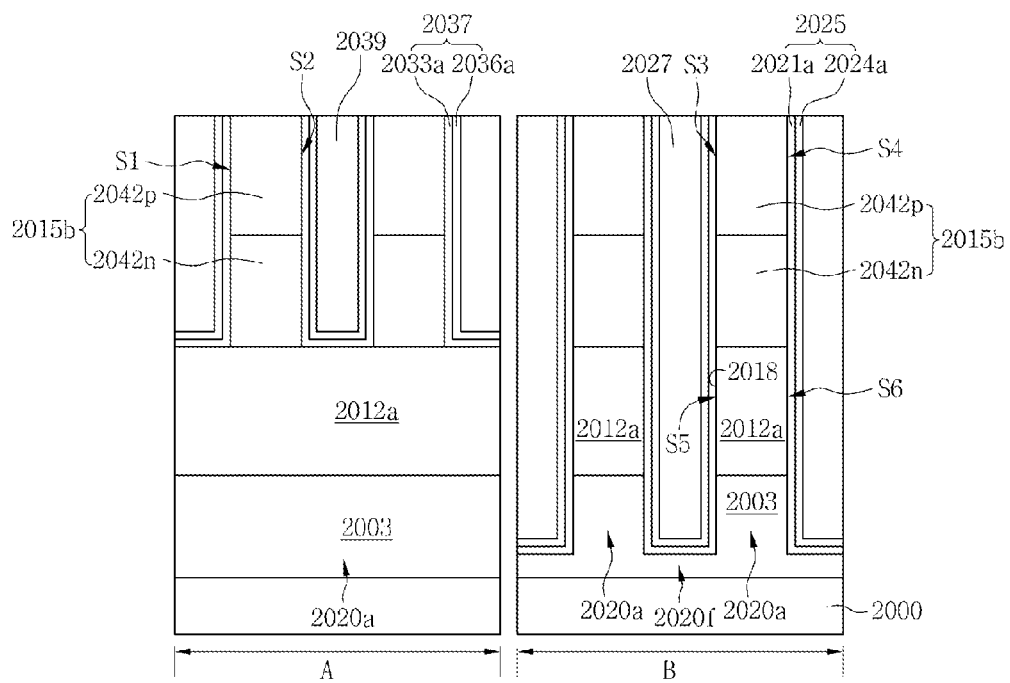
FIG. 20 is a cross-sectional view of another modified example of the semiconductor device according to the example embodiments.

Referring to FIGS. 1 and 20, a semiconductor substrate 2000 may be provided. A well region 2003 may be provided in the semiconductor substrate 2000. A trench 2018 defining an active region 2020a (AC) may be provided in the semiconductor substrate 2000. The active region 2020a (AC) may have a line shape and have a first side surface S5 and a second side surface S6 disposed opposite each other. A lower impurity region 2012a may be provided in an upper region of the active region 2020a (AC).

A semiconductor pattern 2015b may protrude upward from the active region 2020a. The semiconductor pattern 2015b may include a first semiconductor region 2042p and a second semiconductor region 2042n disposed under the first semiconductor region 2042p. For example, the first semiconductor region 2042p may be provided in an upper region of the semiconductor pattern 2015b, while the second semiconductor region 2042n may be provided in a lower region of the semiconductor pattern 2015b (SP). The first semiconductor region 2042p may have a P conductivity type, while the second semiconductor region 2042n may have an N conductivity type.

The semiconductor pattern 2015b may have first and second side surfaces S1 and S2 disposed opposite each other, and third and fourth side surfaces S3 and S4 disposed opposite each other. The third and fourth side surfaces S3 and S4 of the semiconductor pattern 2015b may be vertically aligned with first and second side surfaces S5 and S6 of the active region 2020a, which may be opposite each other. A plurality of active regions 2020a (AC) may be provided. For example, a first active region 2007a (AC1) and a second active region 2007b (AC2), which may have line shapes parallel to each other, may be provided.

The semiconductor pattern 2015b (SP) may be connected to the active region 2020a. The semiconductor pattern 2015b (SP) may be electrically connected to the lower impurity region 2012a of the active region 2020a. The semiconductor pattern 2015b (SP) may include crystalline silicon. For instance, the semiconductor pattern 2015b (SP) may be formed of single crystalline silicon or poly-Si.

A first insulating pattern 2027 may be provided on the field region 2020f. The first insulating pattern 2027 may be interposed between the semiconductor patterns 2015b and extend into the trench 2018. A second insulating pattern 2039 may be provided on the active region 2020a between the semiconductor patterns 2015b. Portions of the first insulating pattern 2027 disposed in the trenches 2018 on both sides of the active region 2020a may be defined as isolation patterns, while a portion of the first insulating pattern 2027 disposed at a higher level than the active region 2020a may penetrate the second insulating pattern 2039. The first and second insulating patterns 2027 and 2039 may be formed of silicon oxide.

A first barrier region 2025 may be interposed between the third and fourth side surfaces S3 and S4 of the semiconductor patterns 2015b and the first insulating pattern 2027. The first barrier region 2025 may extend between the first and second side surfaces S5 and S6 of the active region 2020a and the first insulating pattern 2027. Furthermore, the first barrier region 2025 may extend between the first insulating pattern 2027 and a bottom region of the trench 2018. The first barrier region 2025 may cover the third and fourth side surfaces S3 and S4 of the semiconductor patterns 2015b, the first and second side surfaces S5 and S6 of the active region 2020a, and the bottom region of the trench 2018. A second barrier region 2037 may be interposed between the first and second side surfaces S1 and S2 of the semiconductor patterns 2015b and the second insulating pattern 2039. The second barrier region 2037 may extend between the active region 2020a and the second insulating pattern 2039. The first and second barrier regions 2025 and 2037 may be formed of an insulating material and correspond to reference character "DB" of FIG. 1.

The first barrier region 2025 may include a first buffer dielectric material 2021a and a first barrier dielectric material 2024a. The second barrier region 2037 may include a second buffer dielectric material 1033a and a second barrier dielectric material 2036a.

The first and second buffer dielectric materials 2021a and 2033a may be formed of silicon oxide, for example, silicon oxide obtained using a thermal oxidation process, and defined as buffer dielectric materials. The first and second barrier dielectric materials 2024a and 2036a may be formed of a silicon-nitride-based material capable of preventing the diffusion of impurities, such as boron (B), from the first semiconductor region 2042p. For example, the first and second barrier dielectric materials 2024a and 2036a may be formed of at least one of SiN, SiCN, SiBN, SiON, SiOCN, or SiBCN, and defined as barrier dielectric materials.

Next, another modified example of the semiconductor device according to the example embodiments will be described with reference to FIG. 21.

Figure 21:
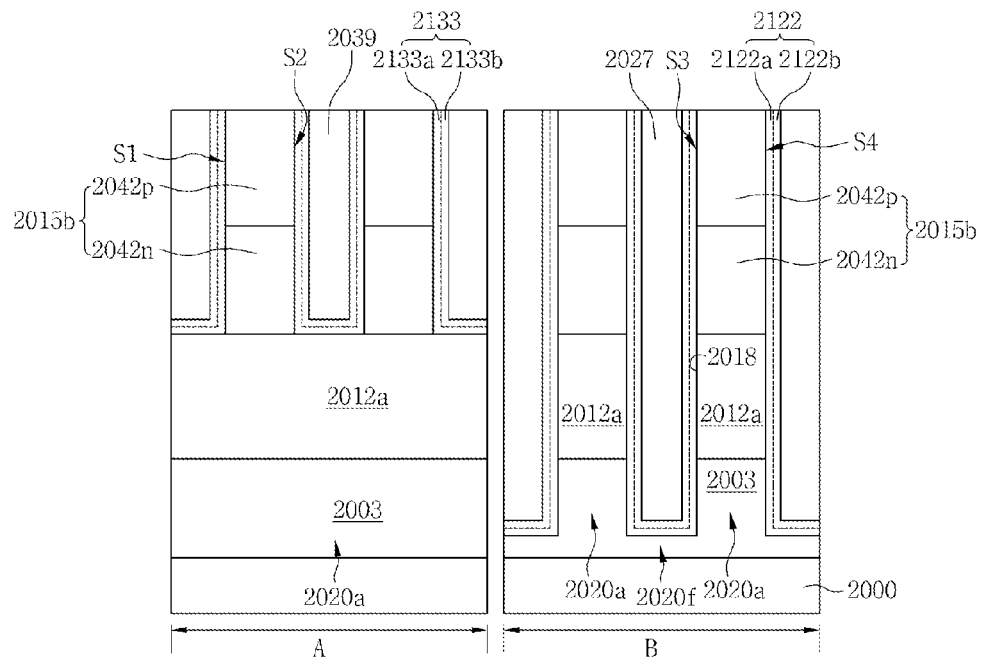
FIG. 21 is a cross-sectional view of another modified example of the semiconductor device according to the example embodiments.

Referring to FIGS. 1 and 21, modified first and second barrier regions 2122 and 2133 of the first and second barrier regions 2025 and 2037 described with reference to FIG. 20 may be provided. For example, the first and second barrier regions 2122 and 2133 may be formed of doped silicon oxides. The first barrier region 2122 may include a first buffer dielectric region 2122a and a first barrier dielectric region 2122b. Also, the second barrier region 2133 may include a second buffer dielectric region 2133a and a second barrier dielectric region 2133b.

The first buffer dielectric region 2122a may be closer to the semiconductor pattern 2015b and the active region 2012a than the first barrier dielectric region 2122b. The second buffer dielectric region 2133a may be closer to the semiconductor pattern 2015b and the active region 2012a than the second barrier dielectric region 2133b. The first and second buffer dielectric regions 2122a and 2133a may include silicon oxide, while the first and second barrier dielectric regions 2122b and 2133b may include a doped silicon oxide formed by doing any one of N, C, Cl, F, Ar or Xe.

Figure 22:
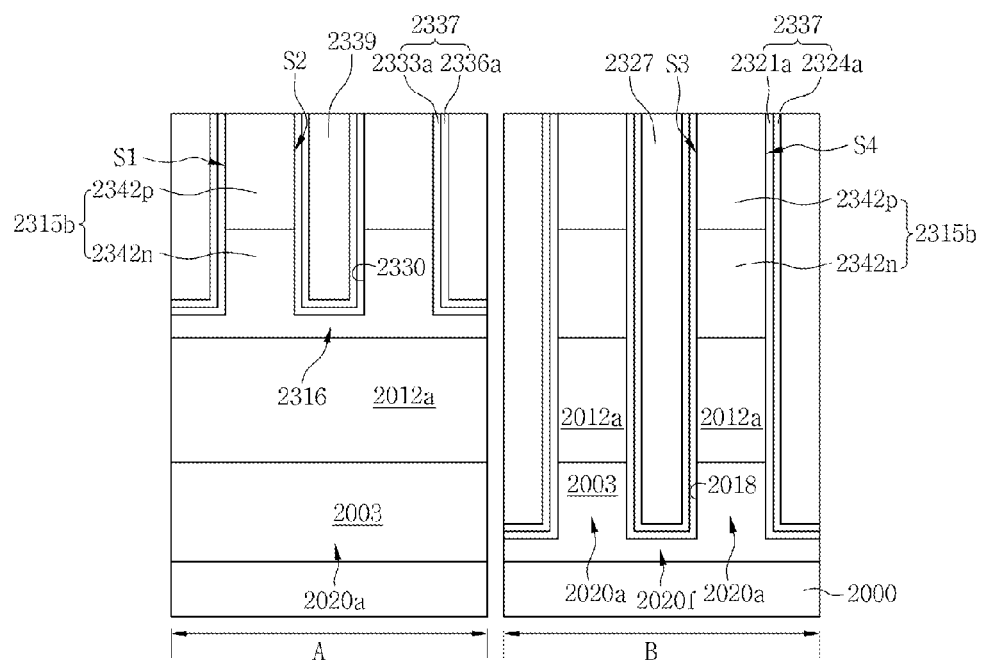
FIG. 22 is a cross-sectional view of another modified example of the semiconductor device according to the example embodiments.

Meanwhile, in FIGS. 20 and 21, semiconductor patterns 2015b disposed close to each other may be modified and connected by a subsidiary semiconductor pattern. For instance, as shown in FIG. 22, a subsidiary semiconductor pattern 2316 may be provided on the active region 2020a between adjacent semiconductor patterns 2315b. As described with reference to FIG. 18, the subsidiary semiconductor pattern 2316 may connect lower regions of the semiconductor patterns 2315b disposed close to each other.

Next, another modified example of the semiconductor device according to the example embodiments will be described with reference to FIG. 23.

Figure 23:
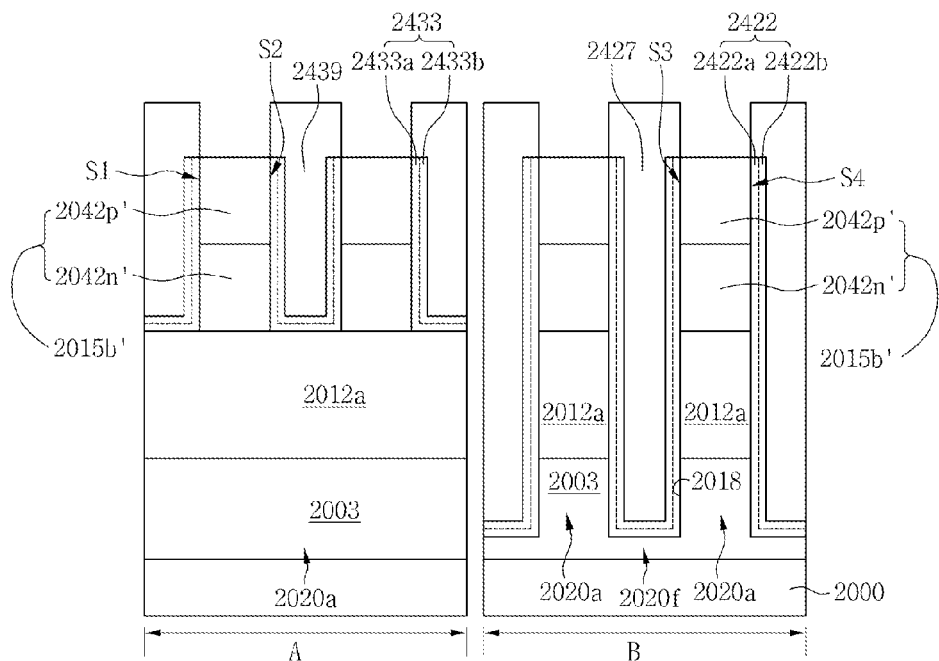
FIG. 23 is a cross-sectional view of another modified example of the semiconductor device according to the example embodiments.

Referring to FIGS. 1 and 23, a semiconductor substrate 2000 may be provided. A well region 2003 may be provided in the semiconductor substrate 2000. As described with reference to FIG. 20, a trench 2018 defining an active region 2020a may be provided in the semiconductor substrate 2000. The trench 2018 may be provided in a field region 2020f. A lower impurity region 2012a may be provided in an upper region of the active region 2020a.

A semiconductor pattern 2015b' may protrude upward from the active region 2020a. As described with reference to FIG. 20, the semiconductor pattern 2015b' may include a first semiconductor region 2042p' and a second semiconductor region 2042n' disposed under the first semiconductor region 2042p'.

A first insulating pattern 2427 may be provided on the field region 2020f and interposed between the semiconductor patterns 2015b' and extend into the trench 2018. A second insulating pattern 2439 may be provided on the active region 2020a between the semiconductor patterns 2015b'.

The first and second insulating patterns 2427 and 2439 may have top surfaces disposed at a higher level than the semiconductor pattern 2015b'. The semiconductor pattern 2015b' may partially fill holes defined by the first and second insulating patterns 2427 and 2439.

A first barrier region 2422 may be interposed between the semiconductor pattern 2015b' and the first insulating pattern 2427. The first barrier region 2422 may be interposed between the semiconductor pattern 2015b' and the first insulating pattern 2427, between the active region 2020a and the first insulating pattern 2427, and between a bottom surface of the trench 2018 and the first insulating pattern 2427. A second barrier region 2433 may be interposed between the semiconductor pattern 2015b' and the second insulating pattern 2439, and interposed between the active region 2020a and the second insulating pattern 2439. The first and second barrier regions 2422 and 2433 may be formed of an insulating material and correspond to the barrier region 34 of FIG. 2. The first and second barrier regions 2422 and 2433 may be formed of doped silicon oxides. The first barrier region 2422 may include a first buffer dielectric region 2422a and a first barrier dielectric region 2422b. The second barrier region 2433 may include a second buffer dielectric region 2433a and a second barrier dielectric region 2433b. The first buffer dielectric region 2422a may be closer to the semiconductor pattern 2015b' than the first barrier dielectric region 2422b. The second buffer dielectric region 2433a may be closer to the semiconductor pattern 2015b' than the second barrier dielectric region 2433b. The first and second buffer dielectric regions 2422a and 2433a may be formed of silicon oxide, and the first and second barrier dielectric regions 2422b and 2433b may be formed of a doped silicon oxide obtained by doping any one of N, C, Cl, F, Ar or Xe.

Next, a memory device including a semiconductor device according to example embodiments will be described with reference to FIG. 24.

Figure 24:
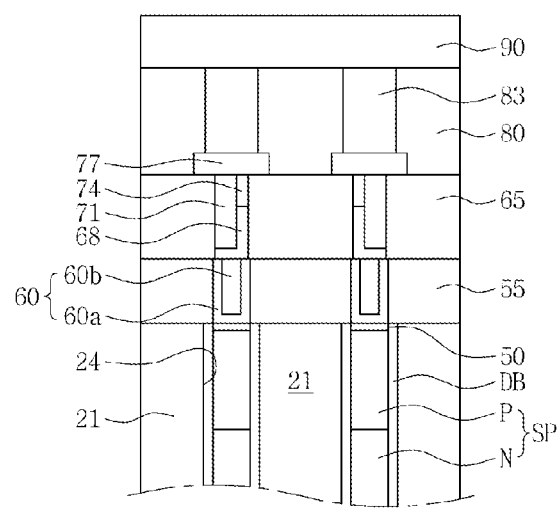
FIG. 24 is a cross-sectional view of a memory device including a semiconductor device according to example embodiments.

Referring to FIG. 24, a semiconductor device in which a top surface of a semiconductor pattern SP may be at substantially the same level as a top surface of an upper insulating layer, may be prepared. For instance, a semiconductor pattern SP may be provided within a hole 24 disposed in the upper insulating layer 21, as shown in FIG. 2. The semiconductor pattern SP may include a PN diode.

As described with reference to the previous example embodiments and modified examples thereof, a barrier region DB may be provided to surround side surfaces of the semiconductor pattern SP. A first interlayer insulating layer 55 may be provided on the semiconductor pattern SP and the upper insulating layer 21. A metal plug structure 60 may be provided in the first interlayer insulating layer 55. The metal plug structure 60 may include a metal plug 60b and a metal barrier layer 60a covering side and bottom surfaces of the metal plug 60b. The metal plug 60b may include a metal, such as tungsten (W), while the metal barrier layer 60a may include a metal nitride (e.g., titanium nitride (TiN) or tantalum nitride (TaN)).

A metal-semiconductor compound 50 may be provided between the semiconductor pattern SP and the metal plug structure 60. The metal-semiconductor compound 50 may include a metal silicide, such as cobalt silicide or titanium silicide.

A second interlayer insulating layer 65 may be provided on the first interlayer insulating layer 55. A lower conductive pattern 68 and a data storage pattern 74 may be formed in the second interlayer insulating layer 65. The data storage pattern 74 may include a material for storing information in a phase-change memory device. For example, the data storage pattern 74 may include germanium antimony telluride (GeSbTe), germanium tellurium arsenide (GeTeAs), tin tellurium antimony (SnTeSn), GeTe, SbTe, selenium tellurium tin (SeTeSn), GeTeSe, antimony selenium bismuth (SbSeBi), GeBiTe, GeTeTi, indium selenide (InSe), gallium tellurium selenide (GaTeSe), or InSbTe. Furthermore, the data storage pattern 74 may include a material layer obtained by adding one selected from the group consisting of carbon (C), nitrogen (N), silicon (Si), oxygen (O), and nitrogen (N) to one selected from the group consisting of a GeSbTe layer, a GeTeAs layer, a SnTeSn layer, a GeTe layer, a SbTe layer, a SeTeSn layer, a GeTeSe layer, a SbSeBi layer, a GeBiTe layer, a GeTeTi layer, an InSe layer, a GaTeSe layer, and an InSbTe layer. Example embodiments are not limited to the phase-change memory device and may be applied to various other memory devices. For example, a semiconductor device including a semiconductor pattern SP and a barrier region DB according to example embodiments may be applied not only to the phase-change memory device but also to memory devices, such as resistive memory devices. Accordingly, the data storage pattern 74 may be formed of a metal oxide capable of storing data in a resistive memory device.

An insulating pattern 71 may be provided on one side of both the lower conductive pattern 68 and the data storage pattern 74. An upper conductive pattern 77 may be provided on the data storage pattern 74. A third interlayer insulating layer 80 may be provided on the upper conductive pattern 77. A conductive plug 83 may be provided through the third interlayer insulating layer 80. A bit line 90 may be provided on the conductive plug 83.

Next, a memory device having a semiconductor device according to a modified example of the example embodiments will be described with reference to FIG. 25.

Figure 25:
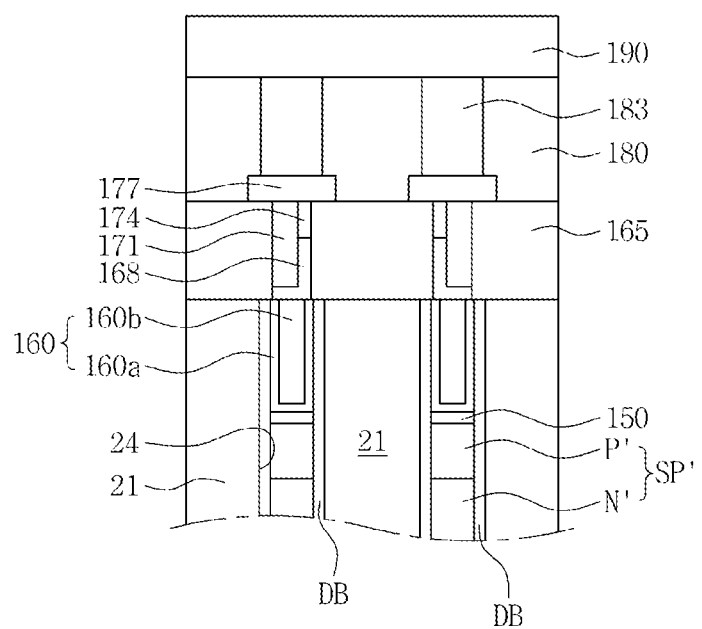
FIG. 25 is a cross-sectional of a memory device including a semiconductor device according to a modified example of example embodiments.

Referring to FIG. 25, a semiconductor substrate in which a semiconductor pattern SP' is disposed at a lower level than a top surface of an upper insulating layer 21, may be prepared. For instance, a semiconductor substrate having a semiconductor pattern 42' (SP') partially filling a hole 24 formed in the upper insulating layer 21 may be prepared. The semiconductor pattern 42' (SP') may include a P-type semiconductor region P' and an N-type semiconductor region N'.

A metal plug structure 160 may be provided to fill the remaining portion of the hole 24. The metal plug structure 160 may include a metal plug 160b and a metal barrier layer 160a covering side and bottom surfaces of the metal plug 160b.

The metal plug structure 160 and the semiconductor pattern SP' may be vertically aligned within the hole 24. The metal plug structure 160 and the semiconductor pattern SP' may be self-aligned within the hole 24.

A metal-semiconductor compound 150 may be provided between the semiconductor pattern SP' and the metal plug structure 160. The metal-semiconductor compound 150 may include a metal silicide, such as cobalt silicide or titanium silicide.

A first interlayer insulating layer 165 may be provided on the upper insulating layer 21. A lower conductive pattern 168 and a data storage pattern 174 may be formed in the first interlayer insulating layer 165. The data storage pattern 174 may include a material for storing data in a phase-change memory device. An insulating pattern 171 may be provided on side surfaces of the lower conductive pattern 168 and the data storage pattern 174.

An upper conductive pattern 177 may be provided on the data storage pattern 174. A second interlayer insulating layer 180 may be provided on the upper conductive pattern 177. A conductive plug 183 may be formed through the second interlayer insulating layer 180. A bit line 190 may be provided on the conductive plug 183.

FIGS. 26A through 26H are cross-sectional views illustrating a method of fabricating a semiconductor device according to example embodiments, and FIGS. 27A through 49D are cross-sectional views illustrating various modified examples of the method of fabricating the semiconductor device according to the example embodiments.

In FIGS. 26A through 49D, portion "A" is a region taken along line I-I' of FIG. 1, and portion "B" is a region taken along line II-II' of FIG. 1.

To begin with, a method of fabricating a semiconductor device according to example embodiments will be described with reference to FIGS. 26A through 26I.

Figure 26A:
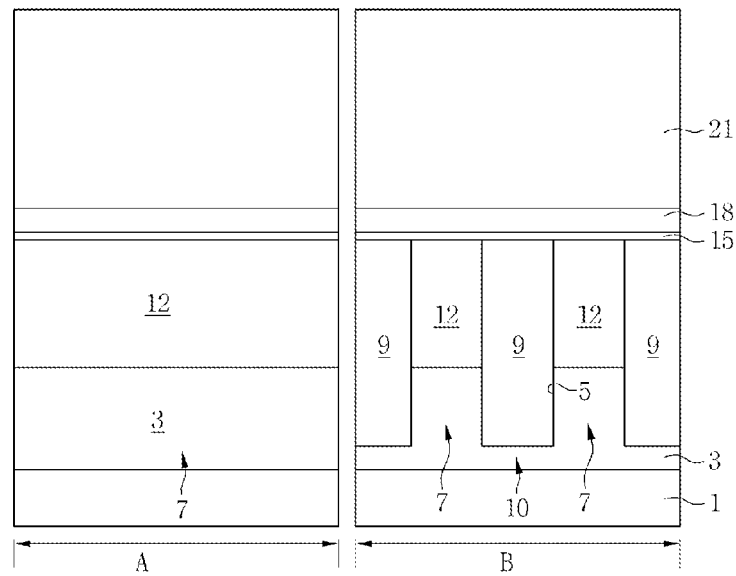
FIGS. 26A through 26H are cross-sectional views illustrating a method of fabricating a semiconductor device according to example embodiments.

Referring to FIGS. 1 and 26A, a semiconductor substrate 1 may be provided. The semiconductor substrate 1 may be a silicon substrate. A well region 3 may be provided in the semiconductor substrate 1. A field region 10 defining an active region 7 may be formed in the semiconductor substrate 1. The formation of the field region 10 may include forming a trench 5 in the semiconductor substrate 1, and forming an isolation pattern 9 to fill the trench 5. The isolation pattern 9 may be formed of an insulating material, such as silicon oxide (e.g., an HDP oxide).

Impurities may be implanted into the active region 7 to form a lower impurity region 12. The well region 3 may have a different conductivity type from the lower impurity region 12. For example, the well region 3 may be a P type, while the lower impurity region 12 may be an N type.

A lower insulating layer 15 and 18 and an upper insulating layer 21 may be sequentially stacked on the semiconductor substrate 1 having the active region 7. The lower insulating layer 15 and 18 may include a first insulating layer 15 and a second insulating layer 18 stacked sequentially. The first insulating layer 15 may be formed of silicon oxide using a deposition process or a thermal oxidation process. The second insulating layer 18 may be formed of a material having an etch selectivity with respect to the first insulating layer 15. For instance, when the first insulating layer 15 is formed of silicon oxide, the second insulating layer 18 may be formed of silicon nitride. The second insulating layer 18 may be thicker than the first insulating layer 15.

The upper insulating layer 21 may be formed of silicon oxide or a low-k dielectric material. The low-k dielectric material may be a dielectric material having a lower dielectric constant than silicon oxide.

Figure 26B:
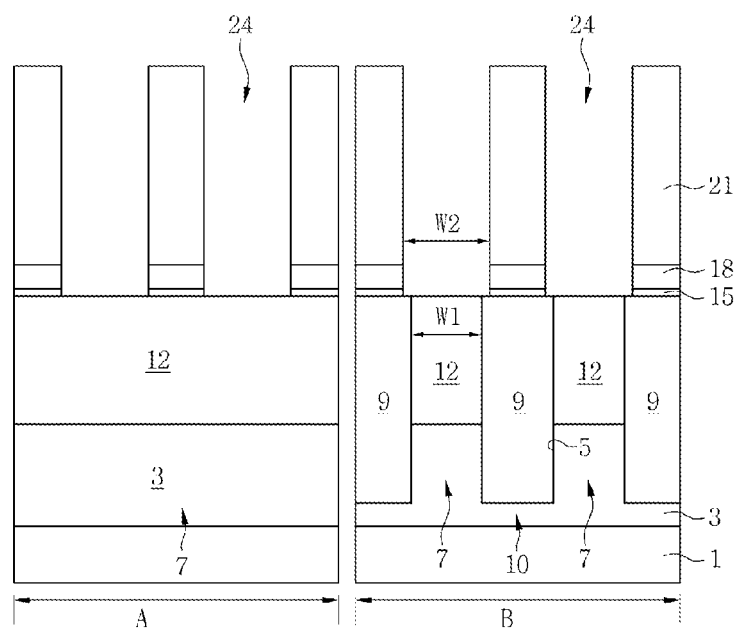

Referring to FIGS. 1 and 26B, the upper insulating layer 21, the second insulating layer 18, and the first insulating layer 15 may be patterned, thereby forming a hole 24 through the upper insulating layer 21, the second insulating layer 18, and the first insulating layer 15. The hole 24 may be formed to a width W2 greater than the width W1 of the active region 7. Given regions of the active region 7 may be exposed by the hole 24. Given regions of the lower impurity region 12 of the active region 7 may be exposed by the hole 24.

Figure 26C:
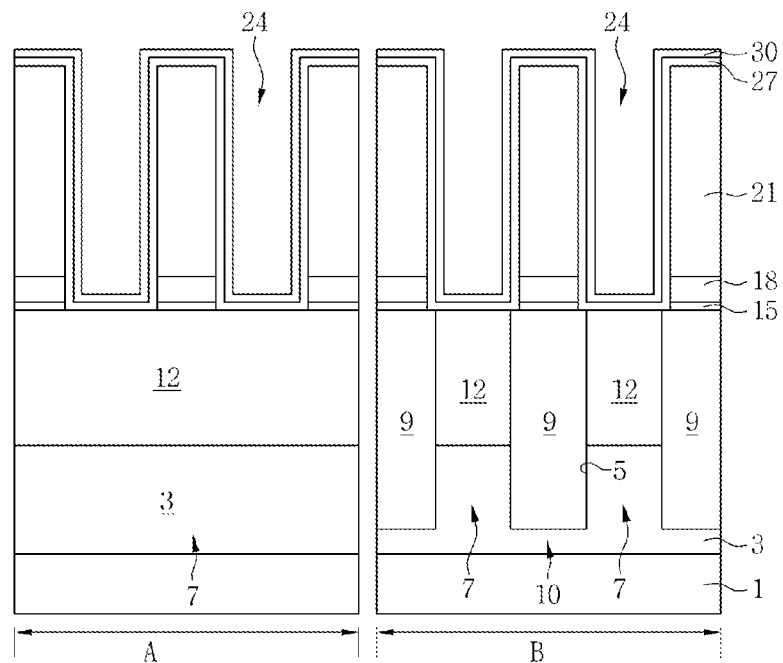

Referring to FIGS. 1 and 26C, a first layer 27 may be conformally formed on the substrate 1 having the hole 24. The first layer 27 may be formed of silicon oxide. A second layer 30 may be conformally formed on the substrate 1 having the first layer 27. The second layer 30 may be formed of a different material from the first layer 27. For example, the first layer 27 may be formed of silicon oxide, while the second layer 30 may be formed of silicon nitride or a silicon-nitride-based material. The second layer 1024 may be formed of a silicon-nitride-based material, for example, at least one of SiN, SiCN, SiBN, SiON, SiOCN, or SiBCN.

Figure 26D:
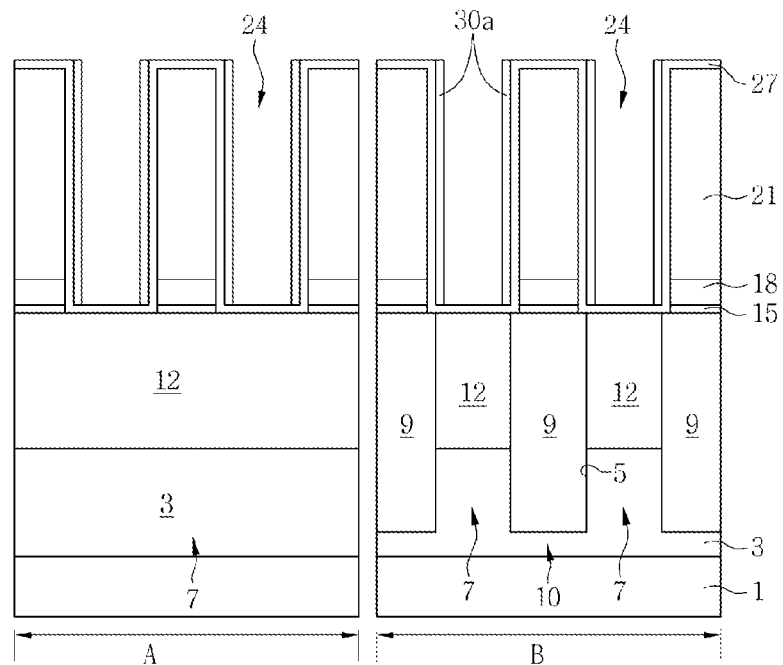

Referring to FIGS. 1 and 26D, the second layer 30 may be selectively etched using an anisotropic etching process, thereby leaving a second dielectric material 30a on sidewalls of the hole 24.

Figure 26E:
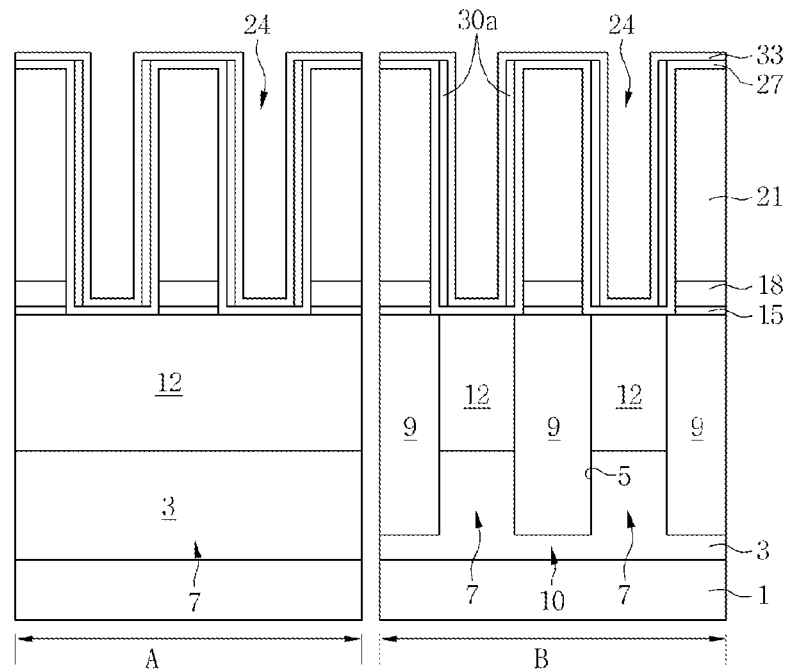

Referring to FIGS. 1 and 26E, a third layer 33 may be conformally formed on the substrate 1 having the second dielectric material 30a. The third layer 33 may be formed of a different material from the second dielectric material 30a. For example, when the second dielectric material 30a is formed of silicon nitride, the third layer 33 may be formed of silicon oxide.

Figure 26F:
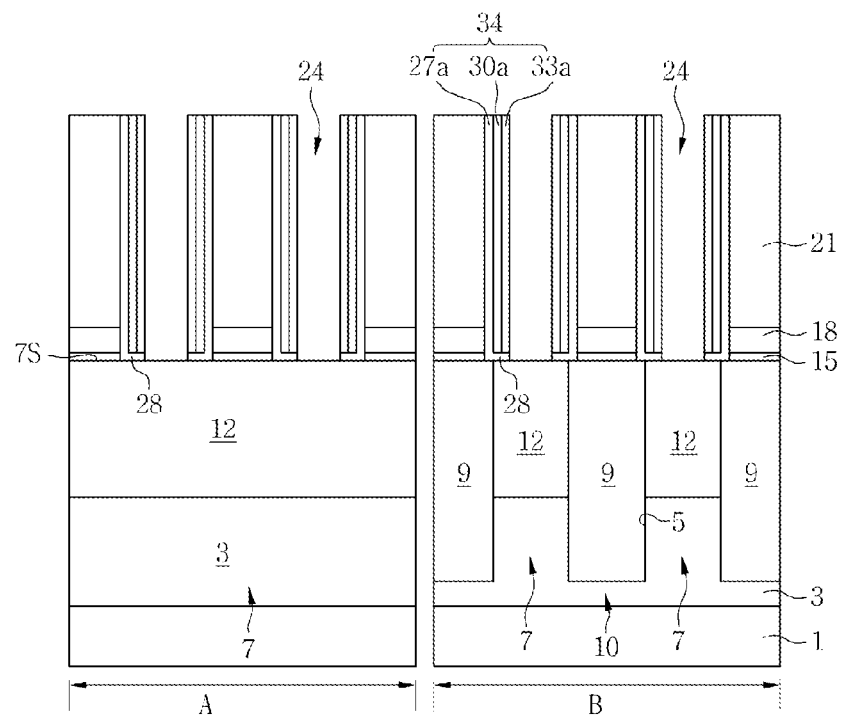

Referring to FIGS. 1 and 26F, the third layer 33 and the first layer 27 may be anisotropically etched, thereby leaving a third dielectric material 33a and a first dielectric material 27a within the hole 24. Accordingly, the first dielectric material 27a, the second dielectric material 30a, and the third dielectric material 33a may be sequentially formed on sidewalls of the hole 24.

The second and third dielectric materials 30a and 33a may be spaced apart from a surface 7s of the active region 7. The first dielectric material 27a may include a bottom portion 28 extending between bottom ends of the second and third dielectric materials 30a 33a and the surface 7s of the active region 7. The first through third dielectric materials 27a, 30a, and 33a may constitute a barrier region 34. The second dielectric material 30a may be defined as a barrier dielectric material, while the first and third dielectric materials 27a and 33a may be defined as buffer dielectric materials.

Figure 26G:
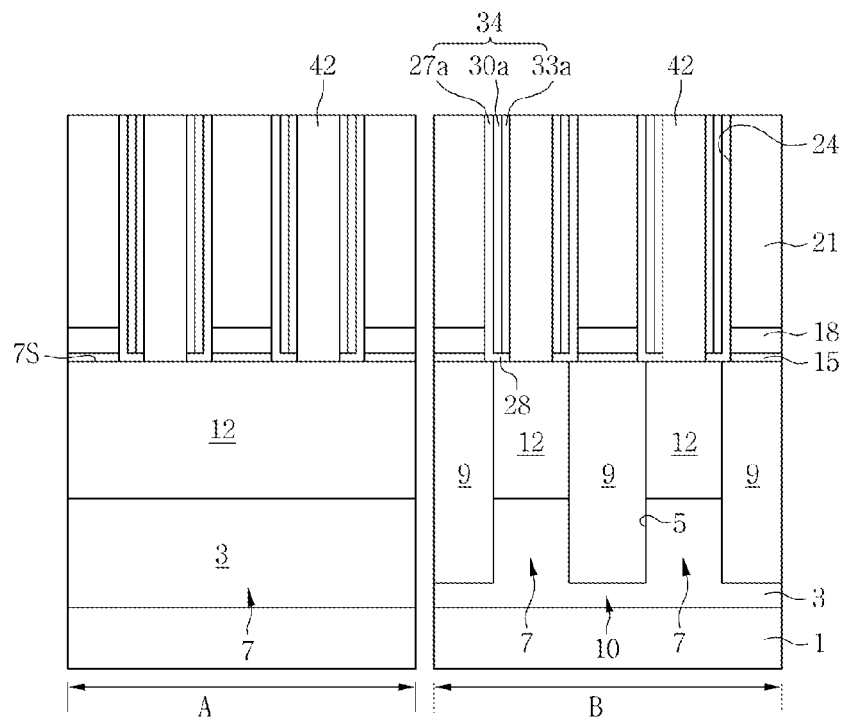

Referring to FIGS. 1 and 26G, a semiconductor pattern 42 may be formed within the hole 24 in which the barrier region 34 is formed. The semiconductor pattern 42 may be formed of crystalline silicon. For instance, the semiconductor pattern 42 may include single crystalline silicon grown from the surface 7s of the active region 7 exposed by the hole 24 using a selective epitaxial growth (SEG) process, but example embodiments are not limited thereto. For instance, the formation of the semiconductor pattern 42 may include filling the hole 24 in which the first through third dielectric materials 27a, 30a, and 33a are formed, with noncrystalline silicon, and crystallizing the noncrystalline silicon into crystalline silicon using an annealing process. The crystalline silicon may be poly-Si.

Figure 26H:
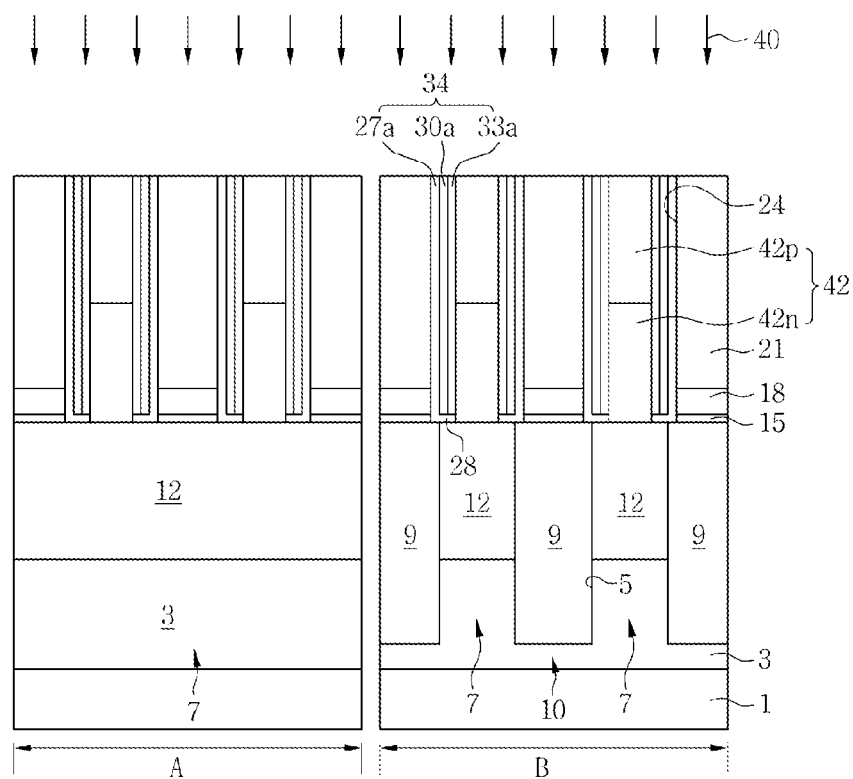

Referring to FIGS. 1 and 26H, an ion implantation process 40 for implanting impurities into the semiconductor pattern 42 may be performed so that the impurities implanted into the semiconductor pattern 42 may be activated to form a first semiconductor region 42p.

The formation of the first semiconductor region 42p may include implanting impurities, such as boron (B), into an upper region of the semiconductor pattern 42, and performing an annealing process to activate the implanted impurities. Also, during the annealing process, impurities may diffuse from the lower impurity region 12 of the active region 7 into a lower region of the semiconductor pattern 42 to form a second semiconductor region 42n. Accordingly, the semiconductor pattern 42 may include a first semiconductor region 42p and a second semiconductor region 42n disposed under the first semiconductor region 42p.

Meanwhile, the formation of the first semiconductor region 42p and the second semiconductor region 42n may include implanting impurities of a Group III element, such as boron (B), into an upper region of the semiconductor pattern 42, implanting impurities of a Group V element, such as phosphorous (P) or arsenic (As), into a lower region of the semiconductor pattern 42, and performing an annealing process for activating the implanted impurities to form a first semiconductor region 42p and a second semiconductor region 42n disposed under the first semiconductor region 42p. The first semiconductor region 42p may have a P conductivity type, and the second semiconductor region 42n may have an N conductivity type. Accordingly, the first and second semiconductor regions 42p and 42n may constitute a PN diode. Accordingly, a semiconductor device may be formed as described with reference to FIG. 2.

Within the hole 24, the second dielectric material 30a, that is, a barrier dielectric material, may cut off or prevent the diffusion of impurities, such as boron (B), from the first semiconductor region 42p into the upper insulating layer 21. Accordingly, a reduction in the concentration of impurities (e.g., B) in the first semiconductor region 42p may be reduced.

Within the hole 24, the third dielectric material 33a may space the second dielectric material 30a apart from the semiconductor pattern 42. The third dielectric material 33a may be interposed between the second dielectric material 30a and the semiconductor pattern 42, and function as a buffer capable of preventing the semiconductor pattern 42 from directly contacting the second dielectric material 30a. Within the hole 24, the bottom portion 28 of the first dielectric material 27a may space the second dielectric material 30a apart from the active region 7. The bottom portion 28 of the first dielectric material 27a may be interposed between the second dielectric material 30a and the active region 7, and function as a buffer capable of preventing the second dielectric material 30a from directly contacting the active region 7.

Next, a modified example of the method of fabricating a semiconductor device according to the example embodiments will be described with reference to FIGS. 27A through 27D.

Figure 27A:
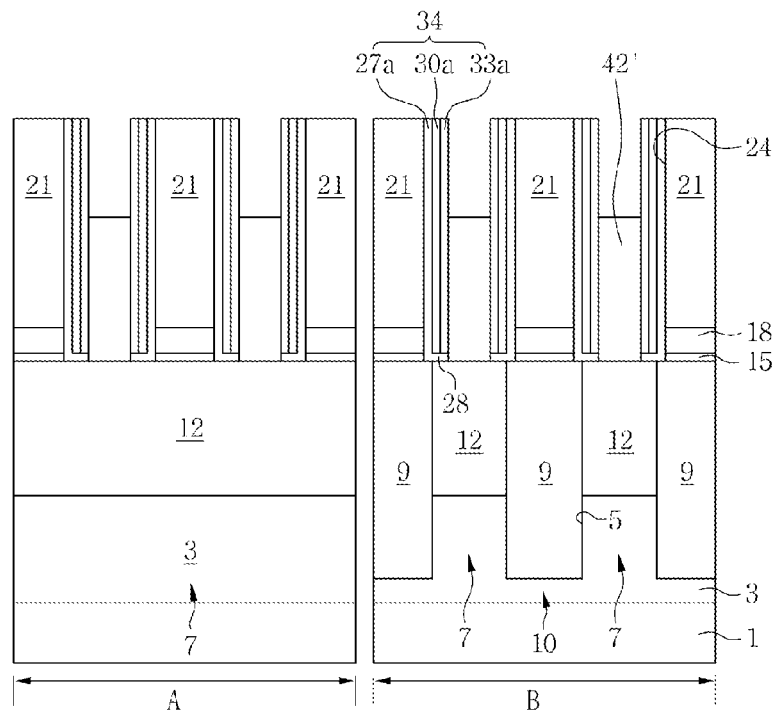
FIGS. 27A and 27B are cross-sectional views illustrating a method of fabricating a semiconductor device according to a modified example of the example embodiments.

Referring to FIGS. 1 and 27A, a semiconductor substrate having a barrier region 34 disposed on sidewalls of a hole 24 may be prepared as described with reference to FIGS. 26A through 26F. A semiconductor pattern 42' may be formed to partially fill the hole 24 in which the barrier region 34 is formed. The semiconductor pattern 42' may be formed of crystalline silicon.

The formation of the semiconductor pattern 42' may include growing a single-crystalline silicon layer from the surface of the active region 7 exposed by the hole 24 using a SEG process, and etching the single-crystalline silicon layer, but example embodiments are not limited thereto. For example, the formation of the semiconductor pattern 42' may include filling the hole 24 in which the barrier region 34 is formed, with a noncrystalline silicon layer, partially etching the noncrystalline silicon layer, and crystallizing the noncrystalline silicon layer into a crystalline silicon layer using a an annealing process. In another case, the formation of the semiconductor pattern 42' may include filling the hole 24 in which the barrier region 34 is formed, with a noncrystalline silicon layer, crystallizing the noncrystalline silicon layer into a crystalline silicon layer using an annealing process, and partially etching the crystalline silicon layer.

Figure 27B:
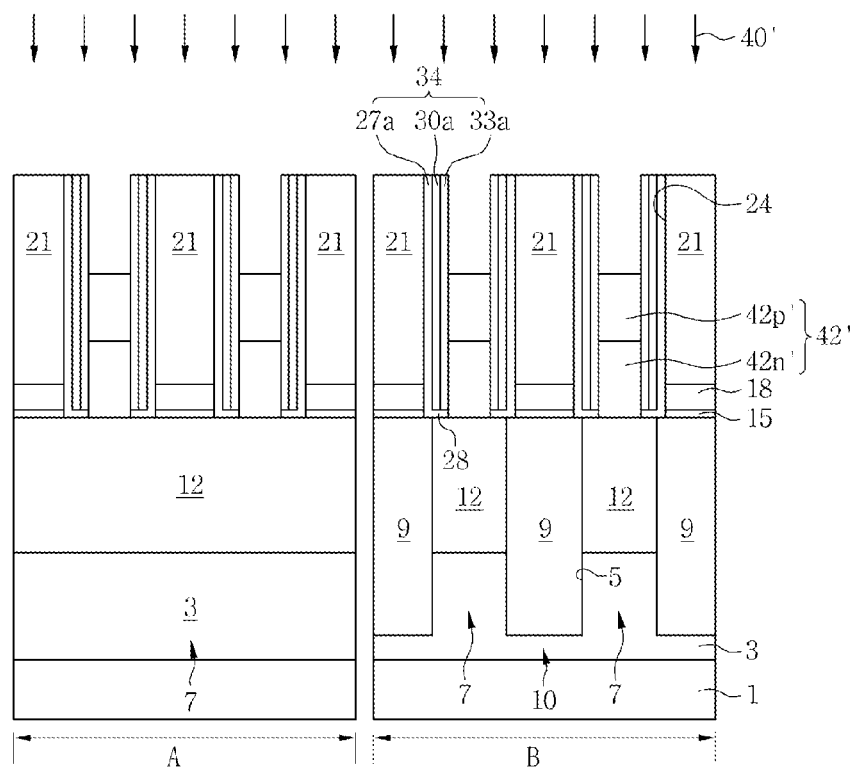

Referring to FIGS. 1 and 27B, as in FIG. 26I, an ion implantation process 40' for implanting impurities into the semiconductor pattern 42' may be performed so that the impurities implanted into the semiconductor pattern 42' may be activated to form a first semiconductor region 42p'. As described with reference to FIG. 26I, a second semiconductor region 42n' may be formed in the semiconductor pattern 42' disposed under the first semiconductor region 42p'. The first and second semiconductor regions 42p' and 42n' of the semiconductor pattern 42' may constitute a PN diode.

Next, another modified example of the method of fabricating a semiconductor device according to the example embodiments will be described with reference to FIGS. 28A through 28C.

Figure 28A:
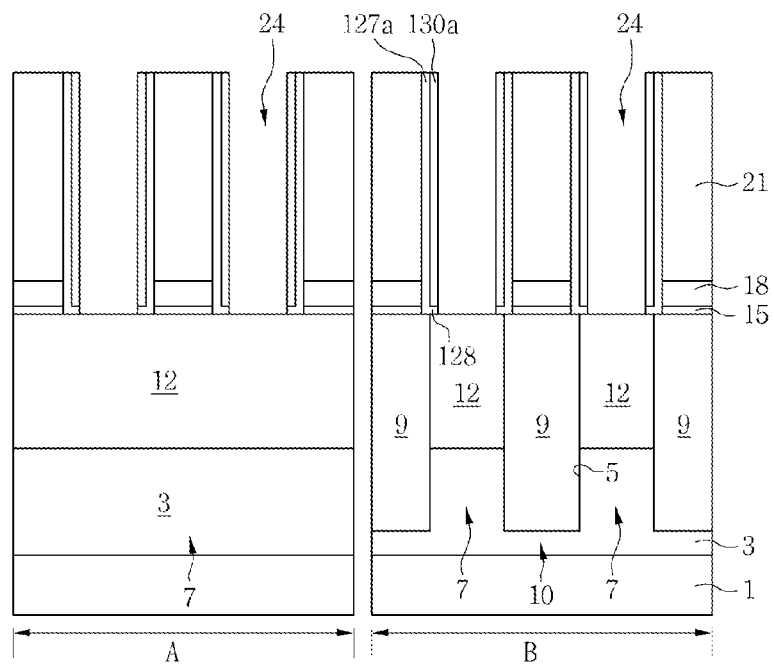
FIGS. 28A through 28C are cross-sectional views illustrating a method of fabricating a semiconductor device according to another modified example of the example embodiments.

Referring to FIGS. 1 and 28A, as described with reference to FIG. 26A, a field region 10 defining an active region 7 may be formed in a semiconductor substrate 1, and a lower insulating layer 15 and 18 and an upper insulating layer 21 may be sequentially stacked on the semiconductor substrate 1 having the active region 7 and the field region 10. The lower insulating layer 15 and 18 may include a first insulating layer 15 and a second insulating layer 18 stacked sequentially. A hole 24 may sequentially penetrate the upper insulating layer 21, the second insulating layer 18, and the first insulating layer 15.

As described with reference to FIG. 26C, a first layer and a second layer may be sequentially conformally formed on the substrate 1 having the hole 24. Thereafter, the first and second layers may be anisotropically etched, thereby forming a first dielectric material 127a and a second dielectric material 130a on sidewalls of the hole 24.

The first dielectric material 127a may be interposed between the second dielectric material 130a and the sidewalls of the hole 24. Furthermore, the first dielectric material 127a may include a bottom portion 128 interposed between the second dielectric material 130a and the active region 7.

Figure 28B:
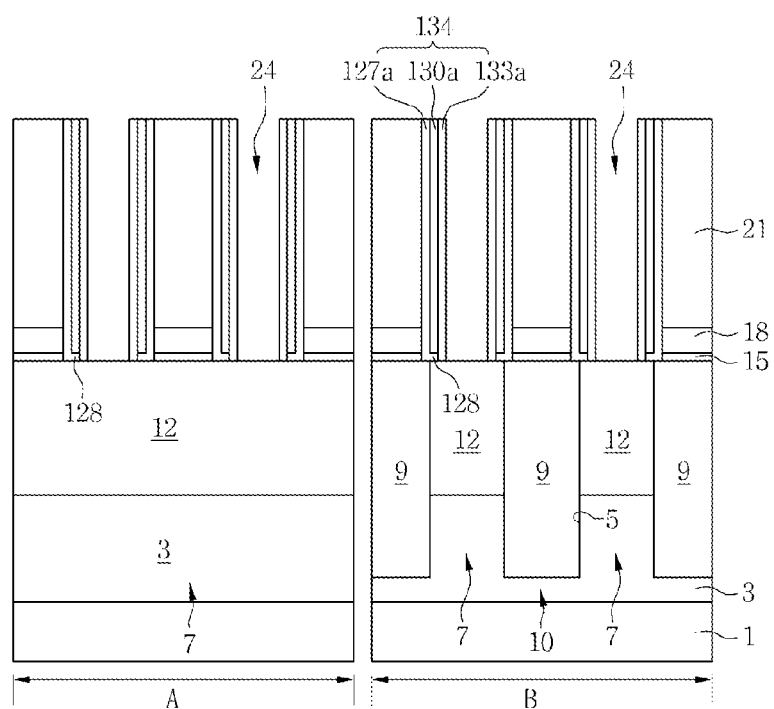

Referring to FIGS. 1 and 28B, a third layer may be formed on the substrate 1 having the first and second dielectric materials 127a and 130a, and anisotropically etched, thereby forming a third dielectric material 133a. The third dielectric material 133a may cover the second dielectric material 130a within the hole 24 and extend to the surface of the active region 7. The first through third dielectric materials 127a, 130a, and 133a may be defined as a barrier region 134 as described with reference to FIG. 4.

Figure 28C:
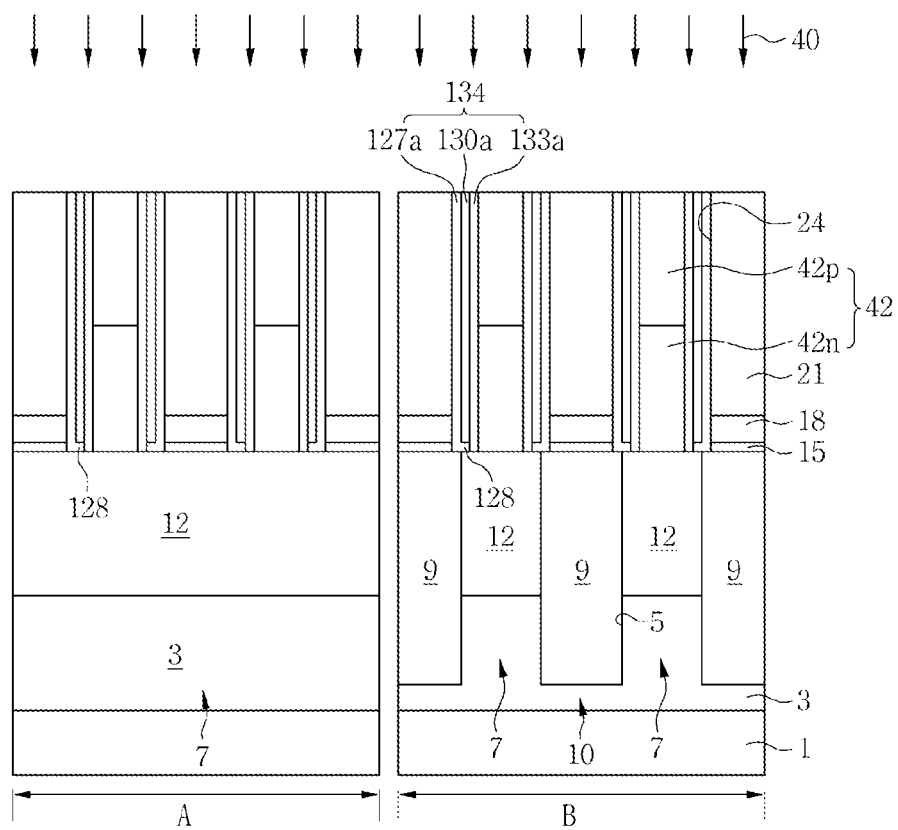

Referring to FIGS. 1 and 28C, a semiconductor pattern 42 may be formed within the hole 24 in which the barrier region 134 is formed. As described with reference to FIG. 26I, an ion implantation process 40 for implanting impurities into the semiconductor pattern 42 may be performed so that a first semiconductor region 42p may be formed in the semiconductor pattern 42. Also, a second semiconductor region 42n may be formed in the semiconductor pattern 42 disposed under the first semiconductor region 42p.

Next, another modified example of the method of fabricating a semiconductor device according to the example embodiments will be described with reference to FIGS. 29A through 29D.

Figure 29A:
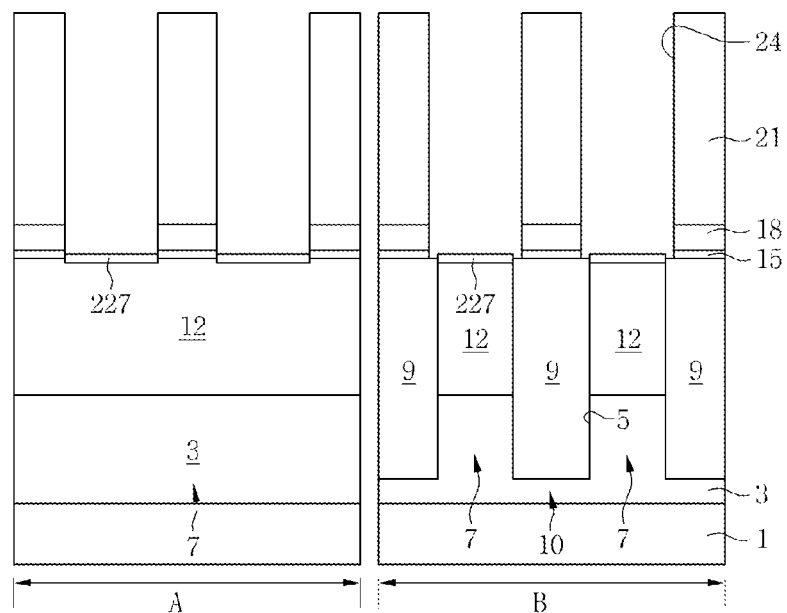
FIGS. 29A through 29D are cross-sectional views illustrating a method of fabricating a semiconductor device according to another modified example of the example embodiments.

Referring to FIGS. 1 and 29A, as described with reference to FIG. 26A, a field region 10 defining an active region 7 may be formed in a semiconductor substrate 1, and a first insulating layer 15, a second insulating layer 18, and an upper insulating layer 21 may be sequentially stacked on the semiconductor substrate 1 having the active region 7 and the field region 10. A hole 24 may sequentially penetrate the upper insulating layer 21, the second insulating layer 18, and the first insulating layer 15.

A first layer 227 may be formed on the active region 7 exposed by the hole 24. For instance, the first layer 227 may include oxide (e.g., silicon oxide) obtained by thermally oxidizing the active region 7 exposed by the hole 24.

Figure 29B:
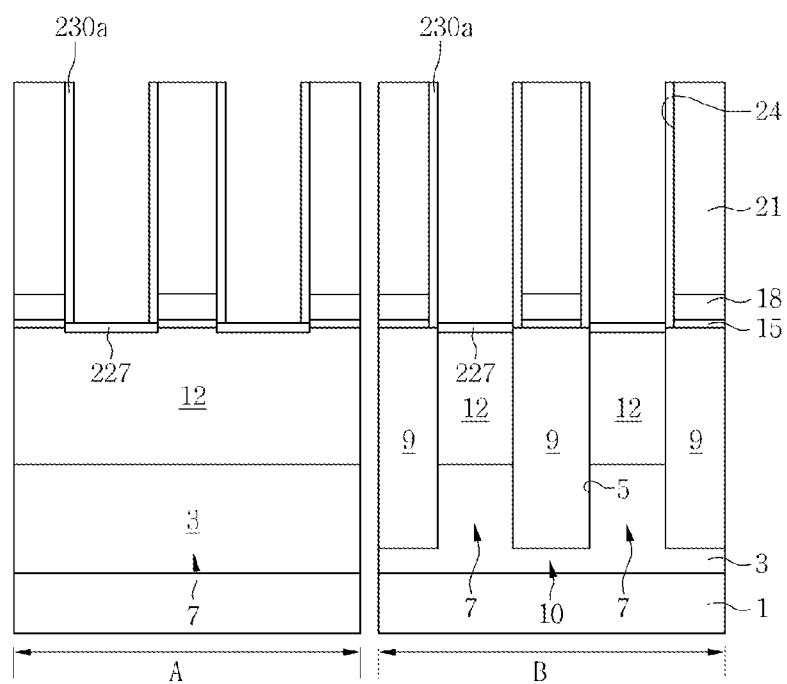

Referring to FIGS. 1 and 29B, a second layer may be formed on the semiconductor substrate 1 having the first layer 227 and selectively etched using an anisotropic process, thereby forming a second dielectric material 230a remaining on sidewalls of the hole 24. The second dielectric material 230a may be formed of a different material from the upper insulating layer 21 and the first layer 227. For example, the upper insulating layer 21 may be formed of oxide using a deposition process, the first layer 227 may be formed of oxide using an oxidation process, and the second dielectric material 230a may be formed of nitride.

Figure 29C:
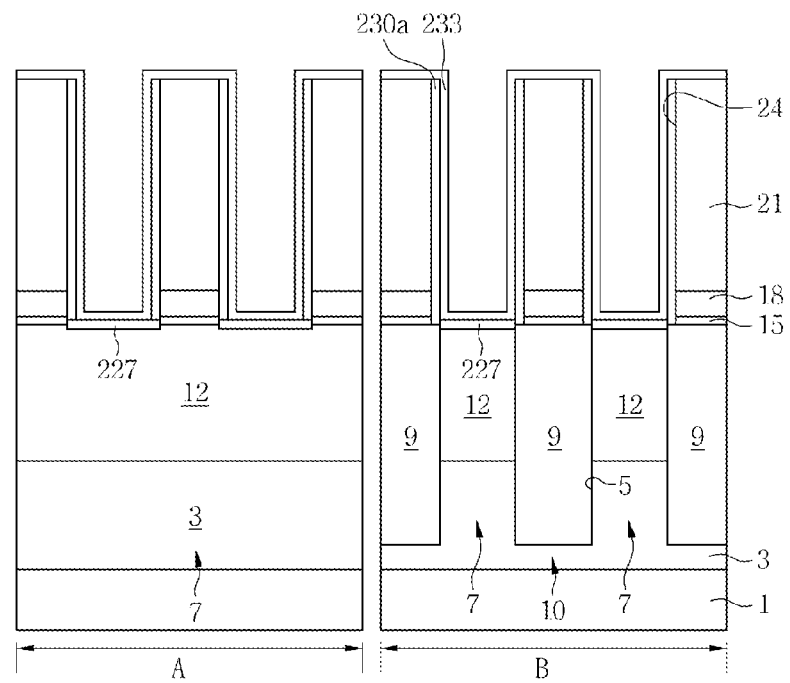

Referring to FIGS. 1 and 29C, a third layer 233 may be conformally formed on the substrate 1 having the second dielectric material 230a. The third layer 233 may be formed of silicon oxide.

Figure 29D:
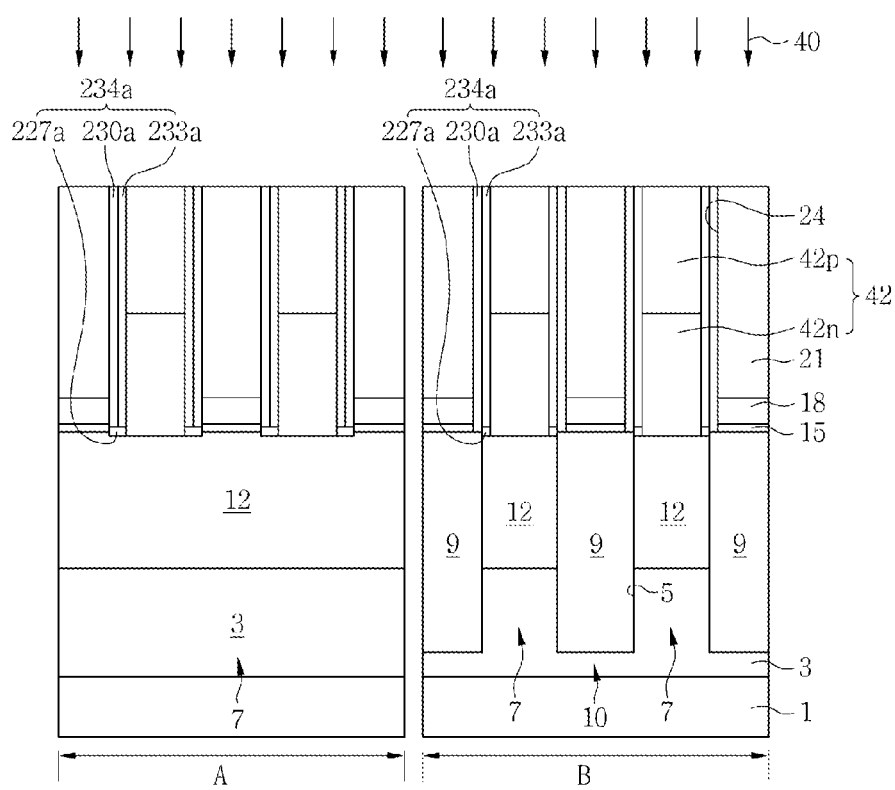

Referring to FIGS. 1 and 29D, the third layer 233 and the first layer 227 may be anisotropically etched to form a third dielectric material 233a and a first dielectric material 227a. As described with reference to FIG. 5, the first through third dielectric materials 227a, 230a, and 233a may constitute a barrier region 234a. A semiconductor pattern 42 may be formed within the hole 24 in which the barrier region 234a is formed.

The second dielectric material 230a may be spaced apart from the active region 7. For example, the first dielectric material 227a may be interposed between the second dielectric material 230a and the active region 7 so that the second dielectric material 230a may be spaced apart from the active region 7. The third dielectric material 233a may be interposed between the second dielectric material 230a and the semiconductor pattern 42 so that the second dielectric material 230*a* may be spaced apart from the semiconductor pattern 42.

Thereafter, as described with reference to FIG. 26I, an ion implantation process 40 for implanting impurities into the semiconductor pattern 42 may be performed so that a first semiconductor region 42*p* may be formed in the semiconductor pattern 42. Also, a second semiconductor region 42*n* may be formed in the semiconductor pattern 42 disposed under the first semiconductor region 42*p*.

Next, another modified example of the method of fabricating a semiconductor device according to the example embodiments will be described with reference to FIGS. 30A through 30C.

Figure 30A:
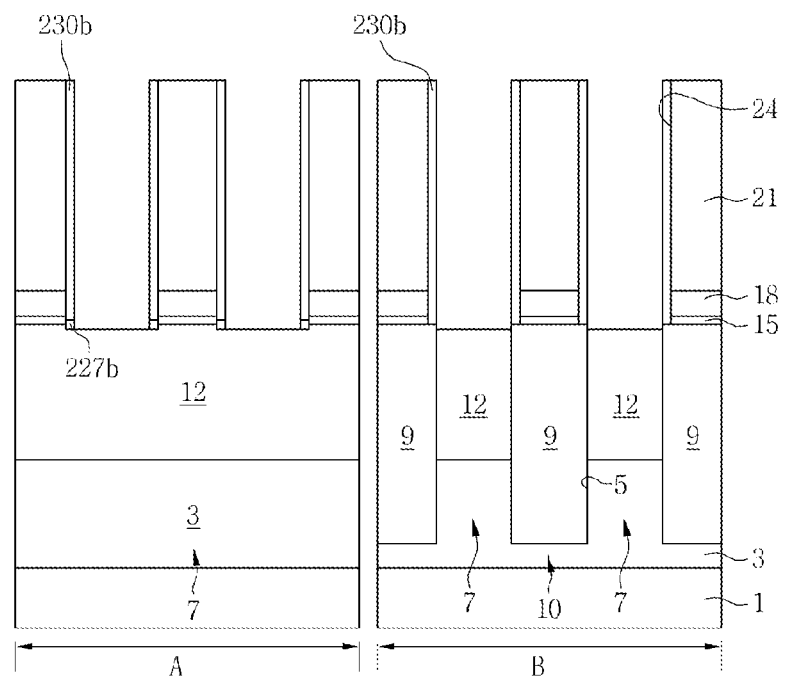
FIGS. 30A through 30C are cross-sectional views illustrating a method of fabricating a semiconductor device according to another modified example of the example embodiments.

Referring to FIGS. 1 and 30A, a substrate may be prepared as described with reference to FIG. 29B. For example, as described with reference to FIG. 26A, a field region 10 defining an active region 7 may be formed in a semiconductor substrate 1, and a first insulating layer 15, a second insulating layer 18, and an upper insulating layer 21 may be sequentially stacked on the semiconductor substrate 1 having the active region 7 and the field region 10. A hole 24 may sequentially penetrate the upper insulating layer 21, the second insulating layer 18, and the first insulating layer 15. Thereafter, a first layer may be formed on the active region 7 exposed by the hole 24, and a second dielectric material 230*b* may be formed on sidewalls of the hole 24, as shown in FIG. 29B. Thereafter, the first layer may be anisotropically etched, thereby forming a first dielectric material 227*b* remaining under the second dielectric material 230*b*.

Figure 30B:
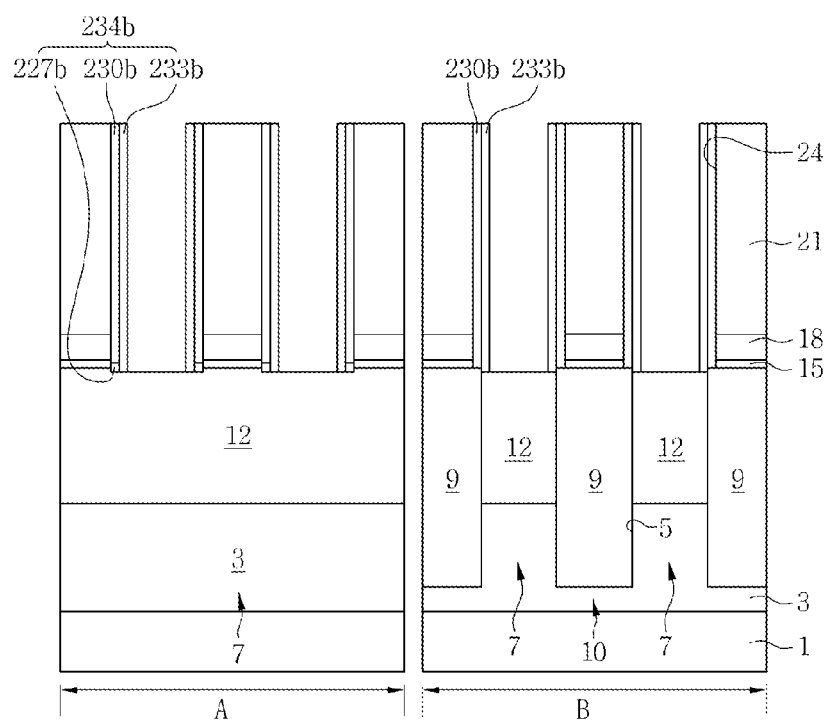

Referring to FIGS. 1 and 30B, a third layer may be formed on the substrate 1 having the first and second dielectric materials 227*b* and 230*b* and anisotropically etched to form a third dielectric material 233*b*. The first through third dielectric materials 227*b*, 230*b*, and 233*b* may constitute a barrier region 234*b* as shown in FIG. 6.

Figure 30C:
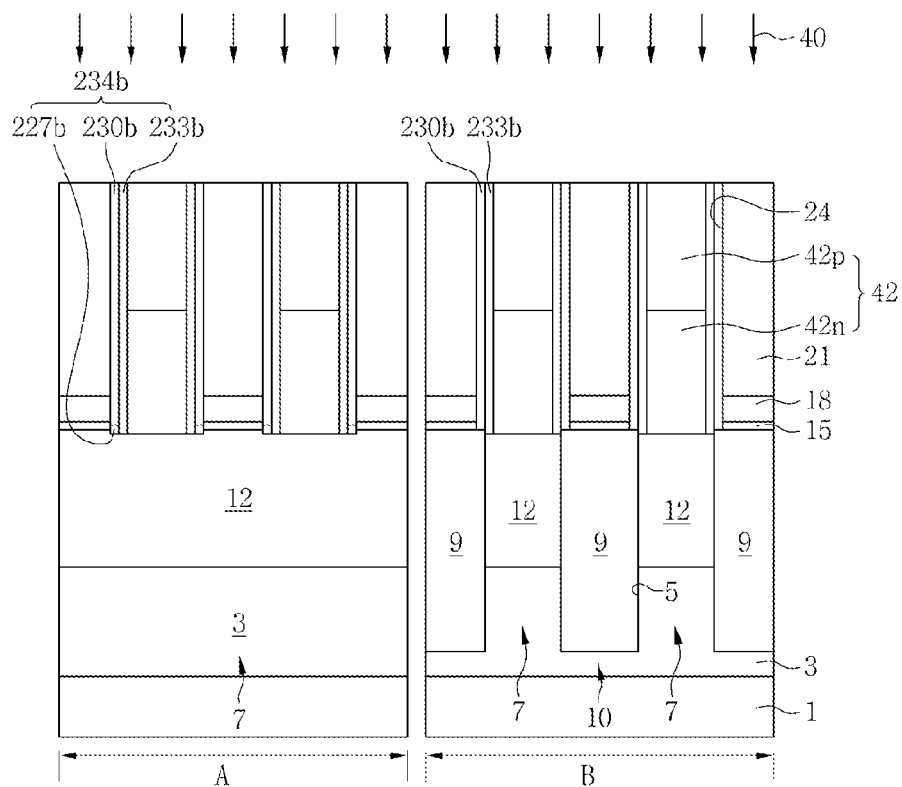

Referring to FIGS. 1 and 30C, a semiconductor pattern 42 may be formed within the hole 24 in which the first through third dielectric materials 227*b*, 230*b*, and 233*b* are formed.

The second dielectric material 230*b* may be spaced apart from the active region 7. For instance, the first dielectric material 227*b* may be interposed between the second dielectric material 230*b* and the active region 7 so that the second dielectric material 230*b* may be spaced apart from the active region 7. The third dielectric material 233*b* may be interposed between the second dielectric material 230*b* and the semiconductor pattern 42 so that the second dielectric material 230*b* may be spaced apart from the semiconductor pattern 42. The third dielectric material 233*b* may be interposed between the second dielectric material 230*b* and the semiconductor pattern 42 and extend onto the surface of the active region 7.

Thereafter, as described with reference to FIG. 26I, an ion implantation process 40 for implanting impurities into the semiconductor pattern 42 may be performed so that a first semiconductor region 42*p* can be formed in the semiconductor pattern 42. Also, a second semiconductor region 42*n* may be formed in the semiconductor pattern 42 disposed under the first semiconductor region 42*p*.

Next, another modified example of the method of fabricating a semiconductor device according to the example embodiments will be described with reference to FIGS. 31A through 31C.

Figure 31A:
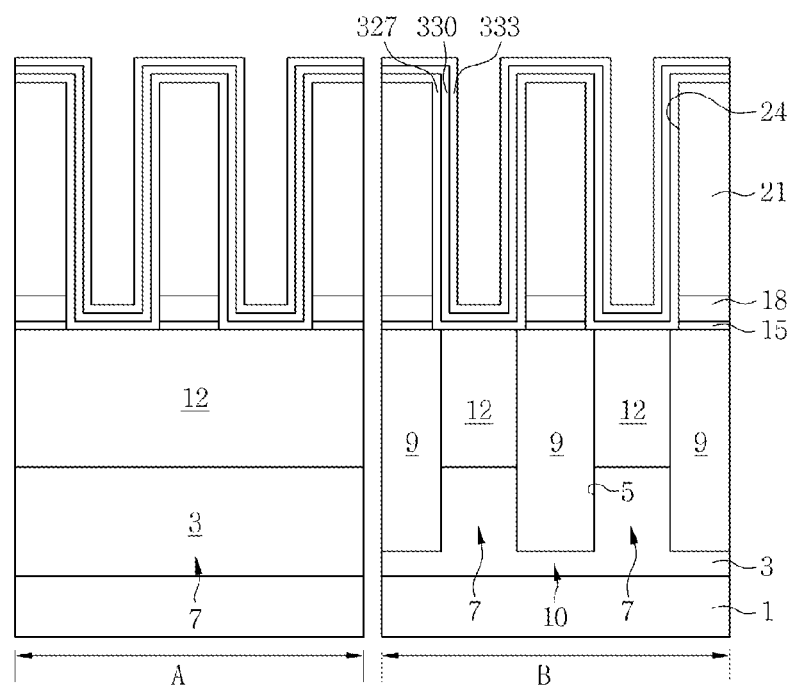
FIGS. 31A through 31C are cross-sectional views illustrating a method of fabricating a semiconductor device according to another modified example of the example embodiments.

Referring to FIGS. 1 and 31A, as described with reference to FIG. 26A, a field region 10 defining an active region 7 may be formed in a semiconductor substrate 1, and a first insulating layer 15, a second insulating layer 18, and an upper insulating layer 21 may be sequentially stacked on the semiconductor substrate 1 having the active region 7 and the field region 10. A hole 24 may sequentially penetrate the second insulating layer 18, and the first insulating layer 15.

A first layer 327, a second layer 330, and a third layer 333 may be sequentially and conformally formed on the active region 7 exposed by the hole 24. The second layer 330 may be formed of a different material from the first and third layers 327 and 333. The first and third layers 327 and 333 may be formed of silicon oxide, while the second layer 333 may be formed of silicon nitride.

Figure 31B:
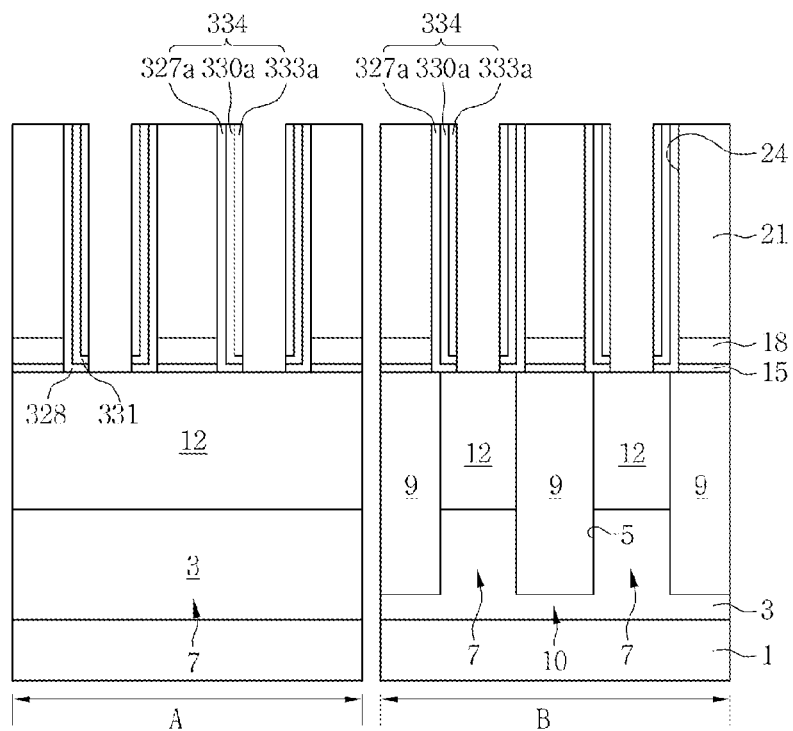
Figure 31C:
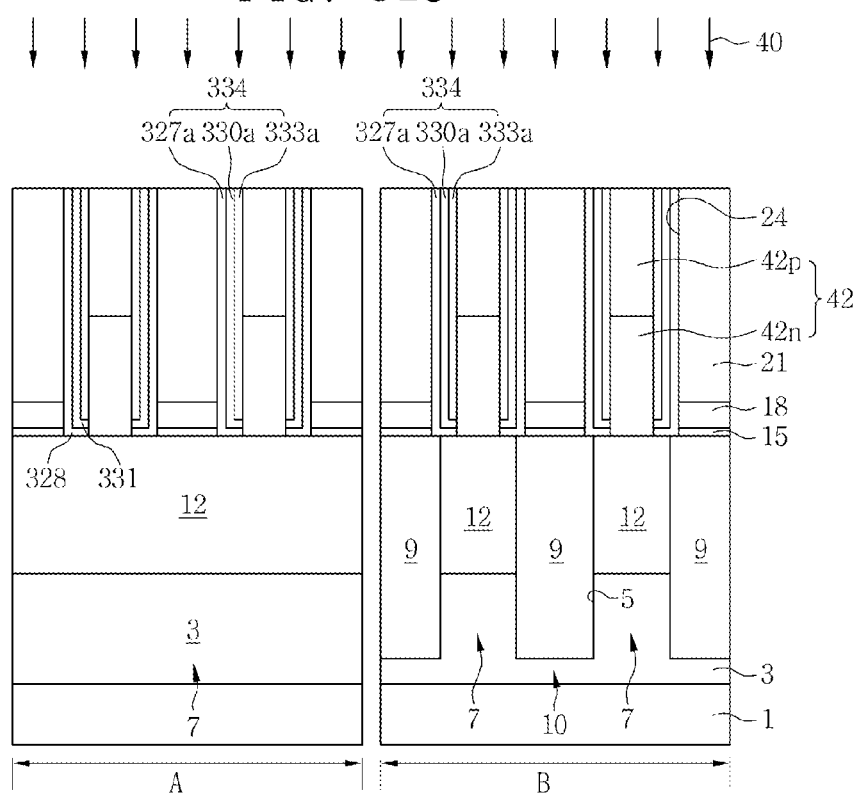

Referring to FIGS. 1 and 31B, the first through third layers 327, 330, and 333 may be anisotropically etched, thereby forming first through third dielectric materials 327*a*, 330*a*, and 333*a* remaining on sidewalls of the hole 24. The first through third dielectric materials 327*a*, 330*a*, and 333*a* may constitute a barrier region 334. A semiconductor pattern 42 may be formed within the hole 24 in which the barrier region 334 is formed.

The second dielectric material 330*a* may be interposed between the first and third dielectric materials 327*a* and 333*a*, and include a bottom region 331 extending between the third dielectric material 333*a* and the active region 7. The first dielectric material 327*a* may be interposed between the second dielectric material 330*a* and sidewalls of the hole 24, and include a bottom region 328 extending between a bottom region 331 of the second dielectric material 330*a* and the active region 7. Accordingly, the second dielectric material 330*a* may be spaced apart from the active region 7.

Thereafter, as described with reference to FIG. 26I, an ion implantation process for implanting impurities into the semiconductor pattern 42 so that a first semiconductor region 42*p* may be formed in the semiconductor pattern 42. Also, a second semiconductor region 42*n* may be formed in the semiconductor pattern 42 disposed under the first semiconductor region 42*p*.

Next, another modified example of the method of fabricating a semiconductor device according to the example embodiments will be described with reference to FIGS. 32A through 32E.

Figure 32A:
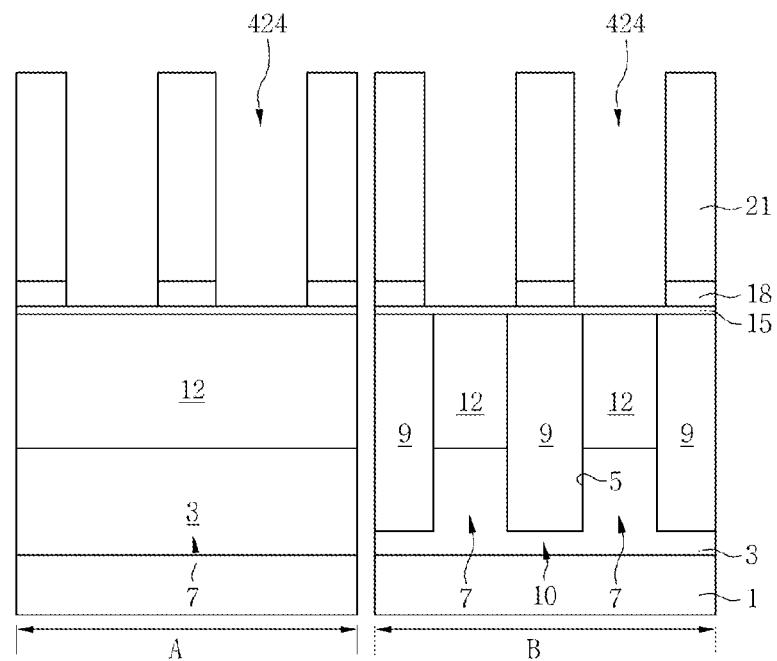
FIGS. 32A through 32E are cross-sectional views illustrating a method of fabricating a semiconductor device according to another modified example of the example embodiments.

Referring to FIGS. 1 and 32A, as described with reference to FIG. 26A, a field region 10 defining an active region 7 may be formed in a semiconductor substrate 1, and a lower insulating layer 15 and 18 and an upper insulating layer 21 may be sequentially stacked on the semiconductor substrate 1 having the active region 7 and the field region 10. The lower insulating layer 15 and 18 may include a first insulating layer 15 and a second insulating layer 18 stacked sequentially.

A hole 424 may sequentially penetrate the upper insulating layer 21 and the second insulating layer 18 and expose the first insulating layer 15. Side surfaces of the second insulating layer 18 may be exposed by the hole 424.

Figure 32B:
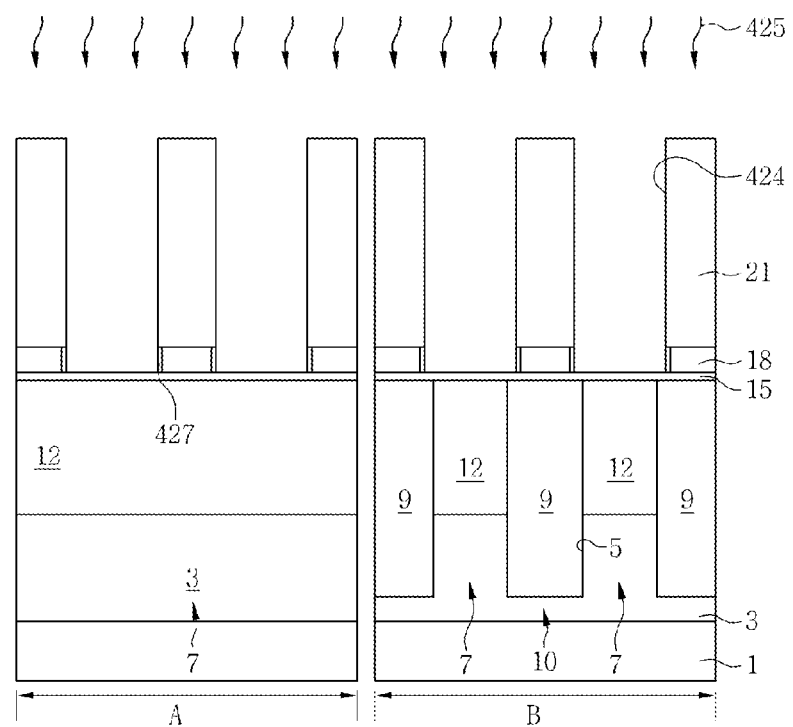

Referring to FIGS. 1 and 32B, the side surfaces of the second insulating layer 18, which are exposed by the hole 424, may be oxidized using an oxidation process 425 to form an oxide region 427. The first insulating layer 15 and the upper insulating layer 21 may be formed of oxide, for example, silicon oxide, while the second insulating layer 18 may be formed of silicon nitride. Accordingly, the side surfaces of the second insulating layer 18 exposed by the hole 424 may be oxidized to form the oxide region 427.

Due to the oxidation process 425, the oxide region 427 may be formed by growing oxide from the side surfaces of the second insulating layer 18 exposed by the hole 424 using oxygen radicals. For example, the oxidation process 425 may include growing oxide from the side surfaces of the second insulating layer 18 exposed by the hole 424, using oxygen radicals generated in a process chamber capable of changing oxygen gas into oxygen radicals using heat and/or plasma to form the oxide region 427.

Figure 32C:
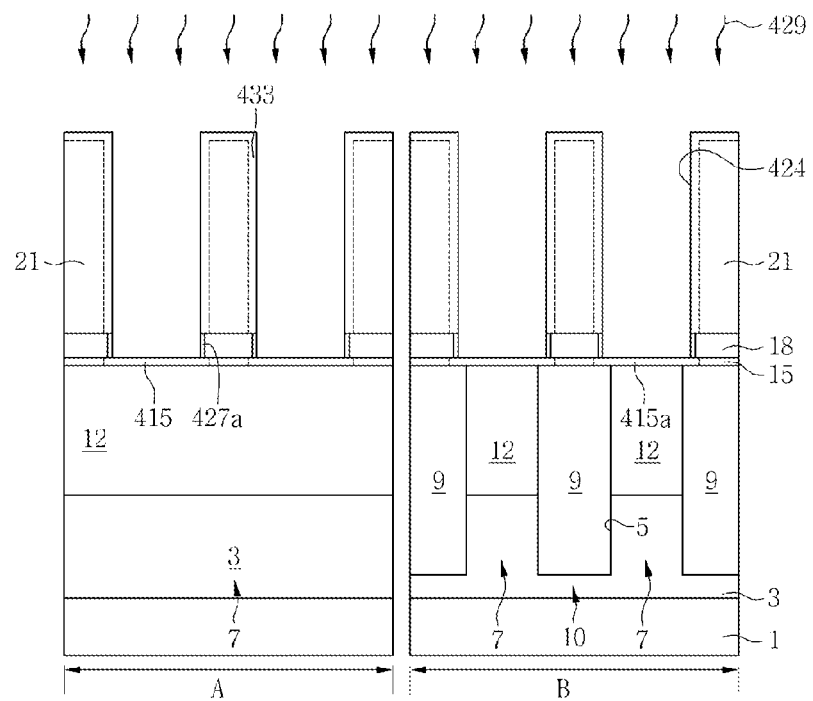

Referring to FIGS. 1 and 32C, an ion implantation process 429 may be performed on the substrate 1 having the oxide region 427. Thus, a doped barrier region 433 may be formed in the exposed region of the upper insulating layer 21, the oxide region 427 may be doped to form a doped oxide region 427a, and the first insulating layer 15 exposed by the hole 424 may be doped to form a doped insulating layer 415. For instance, the ion implantation process 429 may include implanting impurities into the upper insulating layer 21 exposed by the hole 424, the oxide region 427, and the first insulating layer 15 using a gas containing an impurity element. Here, the implanted impurities may include at least one element of N, C, Cl, F, Ar or Xe. For example, the ion implantation process 429 may be performed using a nitrogen (N)-containing gas (e.g., NO gas, $N_2O$, gas, or $NH_3$ gas). Similarly, the ion implantation process 429 may be performed using a gas containing any one element of C, Cl, F, Ar or Xe.

The doped barrier region 433 may be formed by doping at least one of N, C, Cl, F, Ar or Xe into the upper insulating layer 21, and the doped oxide region 427a may be formed by doping at least one of N, C, Cl, F, Ar or Xe into the oxide region 427. The doped insulating region 415 may be formed by doping at least one of N, C, Cl, F, Ar or Xe into the first insulating layer 15.

Figure 32D:
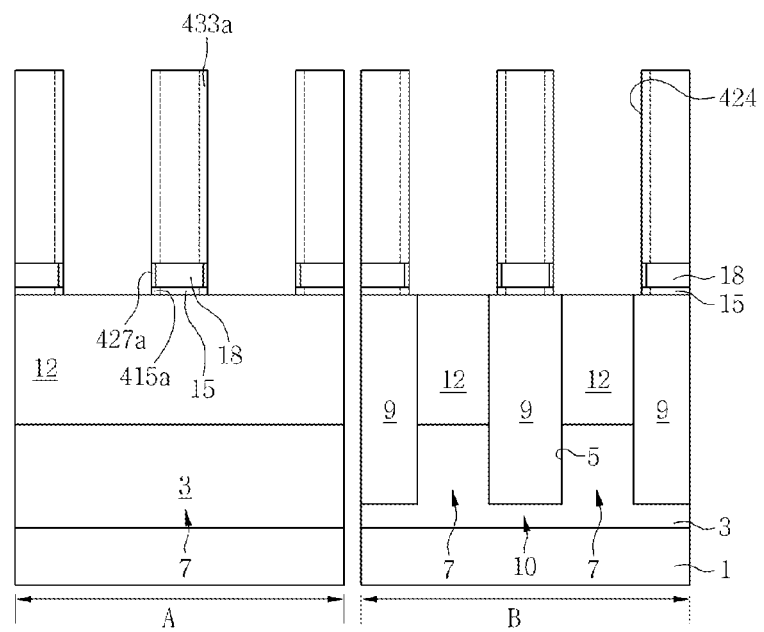

Referring to FIGS. 1 and 32D, the doped insulating region 415 of the first insulating layer 15 exposed by the hole 424 may be etched to expose the active region 7. During the etching of the doped insulating region 415, the oxide region 427a may remain on side surfaces of the second insulating layer 18 exposed by the hole 424. Also, during the etching of the doped insulating region 415 of the first insulating layer 15, an upper region of the upper insulating layer 21 may be partially etched, and a doped barrier region 433a of the upper insulating layer 21 adjacent or close to the hole 424 may remain. Meanwhile, a doped insulating region 415a of the first insulating layer 15 may remain under the oxide region 427a.

Figure 32E:
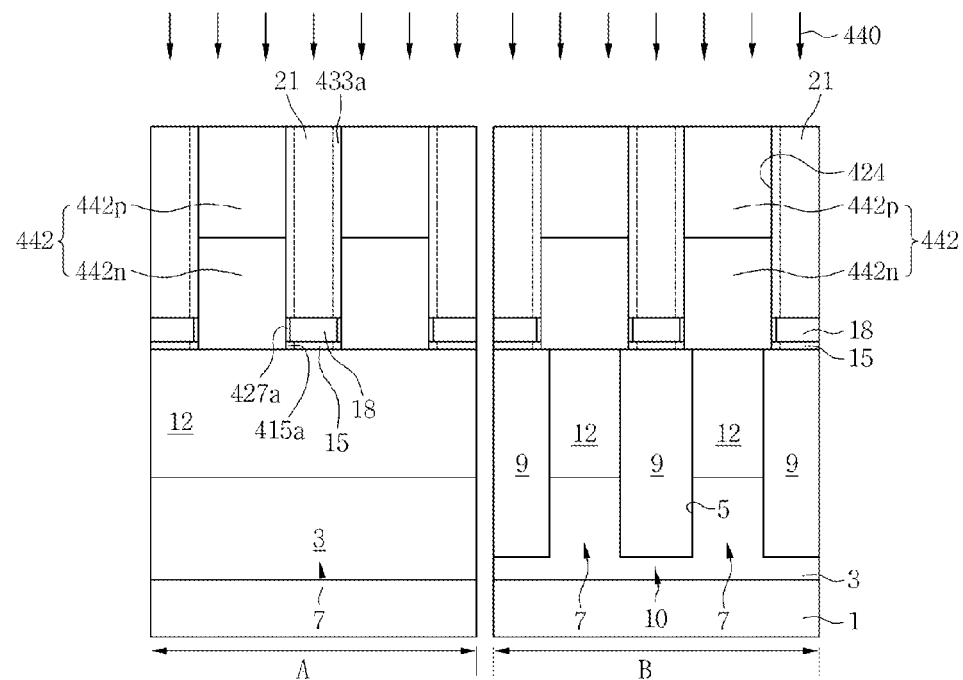

Referring to FIGS. 1 and 32E, a semiconductor pattern 442 may be formed within the hole 424. Thereafter, as described with reference to FIG. 26I, an ion implantation process 440 for implanting impurities into the semiconductor pattern 442 may be performed so that a first semiconductor region 442p may be formed in the semiconductor pattern 442. Also, a second semiconductor region 442n may be formed in the semiconductor pattern 442 disposed under the first semiconductor region 442p.

The doped barrier region 433a may be formed between the semiconductor pattern 442 and the upper insulating layer 21. The doped barrier region 433a may be formed between the upper insulating layer 21 formed of silicon oxide and the semiconductor pattern 442 in which impurities (e.g., B) are implanted into crystalline silicon. The doped barrier region 433a may cut off or prevent the diffusion of impurities (e.g., B) from the first semiconductor region 442p of the semiconductor pattern 442 into the upper insulating layer 21.

The oxide region 427a may be interposed between the semiconductor pattern 442 and the second insulating layer 18. The semiconductor pattern 442 formed of doped crystalline silicon may be spaced apart from the second insulating layer 18 formed of silicon nitride by the oxide region 427a. Accordingly, the oxide region 427a may prevent the second insulating layer 18 from directly contacting the semiconductor pattern 442, thereby preventing the second insulating layer 18 from degrading physical or electrical properties of the semiconductor pattern 442. For example, the oxide region 427a may prevent charges of the semiconductor pattern 442 from being directly trapped in the second insulating layer 18.

Next, another modified example of the method of fabricating a semiconductor device according to the example embodiments will be described with reference to FIGS. 33A through 33D.

Figure 33A:
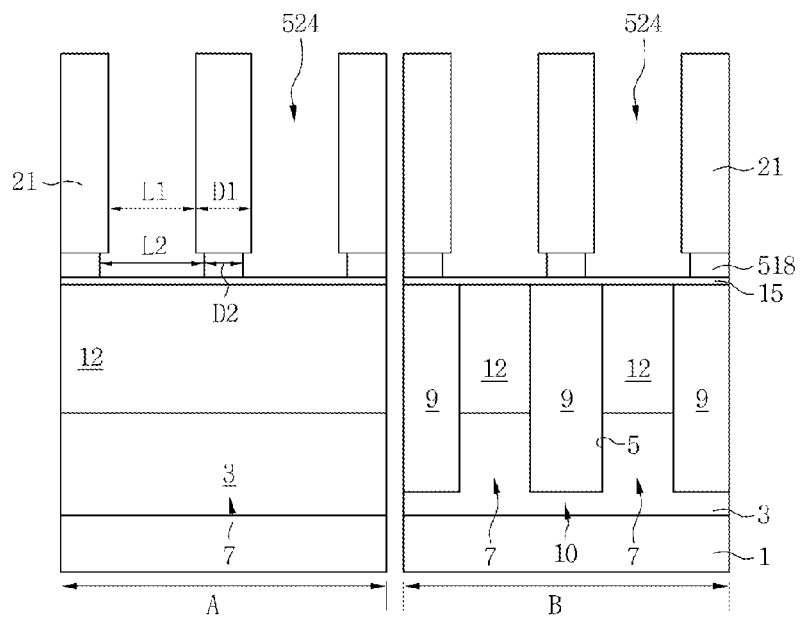
FIGS. 33A through 33D are cross-sectional views illustrating a method of fabricating a semiconductor device according to another modified example of the example embodiments.

Referring to FIGS. 1 and 33A, as described with reference to FIG. 26A, a field region 10 defining an active region 7 may be formed in a semiconductor substrate 1, and a first insulating layer 15, a second insulating layer 518, and an upper insulating layer 21 may be sequentially stacked on the semiconductor substrate 1 having the active region 7 and the field region 10.

A hole 524 may sequentially penetrate the upper insulating layer 21 and the second insulating layer 518 and expose the first insulating layer 15. The second insulating layer 518 may be selectively etched to increase a width of a region of the hole 524 in which the second insulating layer 518 is disposed. For instance, a portion of the hole 524, which may penetrate the upper insulating layer 21, may have a first width L1, while a portion of the hole 524, which may penetrate the second insulating layer 518, may have a second width L2 greater than the first width L1.

Meanwhile, a plurality of holes 524 may be formed. A width D2 of the second insulating layer 518 interposed between first and second holes 524 disposed close to each other may be less than a width D1 of the upper insulating layer 21 interposed between the first and second holes 524.

Figure 33B:
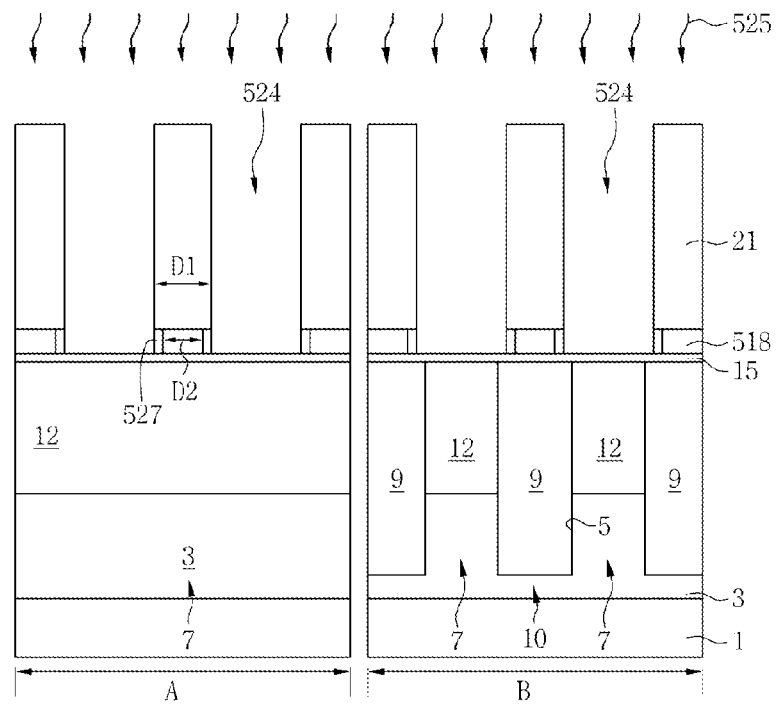

Referring to FIGS. 1 and 33B, an oxidation process 525 may be performed so that an oxide region 527 may be formed on side surfaces of the second insulating layer 518, which is exposed by the hole 525 and has a reduced width. The oxide region 527 may be formed under the upper insulating layer 21 having a greater width than the second insulating layer 518.

Because a method of forming the oxide region 527 is substantially the same as a method of forming the oxide region 427 described with reference to FIG. 32B, a detailed description thereof will be omitted.

Figure 33C:
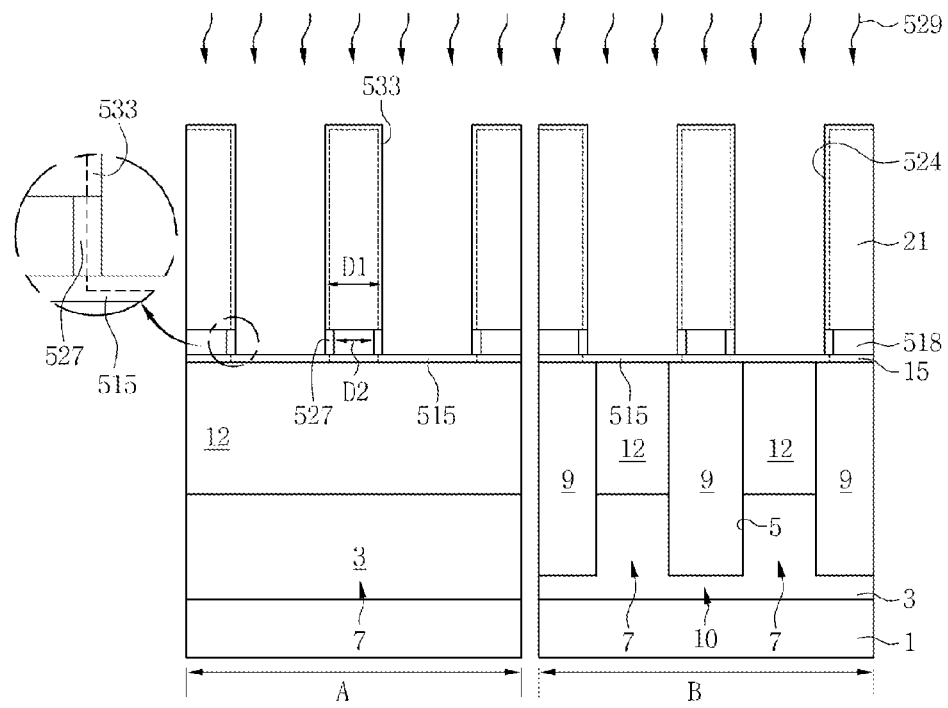

Referring to FIGS. 1 and 33C, similarly to that shown in FIG. 32C, an ion implantation process 529 may be performed on the substrate 1 having the oxide region 527. Thus, a doped barrier region 533 may be formed in an exposed region of the upper insulating layer 21, the oxide region 527 may be doped to form a doped oxide region 527a, and the first insulating layer 15 exposed by the hole 524 may be doped to form a doped insulating region 515. As described with reference to FIG. 32C, the doped barrier region 533 may be formed by doping at least one of N, C, Cl, F, Ar or Xe into the upper insulating layer 21, and the doped oxide region 527a may be formed by doping at least one of N, C, Cl, F, Ar or Xe into the oxide region 527. Also, the doped insulating region 515 may be formed by doping at least one of N, C, Cl, F, Ar or Xe into the first insulating layer 15.

Figure 33D:
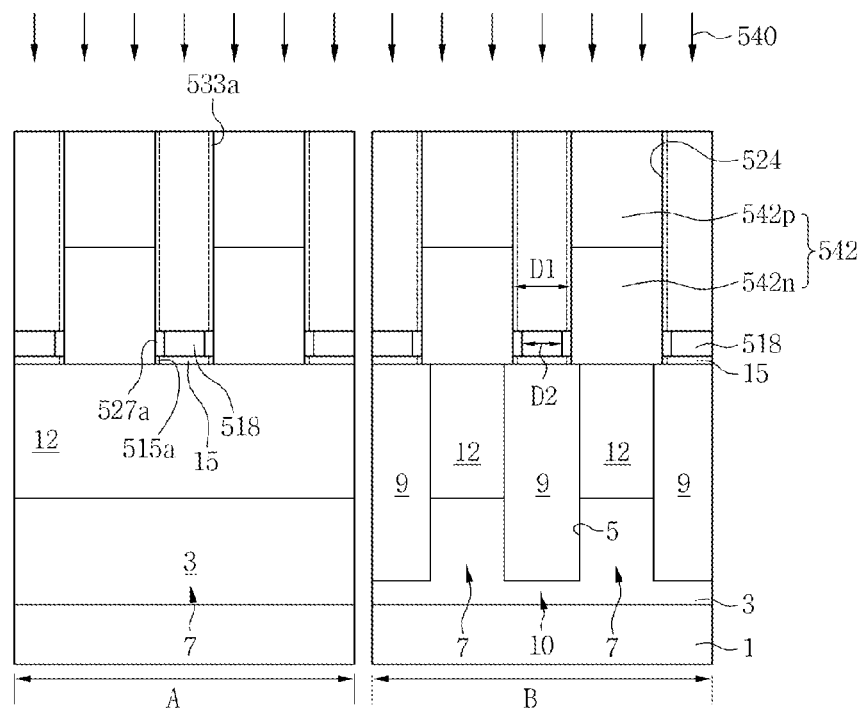

Referring to FIGS. 1 and 33D, the doped insulating region 515 of the first insulating layer 15 exposed by the hole 524 may be etched to expose the active region 7. During the etching of the doped insulating region 515, the doped insulating region 527a may remain on side surfaces of the second insulating layer 518, which is exposed by the hole 524, and under the upper insulating layer 21. Also, during the etching of the doped insulating region 515 of the first insulating layer 15, an upper region of the upper insulating layer 21 may be partially etched, and a doped barrier region 533a of the upper insulating layer 21 adjacent or close to the hole 524 may remain. Meanwhile, the doped insulating region 515a of the first insulating layer 15 may remain under the oxide region 427a.

A semiconductor pattern 542 may be formed within the hole 524. Thereafter, as described with reference to FIG. 26I, an ion implantation process 540 for implanting impurities into the semiconductor pattern 542 so that a first semiconductor region 542p may be formed in the semiconductor pattern 542. Also, a second semiconductor region 542n may be formed in the semiconductor pattern 542 disposed under the first semiconductor region 542p.

The doped barrier region 533a may be formed between the semiconductor pattern 542 and the upper insulating layer 21. The doped barrier region 533a may cut off the diffusion of impurities, such as boron (B), from the first semiconductor region 542p of the semiconductor pattern 542 into the upper insulating layer 21.

The doped oxide region 527a may be interposed between the semiconductor pattern 542 and the second insulating layer 18. Also, since the doped oxide region 527a is formed on side surfaces of the second insulating layer 518 having a smaller width than the upper insulating layer 21, the doped oxide region 527a may be in contact with a bottom surface of the upper insulating layer 21 and protect the doped insulating region 515 of the first insulating layer 15 from an etching process. Here, the etching of the doped insulating layer 515 of the first insulating layer 15 may be performed using an anisotropic etching process.

Next, another modified example of the method of fabricating a semiconductor device according to the example embodiments will be described with reference to FIGS. 34A through 34C.

Figure 34A:
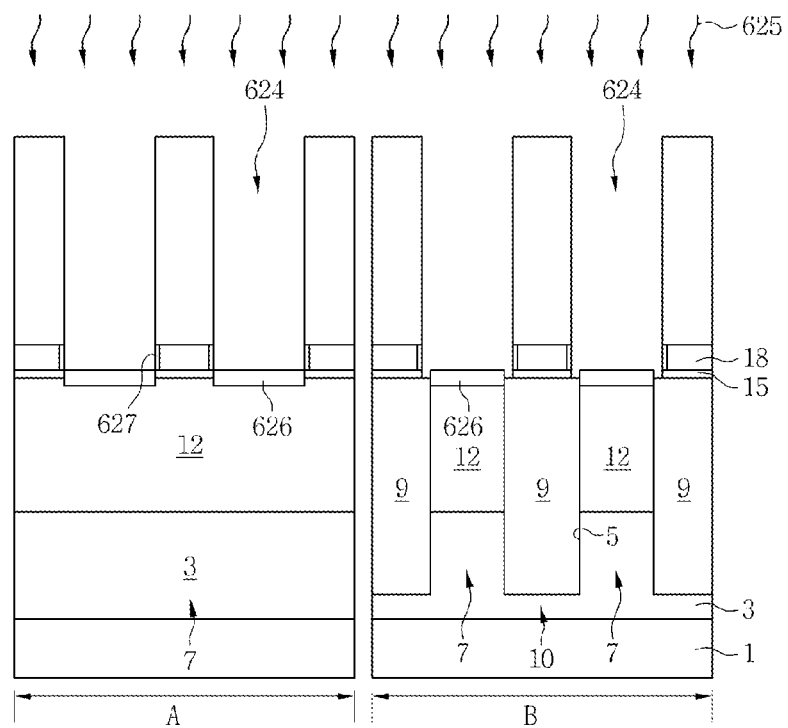
FIGS. 34A through 34C are cross-sectional views illustrating a method of fabricating a semiconductor device according to another modified example of the example embodiments.

Referring to FIGS. 1 and 34A, as described with reference to FIG. 26A, a field region 10 defining an active region 7 may be formed in a semiconductor substrate 1, and a first insulating layer 15, a second insulating layer 18, and an upper insulating layer 21 may be sequentially stacked on the semiconductor substrate 1 having the active region 7 and the field region 10.

A hole 624 may sequentially penetrate the upper insulating layer 21, the second insulating layer 18, and the first insulating layer 15 and expose the active region 7. Side surfaces of the second insulating layer 18 may be exposed by the hole 624.

The side surfaces of the second insulating layer 18, which are exposed by the hole 624, may be oxidized using an oxidation process 625, thereby forming an oxide region 627, and forming a buffer oxide 626 on the surface of the active region 7 exposed by the hole 624.

The oxidation process 625 may include oxidizing the side surfaces of the second insulating layer 18 exposed by the hole 624 using oxygen radicals generated in a process chamber capable of changing oxygen gas into oxygen radicals using heat and/or plasma to form the oxide region 627, and oxidizing the active region 7 exposed by the hole 624 to form a buffer oxide 626.

Figure 34B:
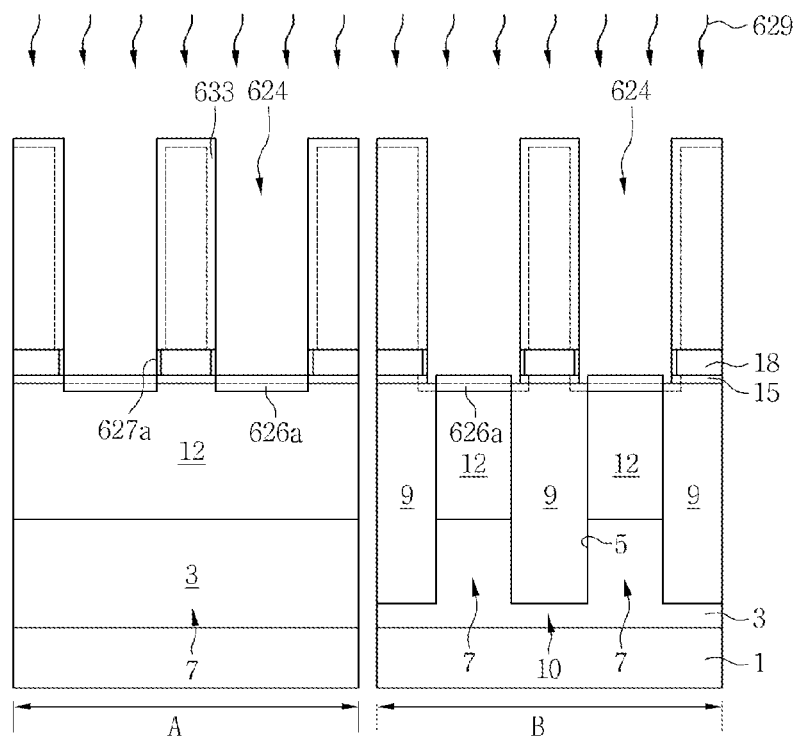

Referring to FIGS. 1 and 34B, similarly to that shown in FIG. 32C, an ion implantation process 629 may be performed on the substrate 1 having the oxide region 627 and the buffer oxide 626. Thus, a doped barrier region 633 may be formed in an exposed region of the upper insulating layer 21, the oxide region 627 may be doped to form a doped oxide region 627a, and the buffer oxide 626 may be doped to form a doped buffer oxide 626a.

As described with reference to FIG. 32C, the doped barrier region 633 may be formed by doping at least one of N, C, Cl, F, Ar or Xe into the upper insulating layer 21, and the doped oxide region 627a may be formed by doping at least one of N, C, Cl, F, Ar or Xe into the oxide region 627. Also, the doped buffer oxide 626a may be formed by doping at least one of N, C, Cl, F, Ar or Xe into the buffer oxide 626.

Figure 34C:
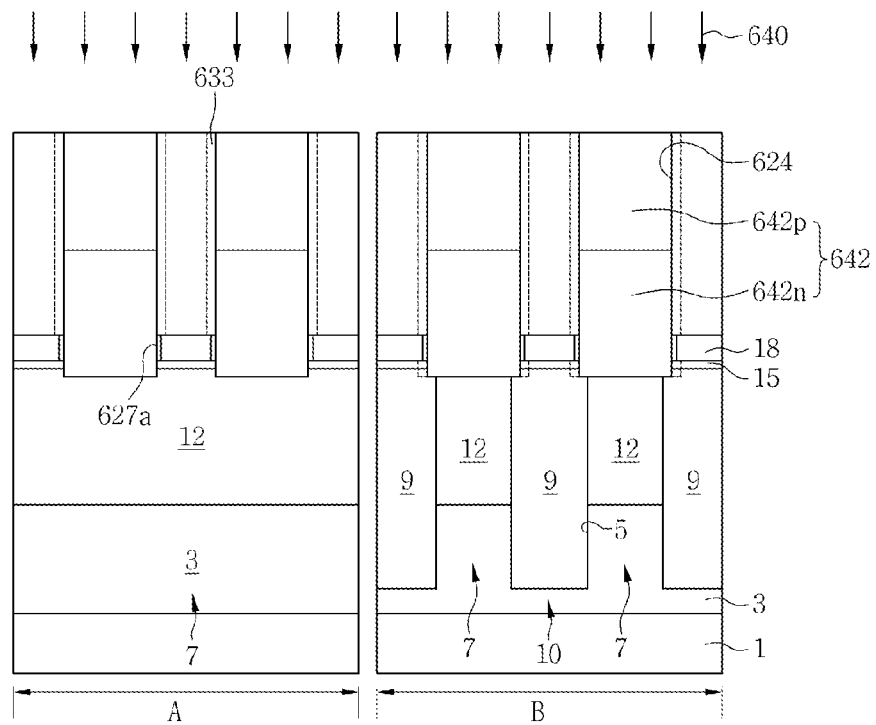

Referring to FIGS. 1 and 34C, the doped buffer oxide 626a may be removed using an etching process to expose the active region 7. The removal of the doped buffer oxide 626a may be performed using an anisotropic etching process.

Thereafter, a semiconductor pattern 642 may be formed within the hole 624. Thereafter, as described with reference to FIG. 26I, an ion implantation process 640 for implanting impurities into the semiconductor pattern 642 may be performed so that a first semiconductor region 642p may be formed in an upper region of the semiconductor pattern 642. Also, a second semiconductor region 642n may be formed in a lower region of the semiconductor pattern 642 disposed under the first semiconductor region 642p.

Next, another modified example of the method of fabricating a semiconductor device according to the example embodiments will be described with reference to FIGS. 35A through 35D.

Figure 35A:
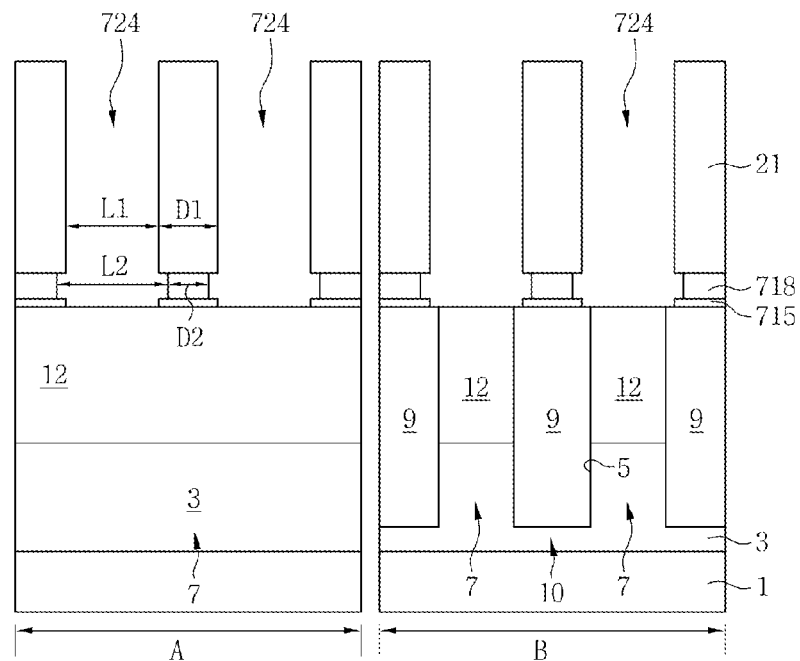
FIGS. 35A through 35D are cross-sectional views illustrating a method of fabricating a semiconductor device according to another modified example of the example embodiments.

Referring to FIGS. 1 and 35A, as described with reference to FIG. 26A, a field region 10 defining an active region 7 may be formed in a semiconductor substrate 1, and a first insulating layer 715, a second insulating layer 718, and an upper insulating layer 21 may be sequentially stacked on the semiconductor substrate 1 having the active region 7 and the field region 10.

A hole 724 may sequentially penetrate the upper insulating layer 21, the second insulating layer 718, and the first insulating layer 715 to expose the active region 7. The second insulating layer 718 may be selectively etched to increase a width of a region of the hole 724 where the second insulating layer 718 is disposed. For example, a portion of the hole 724, which may penetrate the upper insulating layer 21, may have a first width L1, while a portion of the hole 724, which may penetrate the second insulating layer 718, may have a second width L2 greater than the first width L1.

Meanwhile, a plurality of holes 724 may be formed. A width D2 of the second insulating layer 718 disposed between adjacent holes 724 may be less than a width D1 of the upper insulating layer 21 disposed between adjacent holes 724.

Figure 35B:
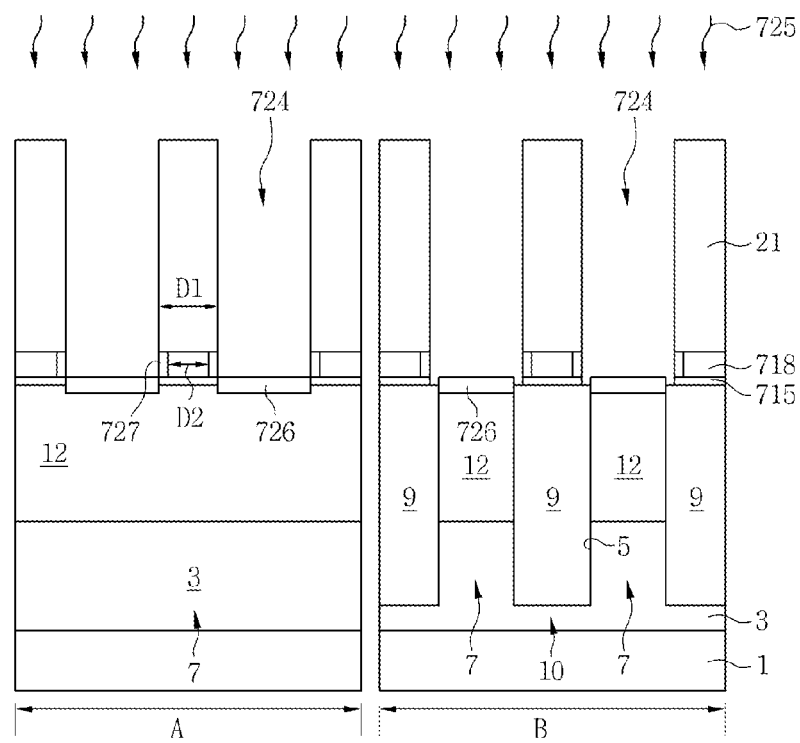

Referring to FIGS. 1 and 35B, as described with reference to FIG. 34A, side surfaces of the second insulating layer 718 exposed by the hole 724 may be oxidized using an oxidation process 725, thereby forming an oxide region 727 and forming a buffer oxide 726 on a surface of the active region 7 exposed by the hole 724. Since the oxide region 727 is formed on the side surfaces of the second insulating layer 718, which may have a reduced width, the oxide region 727 may be in contact with a bottom surface of the upper insulating layer 21 and may occupy a vacant space formed by reducing the width of the second insulating layer 718.

Figure 35C:
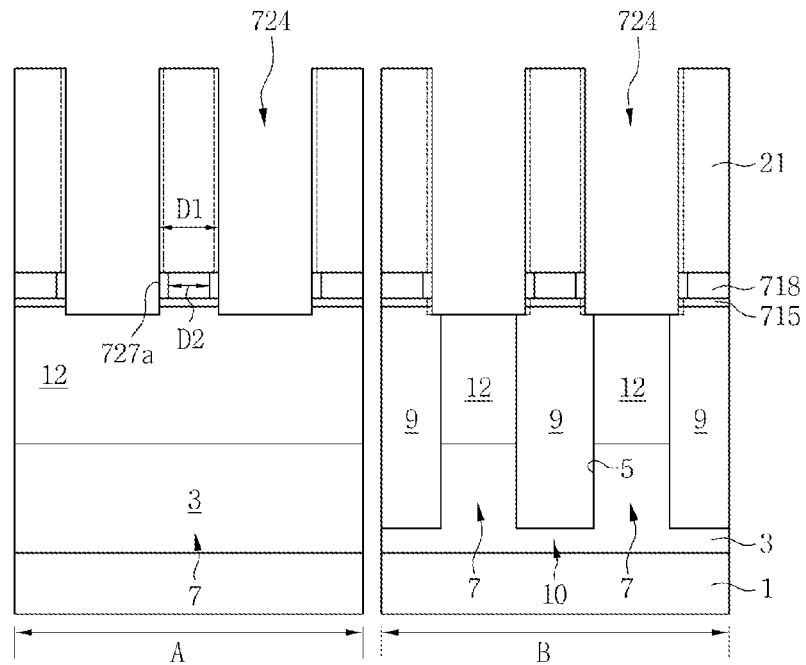

Referring to FIGS. 1 and 35C, similarly to that shown in FIG. 32C, an ion implantation process for implanting at least one of N, C, Cl, F, Ar or Xe into the substrate 1 having the oxide region 727 and the buffer oxide 726. Thus, a doped barrier region 733 may be formed in the exposed region of the upper insulating layer 21, the oxide region 727 may be doped to form a doped oxide region 727a, and the buffer oxide 726 may be doped to form a doped buffer oxide 726a.

The doped buffer oxide 726a may be removed using an etching process to expose the active region 7. The removal of the doped buffer oxide 726a may be performed using an anisotropic etching process.

Figure 35D:
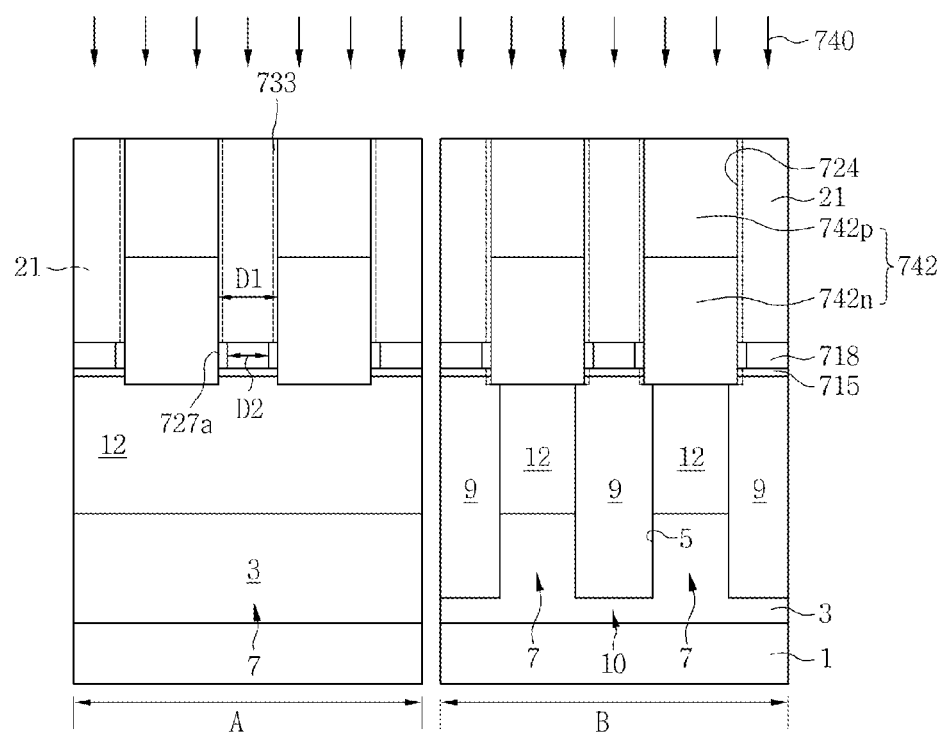

Referring to FIGS. 1 and 35D, a semiconductor pattern 742 may be formed within the hole 724. Thereafter, as described with reference to FIG. 26I, an ion implantation process 740 for implanting impurities into the semiconductor pattern 742 may be performed so that a first semiconductor region 742*p* may be formed in an upper region of the semiconductor pattern 742. Also, a second semiconductor region 742*n* may be formed in a lower region of the first semiconductor region 742*p*.

Next, another modified example of the method of fabricating a semiconductor device according to the example embodiments will be described with reference to FIGS. 36A through 36D.

Figure 36A:
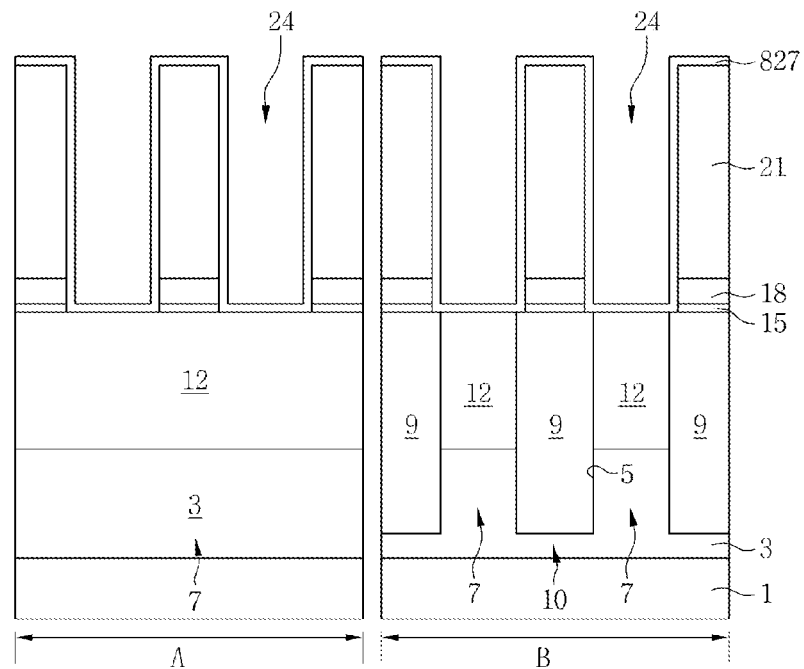
FIGS. 36A through 36D are cross-sectional views illustrating a method of fabricating a semiconductor device according to another modified example of the example embodiments.

Referring to FIGS. 1 and 36A, as described with reference to FIG. 26A, a field region 10 defining an active region 7 may be formed in a semiconductor substrate 1, and a first insulating layer 15, a second insulating layer 18, and an upper insulating layer 21 may be sequentially stacked on the semiconductor substrate 1 having the active region 7 and the field region 10.

A hole 24 may sequentially penetrate the upper insulating layer 21, the second insulating layer 18, and the first insulating layer 15 and expose the active region 7. Alternatively, the hole 24 may sequentially penetrate the upper insulating layer 21 and the second insulating layer 18.

A dielectric layer 827 may be conformally formed on the substrate 1 having the hole 24. The dielectric layer 827 may include an insulating oxide, for example, silicon oxide. The dielectric layer 827 may be formed using a chemical vapor deposition (CVD) process or an atomic layer deposition (ALD) process.

Figure 36B:
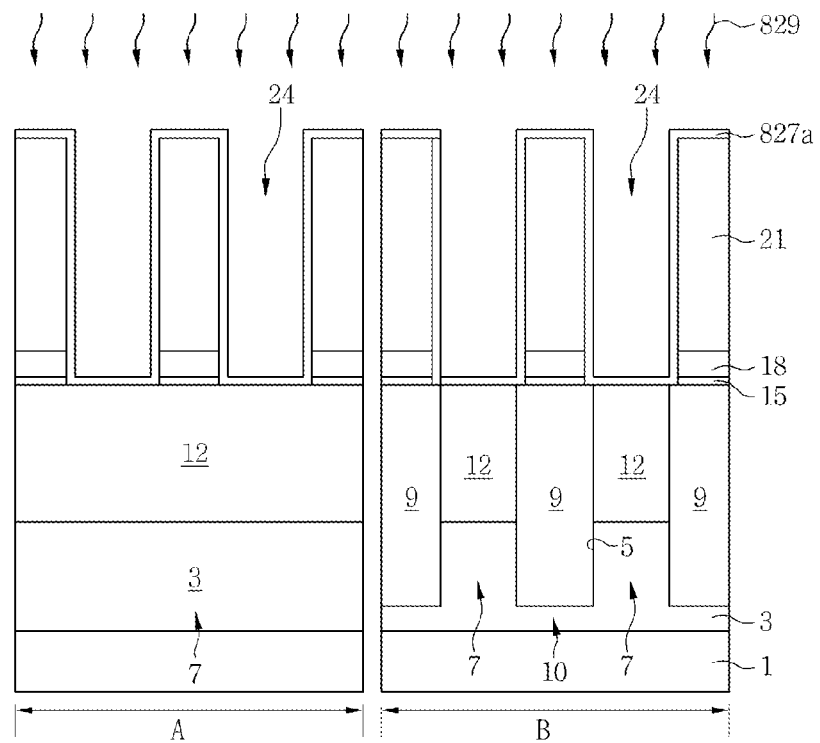

Referring to FIGS. 1 and 36B, similarly to that shown in FIG. 32C, an ion implantation process 829 may be performed in the substrate 1 having the dielectric layer 827 so that the dielectric layer 827 may be doped to form a doped dielectric layer 827*b*. As described with reference to FIG. 32C, the doped dielectric layer 827*b* may be formed by implanting at least one of N, C, Cl, F, Ar or Xe into the dielectric layer 827.

Figure 36C:
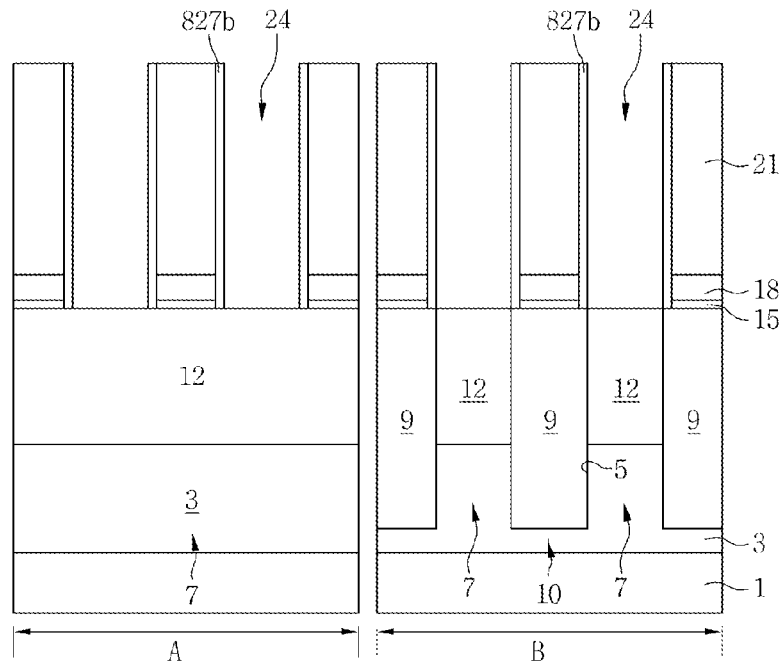

Referring to FIGS. 1 and 36C, the doped dielectric layer 827*b* may be etched so that the doped dielectric layer 827*b* may remain on sidewalls of the hole 24 to expose the active region 7. The etching of the doped dielectric layer 827*b* may be performed using anisotropic etching process. Accordingly, the doped dielectric layer 827*b* may be formed on the sidewalls of the hole 24 and cover sidewalls of the second insulating layer 18 and sidewalls of the upper insulating layer 21.

Figure 36D:
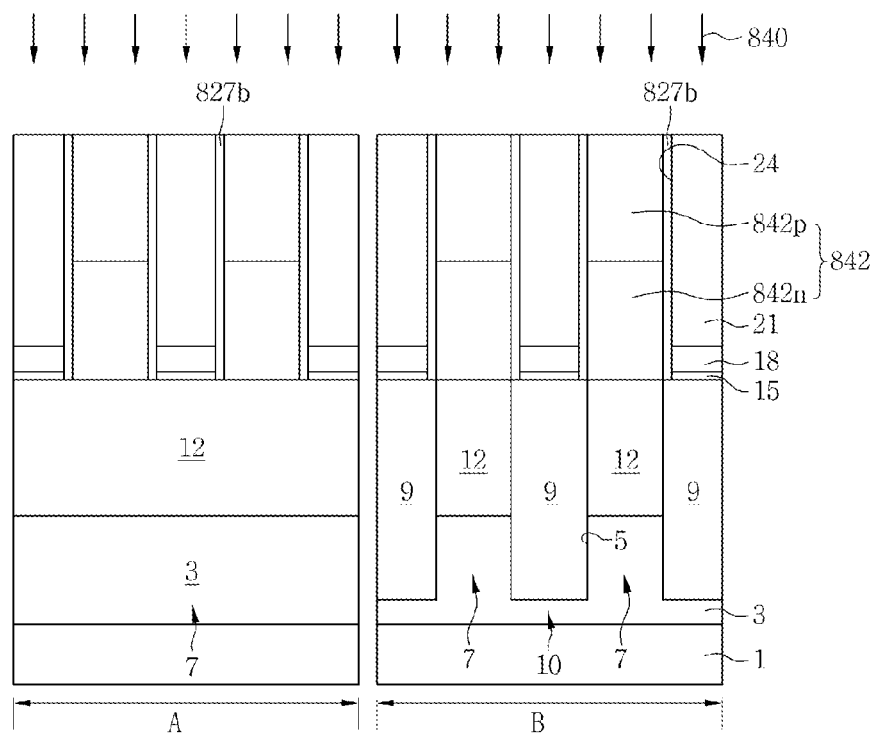

Referring to FIGS. 1 and 36D, a semiconductor pattern 842 may be formed within the hole 24. Thereafter, as described with reference to FIG. 26I, an ion implantation process for implanting impurities into the semiconductor pattern 842 may be performed so that a first semiconductor region 842*p* may be formed in an upper region of the semiconductor pattern 842. Also, a second semiconductor region 842*n* may be formed in a lower region of the semiconductor pattern 842 disposed under the first semiconductor region 842*p*.

Next, another modified example of the method of fabricating a semiconductor device according to the example embodiments will be described with reference to FIGS. 37A through 37I.

Figure 37A:
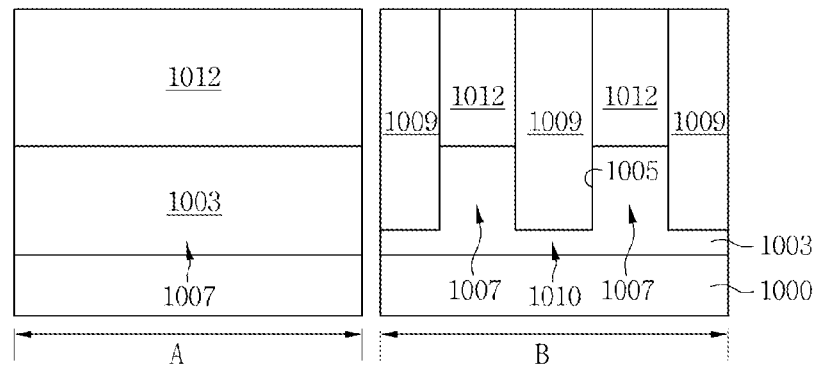
FIGS. 37A through 37I are cross-sectional views illustrating a method of fabricating a semiconductor device according to another modified example of the example embodiments.

Referring to FIGS. 1 and 37A, a well region 1003 may be provided in a semiconductor substrate 1000. The semiconductor substrate 1000 may be a silicon substrate.

A field region 1010 defining an active region 1007 may be formed in a semiconductor substrate 1000. The formation of the field region 1010 may include forming a trench 1005 in the semiconductor substrate 1000, and forming a isolation pattern 1008 to fill the trench 1005. The isolation pattern 1009 may be formed of an insulating material, such as silicon oxide (e.g., an HDP oxide). The active region 1007 may have a line shape parallel to a first direction X.

Impurities may be implanted into the active region 1007 to form a lower impurity region 1012. The lower impurity region 1012 may have a different conductivity type from the well region 1003. For instance, the well region 1003 may be a P type, while, the lower impurity region 1012 may be an N type.

Figure 37B:
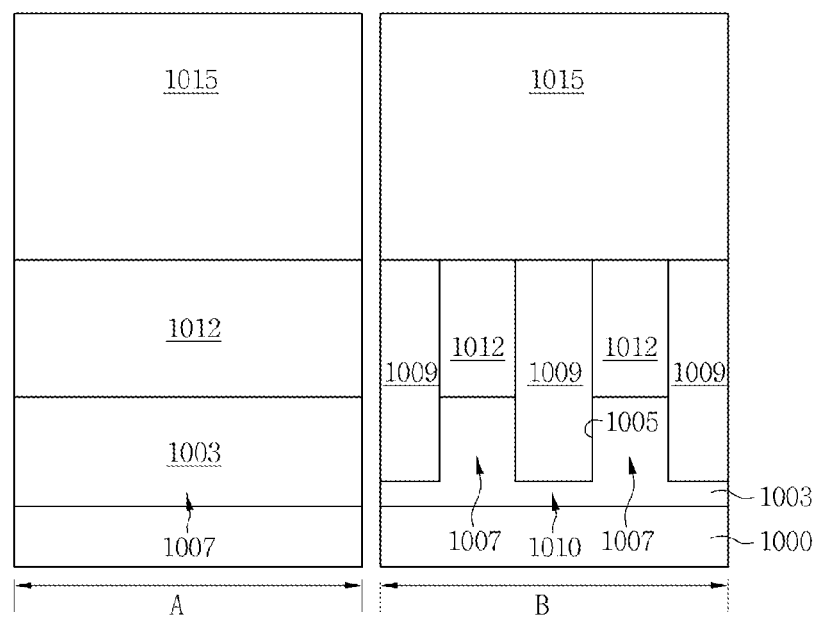

Referring to FIGS. 1 and 37B, a semiconductor layer 1015 may be formed on the semiconductor substrate 1000 having the active region 7. The semiconductor layer 1015 may be formed of crystalline silicon. For example, the semiconductor layer 1015 may include single-crystalline silicon grown from the active region 1007 using a SEG process, but example embodiments are not limited thereto. For example, the formation of the semiconductor layer 1015 may include forming a noncrystalline silicon layer and crystallizing the noncrystalline silicon layer into a crystalline silicon layer using an annealing process. The crystalline silicon layer may be a poly-Si layer or a single crystalline silicon layer.

Figure 37C:
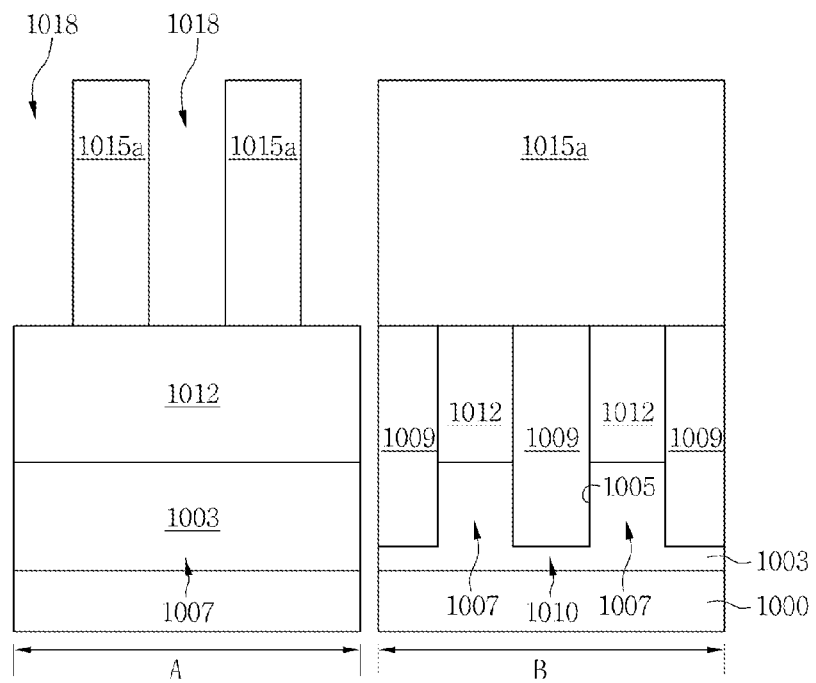

Referring to FIGS. 1 and 37C, the semiconductor layer 1015 may be patterned to form a semiconductor line 1015*a*. A plurality of semiconductor lines 1015*a* may be formed. A first opening 1018 may be formed between the plurality of semiconductor lines 1015*a* to expose the active region 1007.

The semiconductor line 1015*a* may have a line shape crossing the line-shaped active region 1007. For instance, the active region 1007 may have a line shape disposed in the same direction as the first direction X, or parallel to the first direction X. The semiconductor line 1015*a* may have a line shape disposed in the same direction as the second direction Y crossing the first direction X, or parallel to the second direction Y, but example embodiments are not limited thereto. For example, the semiconductor line 1015*a* may have a line shape disposed in the same direction as the first direction X, or parallel to the first direction X. Accordingly, in the following example embodiments, it will be understood that a semiconductor line has a line shape crossing a line-shaped active region, or overlaps the active region and has a line shape disposed in the same direction as the active region.

Figure 37D:
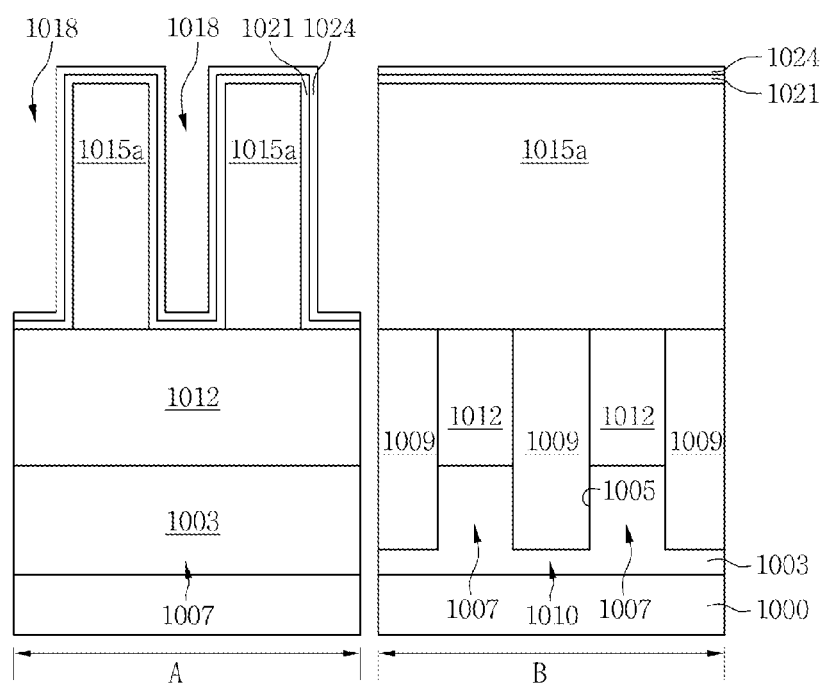

Referring to FIGS. 1 and 37D, a first layer 1021 and a second layer 1024 may be sequentially formed on the substrate 1000 having the semiconductor line 1015*a*. The first layer 1021 may be formed of an insulating material, such as silicon oxide. The first layer 1021 may be formed of silicon oxide obtained using a thermal oxidation process. The second layer 1024 may be formed of silicon nitride or a silicon-nitride-based material. For example, the second layer 1024 may be formed of a silicon-nitride-based material, for example, at least one of SiN, SiCN, SiBN, SiON, SiOCN, or SiBCN.

Figure 37E:
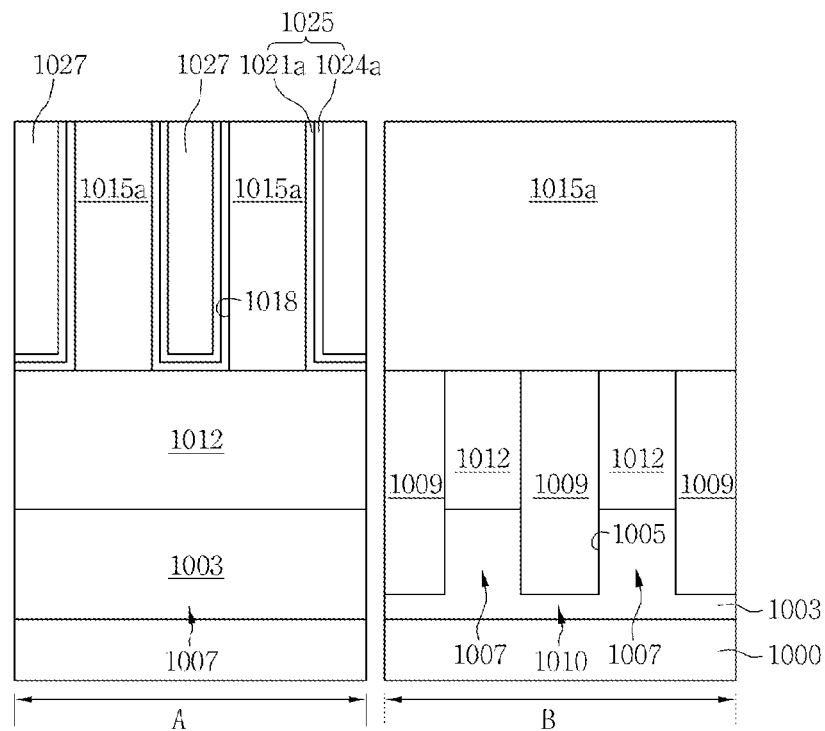

Referring to FIGS. 1 and 37E, a first insulating pattern 1027 may be formed to fill the first opening 1018. The formation of the first insulating pattern 1027 may include forming an insulating layer on the substrate 1000 having the first and second layers, and planarizing the insulating layer to define the insulating layer within the first opening 1018. Portions of the first and second layers disposed on the semiconductor line 1015*a* may be removed during the planarization of the insulating layer, thereby forming first and second dielectric materials 1021*a*, 1024*a* defined on sidewalls and bottom surface of the first opening 1018.

Figure 37F:
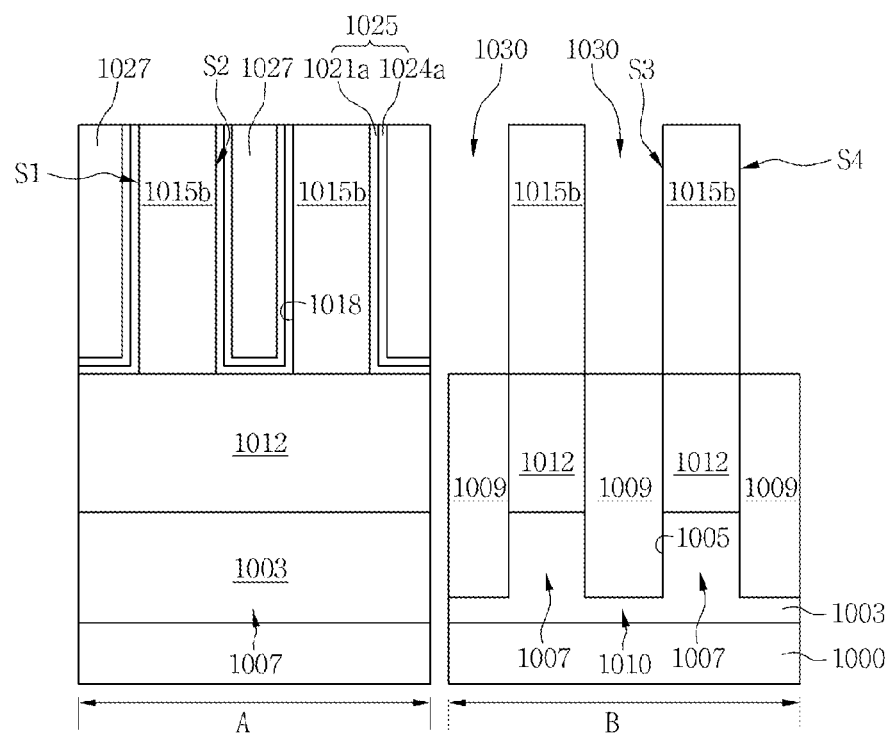

Referring to FIGS. 1 and 37F, the semiconductor line 1015*a* may be patterned to form a semiconductor pattern 1015*b*. A plurality of the semiconductor patterns 1015*b* may be formed. For example, a plurality of semiconductor patterns 1015*b* may be formed on each of active regions 1007. Second openings 1030 may be formed between the plurality of semiconductor patterns 1015b. The second openings 1030 may be formed to expose the isolation pattern 1009.

The semiconductor pattern 1015b may have first and second side surfaces S1 and S2 disposed opposite each other, and third and fourth side surfaces S3 and S4 disposed opposite each other. The first and second side surfaces S1 and S2 may be parallel to a second direction Y, while the third and fourth side surfaces S3 and S4 may be parallel to the first direction X. The first direction X may be a direction crossing the second direction Y.

A plurality of semiconductor patterns 1015b may be formed on each of active regions 1007. The plurality of semiconductor patterns 1015b disposed adjacent to one another on each of the active regions 1007 may have opposite side surfaces. The first and second side surfaces S1 and S2 may be opposite side surfaces of the plurality of semiconductor patterns 1015b disposed adjacent to one another on each of the active regions 1007.

A plurality of semiconductor patterns 1015b may be formed on the line-shaped active regions 1007 disposed adjacent to one another. First and second semiconductor patterns 1015b respectively formed on adjacent active regions 1007 may have opposite side surfaces. The third and fourth side surfaces S3 and S4 may be opposite side surfaces of the first and second semiconductor patterns 1015b respectively formed on the adjacent active regions 1007.

Figure 37G:
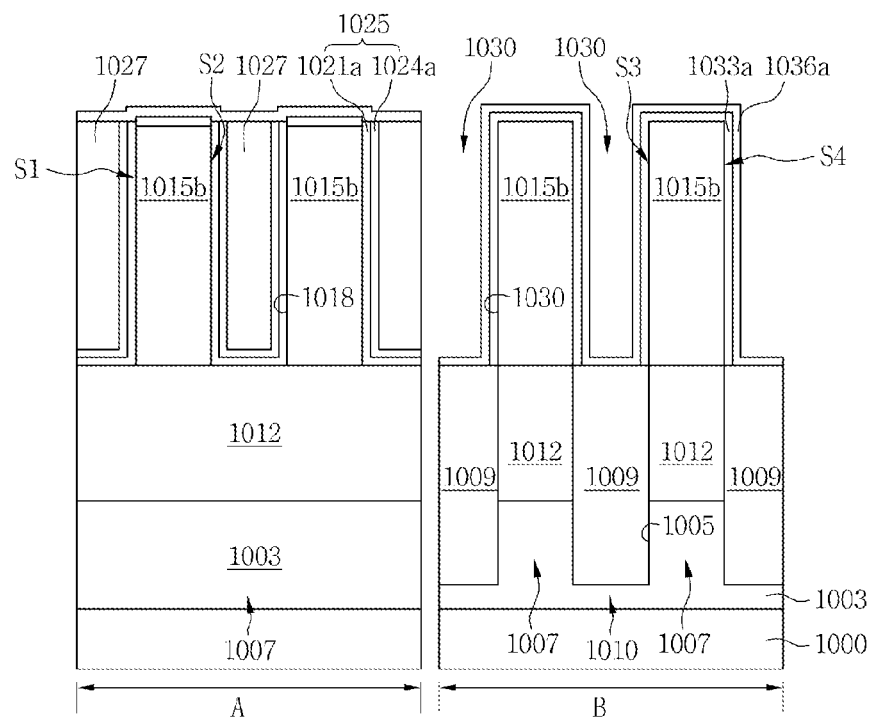

Referring to FIGS. 1 and 37G, a third layer 1033a and a fourth layer 1036a may be sequentially formed on the substrate 1000 having the semiconductor patterns 1015b. The third layer 1033a may be formed of oxide obtained using a thermal oxidation process (e.g., silicon oxide), while the fourth layer 1036a may be formed of silicon nitride or a silicon-nitride-based material. For instance, the fourth layer 1036a may be formed of a silicon-nitride-based material, for example, at least one of SiN, SiCN, SiBN, SiON, SiOCN, or SiBCN.

Figure 37H:
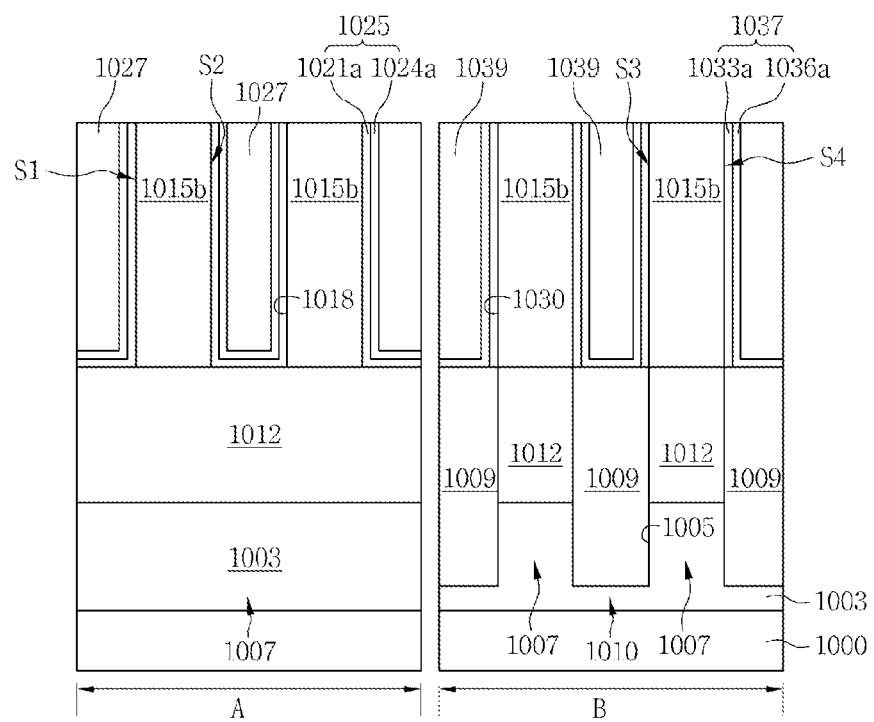

Referring to FIGS. 1 and 37H, a second insulating pattern 1039 may be formed to fill the second opening 1030. The formation of the second insulating pattern 1039 may include forming an insulating layer on the substrate 1000 having the third and fourth layers 1033a and 1036a, and planarizing the insulating layer to define the insulating layer within the second opening 1030.

Portions of the third and fourth layers 1033a and 1036a disposed on the semiconductor pattern 1015b may be removed during the formation of the second insulating pattern 1039, thereby forming third and fourth dielectric materials 1033b and 1036b defined on sidewalls and bottom surface of the second opening 1030.

The first and second dielectric materials 1021a and 1024a may be formed on the first and second side surfaces S1 and S2 of the semiconductor pattern 1015b, while the third and fourth dielectric materials 1033b and 1036b may be formed on the third and fourth side surfaces S3 and S4 of the semiconductor pattern 1015b.

A plurality of semiconductor patterns 1015b may be provided on each of active regions 1007. The plurality of semiconductor patterns 1015b disposed adjacent to one another on each of the active regions 1007 may have opposite side surfaces, that is, the first and second side surfaces S1 and S2.

The first and second dielectric materials 1021a and 1024a may be formed to cover the first and second side surfaces S1 and S2 of the semiconductor pattern 1015b and extend to cover the active region 1007 between the plurality of semiconductor patterns 1015b.

The third and fourth dielectric materials 1033b and 1036b may be formed to cover the third and fourth side surfaces S3 and S4 of the semiconductor pattern 1015b and extend to cover the isolation pattern 1009.

Figure 37I:
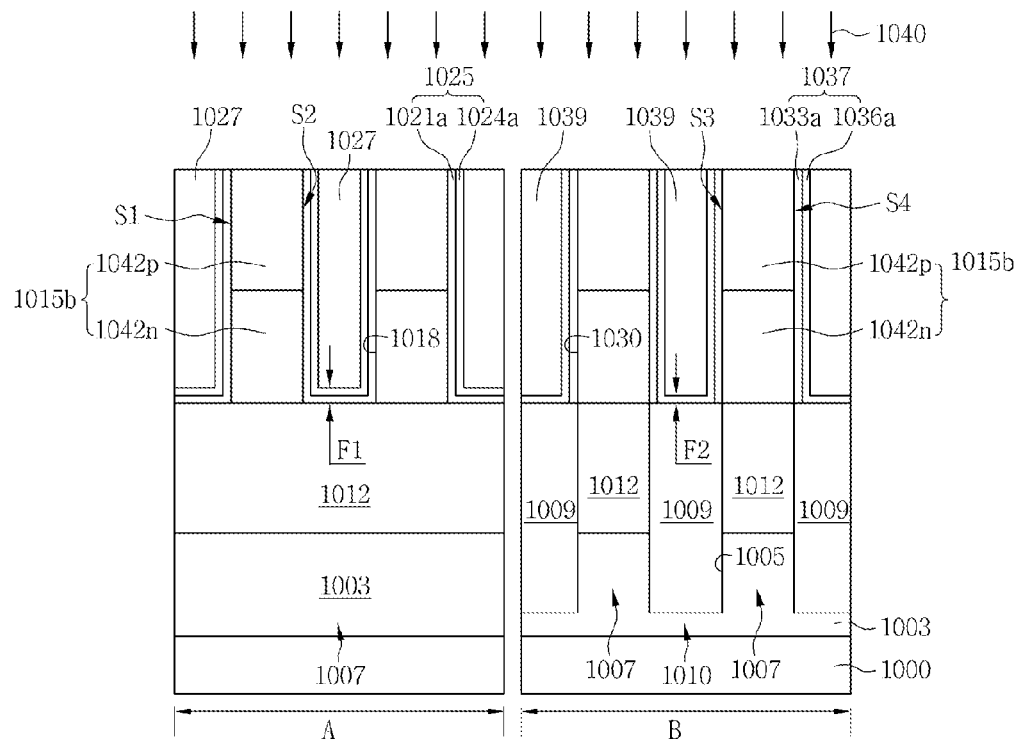

Referring to FIGS. 1 and 37I, as described with reference to FIG. 26I, an ion implantation process 1040 for implanting impurities into the semiconductor pattern 1015b may be performed so that a first semiconductor region 1042p can be formed in an upper region of the semiconductor pattern 1015b. Also, a second semiconductor region 1042n may be formed in a lower region of the semiconductor pattern 1015b disposed under the first semiconductor region 1042p.

Next, another modified example of the method of fabricating a semiconductor device according to the example embodiments will be described with reference to FIGS. 38A through 38E.

Figure 38A:
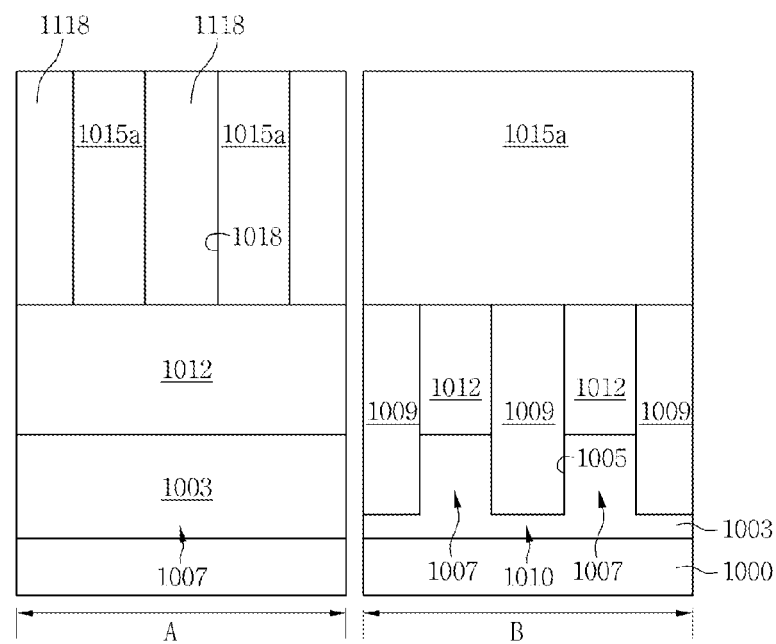
FIGS. 38A through 38E are cross-sectional views illustrating a method of fabricating a semiconductor device according to another modified example of the example embodiments.

Referring to FIGS. 1 and 38A, a semiconductor substrate 1000 may be provided as described with reference to FIG. 37A. For example, as shown in FIG. 37A, a field region 1010 defining an active region 1007 may be formed in a semiconductor substrate 1000 having a well region 1003. The formation of the field region 1010 may include forming a trench 1005 in the semiconductor substrate 1000, and forming a isolation pattern 1009 to fill the trench 1005. The isolation pattern 1009 may be formed of an insulating material, such as silicon oxide (e.g., an HDP oxide). The active region 1007 may have a line shape parallel to the first direction X. Impurities may be implanted into the active region 1007 to form a lower impurity region 1012.

Thereafter, a semiconductor layer may be formed as in FIG. 37B and patterned as in FIG. 37C, to form a semiconductor line 1015a. As described with reference to FIG. 37C, a plurality of semiconductor lines 1015a may be formed. A first opening 1018 may be formed between the plurality of semiconductor lines 1015a.

A sacrificial filling layer 1118 may be formed to fill the first opening 1018. The sacrificial filling layer 1118 may be formed of a material having an etch selectivity with respect to the isolation pattern 1009. For example, the sacrificial filling layer 1118 may be formed of a hydro-silsesquioxane (HSQ) material obtained using a spin-on process, or a C-containing insulating material obtained using a spin-on process.

Figure 38B:
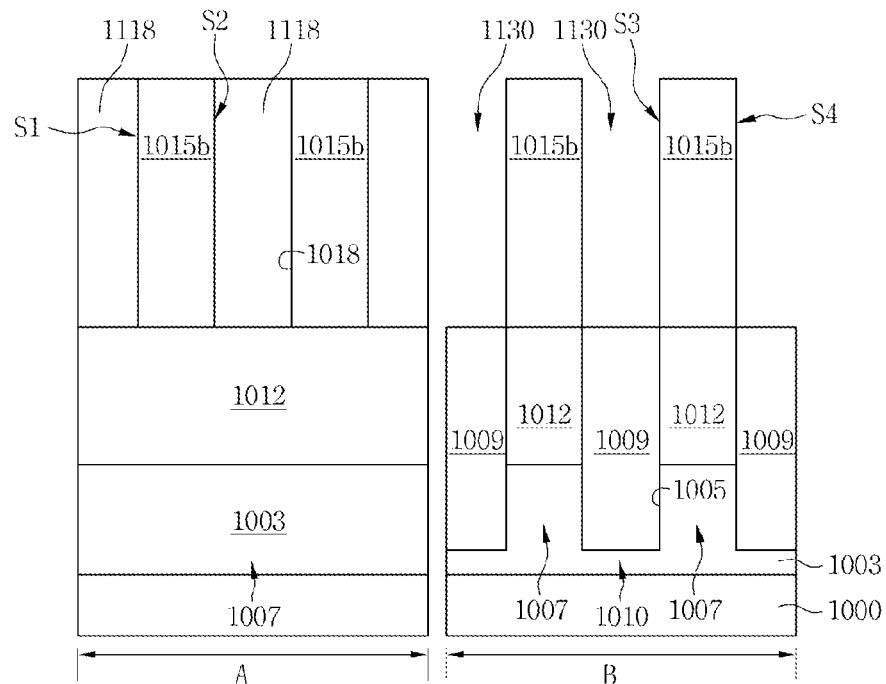

Referring to FIGS. 1 and 38B, similarly to that shown in FIG. 37F, the semiconductor line 1015a may be patterned to form a semiconductor pattern 1015b. A plurality of the semiconductor patterns 1015b may be formed. A second opening 1130 may be formed between the plurality of semiconductor patterns 1015b.

Figure 38C:
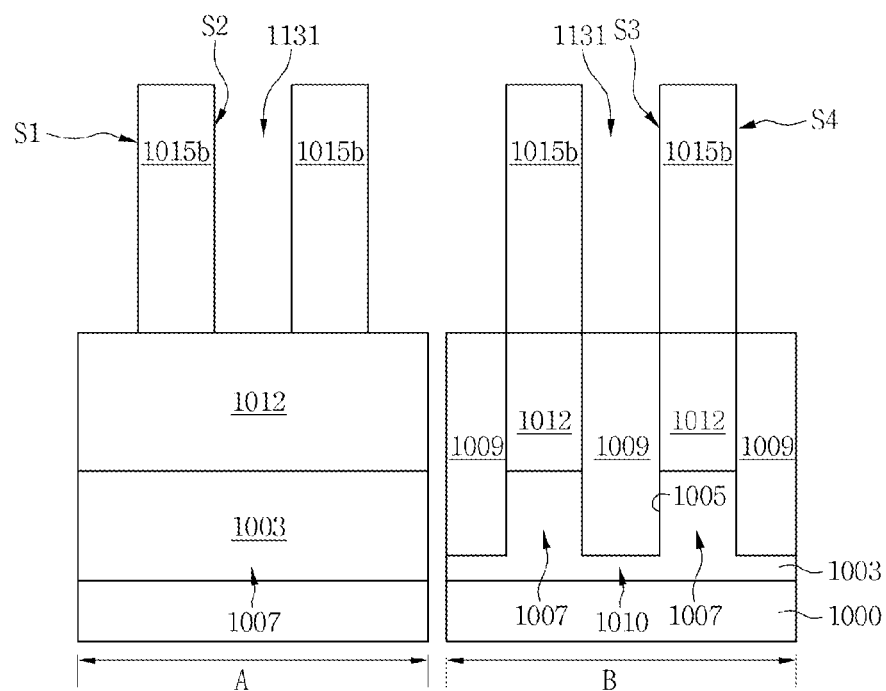

Referring to FIGS. 1 and 38C, the sacrificial filling layer (refer to 1118 of FIG. 38B) may be selectively removed. Accordingly, a vacant space 1131 may be formed between the plurality of semiconductor patterns 1015b. The side surfaces S1, S2, S3, and S4 of the plurality of semiconductor patterns 1015b and a surface of the active region 1007 interposed between the plurality of semiconductor patterns 1015b may be exposed by the vacant space 1131.

Figure 38D:
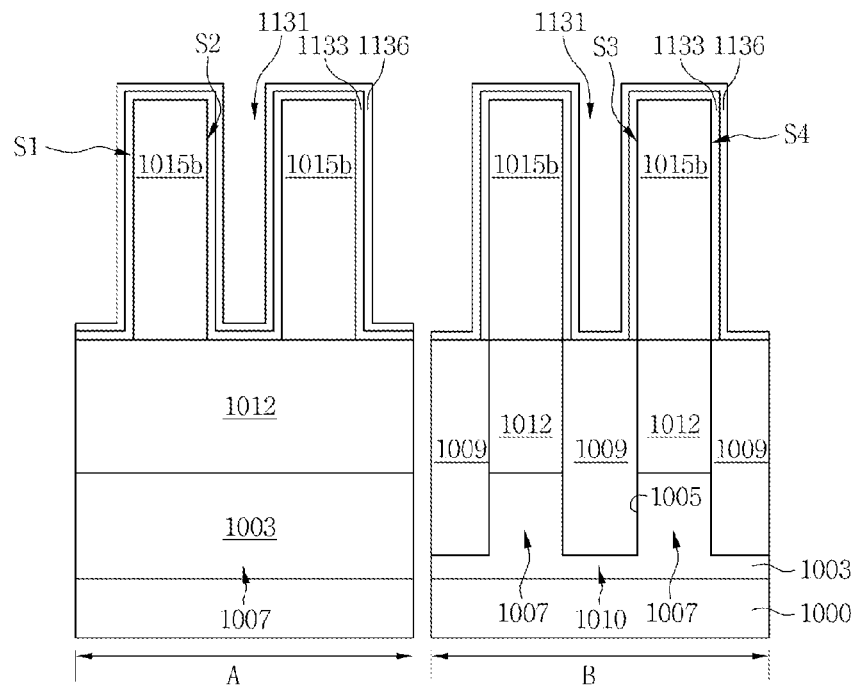

Referring to FIGS. 1 and 38D, a first layer 1133 and a second layer 1136 may be sequentially formed on the substrate 1000 having the semiconductor pattern 1015b. The first layer 1133 may be formed on an exposed portion of the semiconductor pattern 1015b and an exposed portion of the active region 1007, and the second layer 1136 may be conformally formed on the substrate 1000 having the first layer 1133.

The first layer 1133 may be formed of oxide obtained using a thermal oxidation process (e.g., silicon oxide), while the second layer 1136 may be formed of silicon nitride or a silicon-nitride-based material. For instance, the second layer 1136 may be formed of a silicon-nitride-based material, for example, at least one of SiN, SiCN, SiBN, SiON, SiOCN, or SiBCN.

Figure 38E:
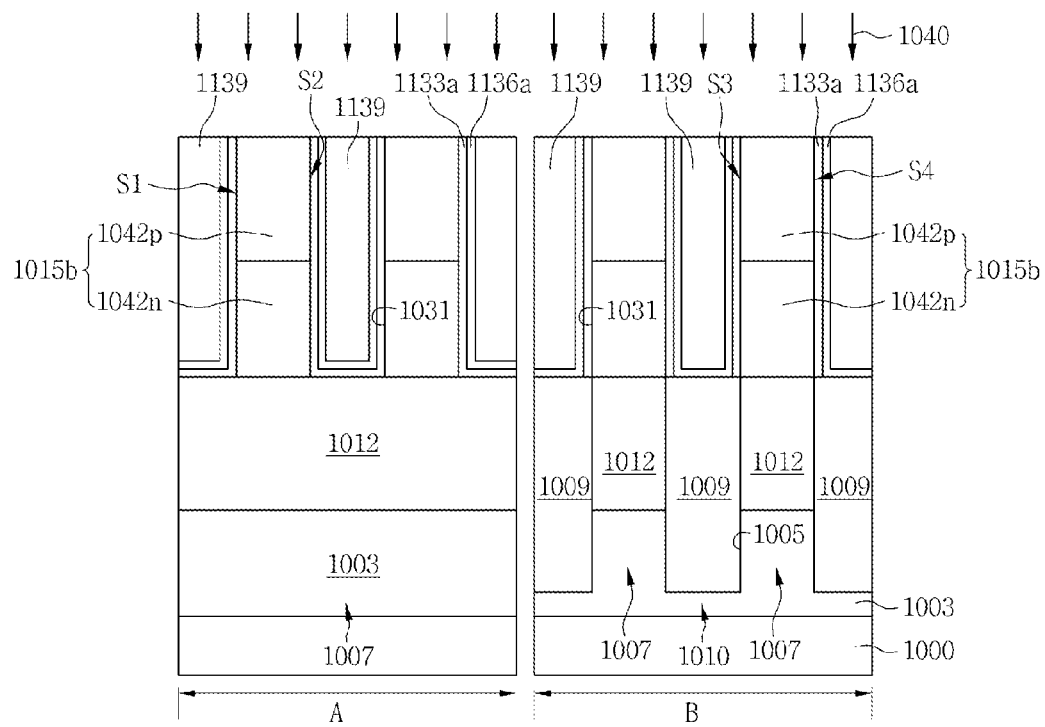

Referring to FIGS. 1 and 38E, an insulating layer may be formed on the substrate 1000 having the first and second layers 1133 and 1136 and planarized until the semiconductor pattern 1015b is exposed. As a result, an insulating pattern 1139 may be formed to fill the vacant space 1131. The first and second layers 1133 and 1136 may remain during the formation of the insulating pattern 1139 to form first and second dielectric materials 1133a and 1136a. Accordingly, the first dielectric material 1133a may surround side surfaces of the semiconductor pattern 1015b and extend onto the surface of the active region 1007. The second dielectric material 1136a may cover the first dielectric material 1133a and extend onto the isolation pattern 1009 disposed in the field region 1010.

Thereafter, as described with reference to FIG. 26I, an ion implantation process 1040 for implanting impurities into the semiconductor pattern 1015b may be performed so that a first semiconductor region 1042p can be formed in an upper region of the semiconductor pattern 1015b. Also, a second semiconductor region 1042n may be formed in a lower region of the semiconductor pattern 1015b disposed under the first semiconductor region 1042p.

Next, another modified example of the method of fabricating a semiconductor device according to the example embodiments will be described with reference to FIGS. 39A through 39E.

Figure 39A:
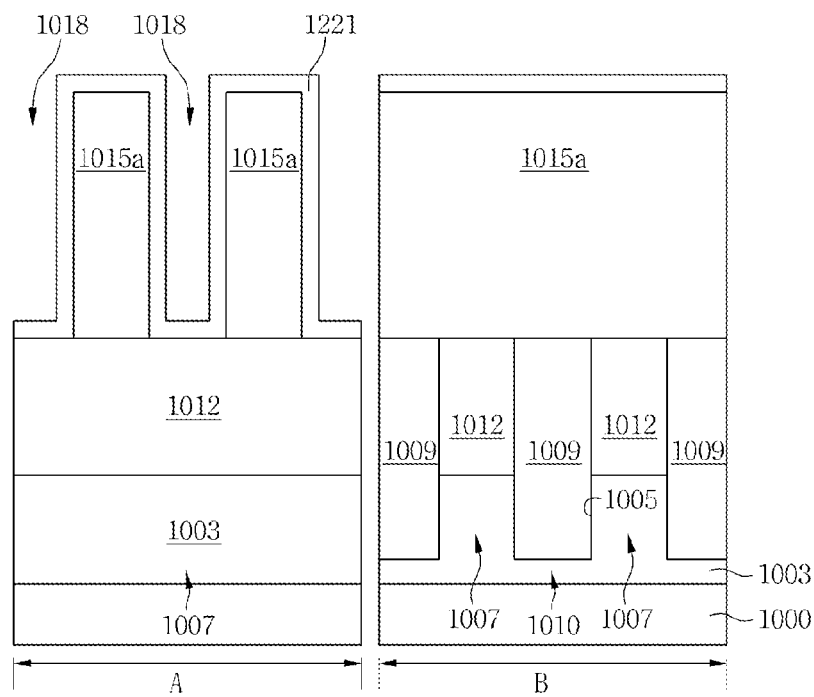
FIGS. 39A through 39E are cross-sectional views illustrating a method of fabricating a semiconductor device according to another modified example of the example embodiments.

Referring to FIGS. 1 and 39A, a semiconductor substrate 1000 may be provided as described with reference to FIG. 37A. For example, as shown in FIG. 37A, a field region 1010 defining an active region 1007 may be formed in a semiconductor substrate 1000 having a well region 1003. The formation of the field region 1010 may include forming a trench 1005 in the semiconductor substrate 1000, and forming a isolation pattern 1009 to fill the trench 1005. The isolation pattern 1009 may be formed of an insulating material, such as silicon oxide (e.g., an HDP oxide). The active region 1007 may have a line shape parallel to the first direction X. Impurities may be implanted into the active region 1007 to form a lower impurity region 1012.

Thereafter, a semiconductor layer may be formed as in FIG. 37B and patterned as in FIG. 37C, thereby forming a semiconductor line 1015a. As described with reference to FIG. 37C, a plurality of semiconductor lines 1015a may be formed. A first opening 1018 may be formed between the plurality of semiconductor lines 1015a.

A first dielectric layer 1221 may be formed on an exposed portion of the semiconductor line 1015a and an exposed portion of the active region 1007. The first dielectric layer 1221 may be formed of silicon oxide. The first dielectric layer 1221 may be formed of silicon oxide using a thermal oxidation process.

Figure 39B:
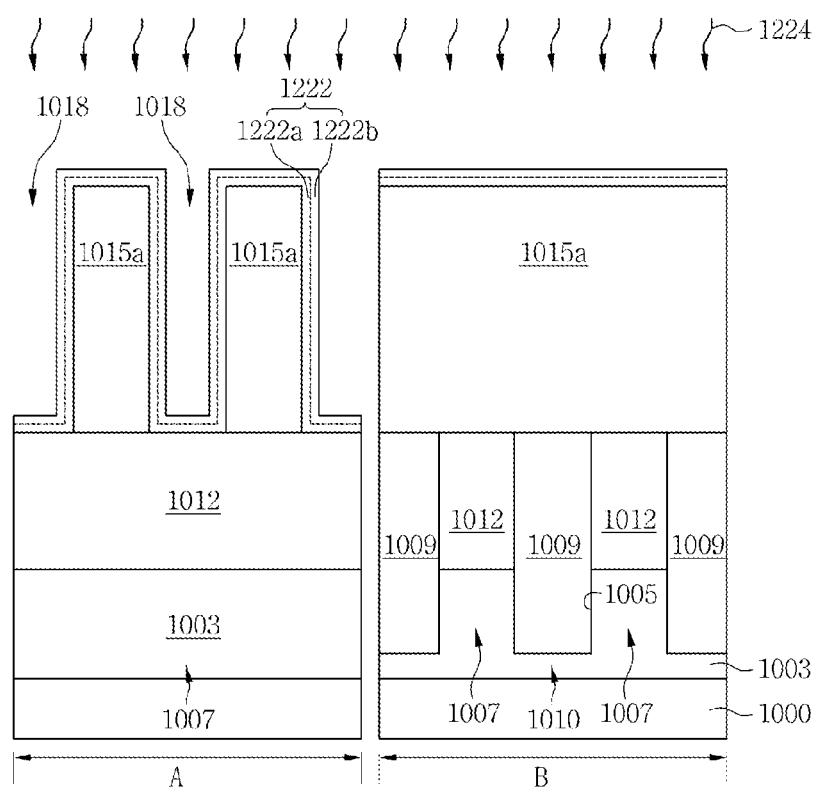

Referring to FIGS. 1 and 39B, an ion implantation process 1224 may be performed on the substrate 1000 having the first dielectric layer 1221 so that impurities may be implanted into the first dielectric layer 1221 to form a first doped dielectric material 1222. The implanted impurities may contain at least one element of N, C, Cl, F, Ar or Xe. Since the ion implantation process 1224 is substantially the same as the ion implantation process 429 described with reference to FIG. 32C, a detailed description thereof will be omitted.

The first doped dielectric material 1222 may be formed by implanting impurities to a portion of the first dielectric layer 1221 or the entire first dielectric layer 1221. For example, when impurities are implanted into the portion of the first dielectric layer 1221, the first doped dielectric material 1222 may include a first region 1222a and a second region 1222b. The first region 1222a of the first doped dielectric material 1222 may be a region formed of undoped silicon oxide, while the second region 1222b of the first doped dielectric material 1222 may be a region formed of a doped silicon oxide. The first region 1222a may be formed between the second region 1222b and the semiconductor line 1015a, and between the second region 1222b and the active region 1007.

Figure 39C:
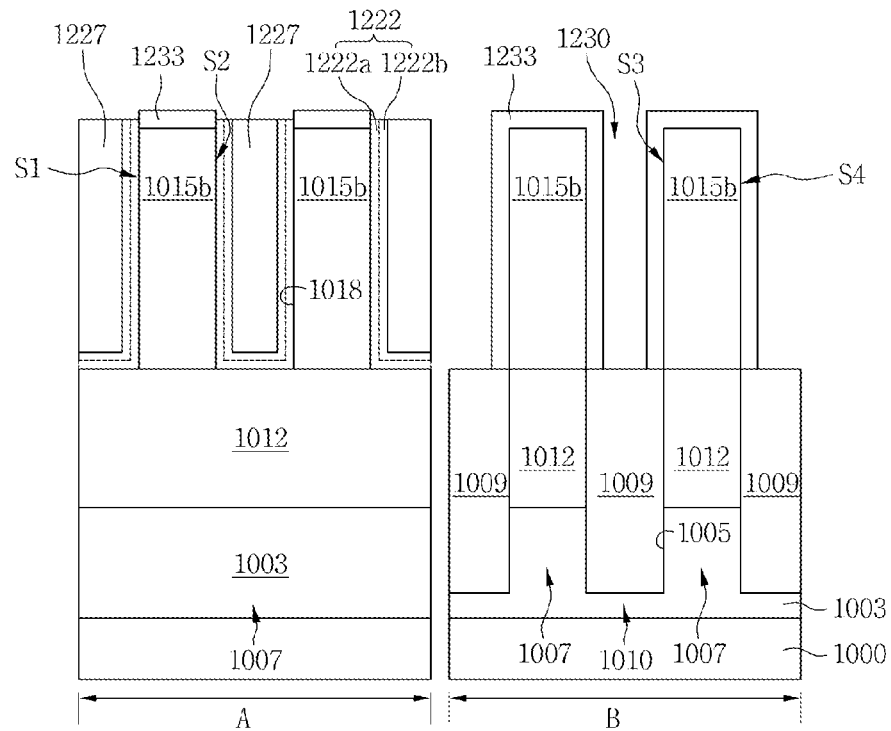

Referring to FIGS. 1 and 39C, a first insulating pattern 1227 filling the first opening 1018 may be formed on the substrate 1000 having the first doped dielectric material 1222. As described with reference to FIG. 37F, the semiconductor line 1015a may be patterned to form a semiconductor pattern 1015b. A plurality of the semiconductor patterns 1015b may be formed. A second opening 1230 may be formed between the plurality of semiconductor patterns 1015b to expose the isolation pattern 1009.

A second dielectric layer 1233 may be formed on an exposed portion of the semiconductor pattern 1015b. The second dielectric layer 1233 may be formed of silicon oxide. The second dielectric layer 1233 may be formed of silicon oxide using a thermal oxidation process.

Figure 39D:
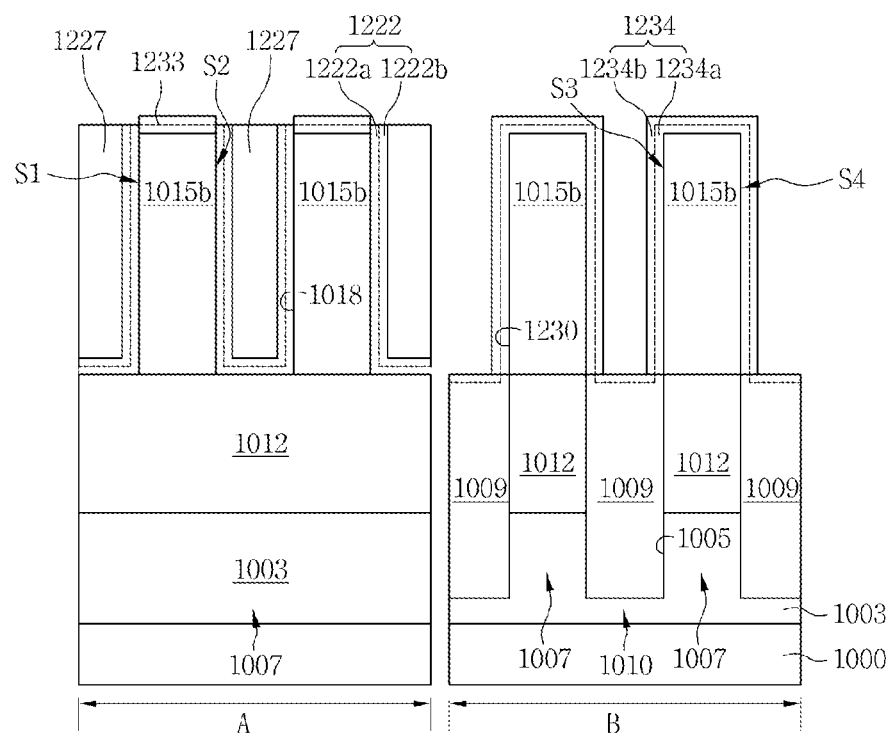

Referring to FIGS. 1 and 39D, as described with reference to FIG. 39B, impurities may be implanted into the second dielectric layer 1233 using an ion implantation process, thereby forming a second doped dielectric material 1234. The second doped dielectric material 1234 may be a dielectric material doped with at least one element of N, C, Cl, F, Ar or Xe. The second doped dielectric material 1234 may be formed by implanting impurities to a portion of the second dielectric layer 1233 or the entire second dielectric layer 1233. For example, when the impurities are implanted into the portion of the second dielectric layer 1233, the second doped dielectric material 1234 may include a first region 1234a and a second region 1234b. The first region 1234a of the second doped dielectric material 1234 may be formed of undoped silicon oxide, while the second region 1234b of the doped dielectric material 1234 may be formed of a doped silicon oxide. The first region 1234a may be formed between the second region 1234b and the semiconductor pattern 1015b.

Meanwhile, impurities may be implanted into an upper region of the isolation pattern 1009 during the ion implantation process.

Figure 39E:
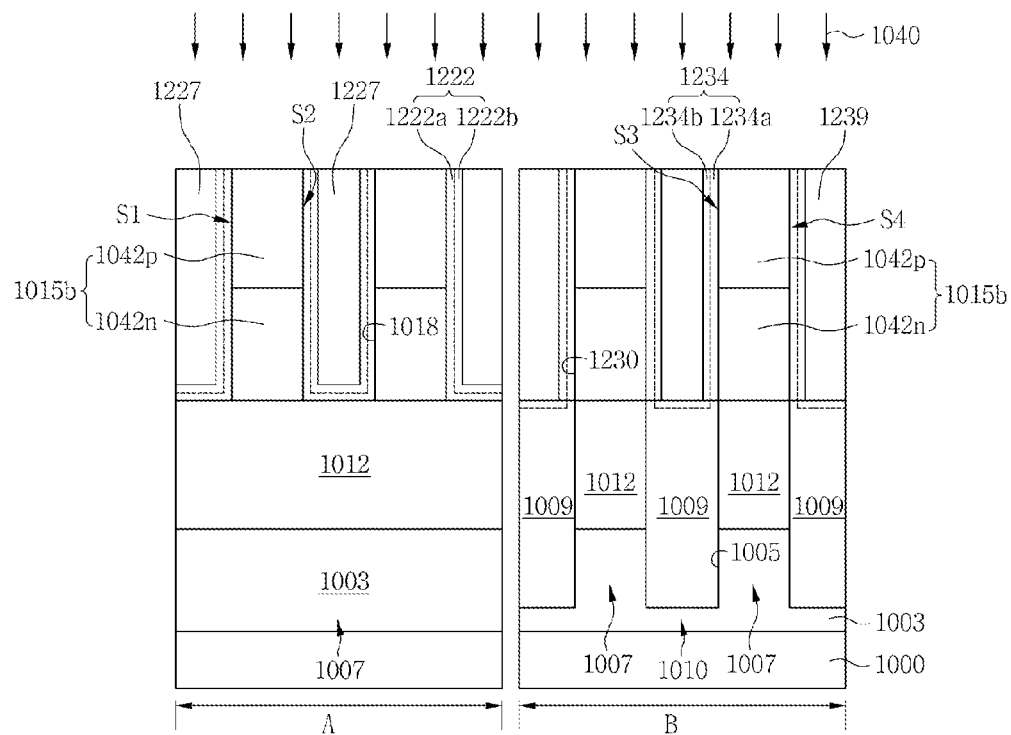

Referring to FIGS. 1 and 39E, a second insulating pattern 1239 may be formed to fill the second opening 1230. The formation of the second insulating pattern 1239 may include forming an insulating layer on the substrate 1000 having the second doped dielectric material 1234, and planarizing the insulating layer until the semiconductor pattern 1015b is exposed. Portions of the second doped dielectric material 1234 disposed on the semiconductor line 1015b may be removed during the formation of the second insulating pattern 1239. Accordingly, the second doped dielectric material 1234 may be defined on the opposite third and fourth side surfaces S3 and S4 of the semiconductor pattern 1015b. The first doped dielectric material 1222 may cover the opposite first and second side surfaces S1 and S2 of the semiconductor pattern 1015b and extend onto the active region 1007.

Thereafter, as described with reference to FIG. 26I, an ion implantation process 1040 for implanting impurities into the semiconductor pattern 1015b may be performed so that a first semiconductor region 1042p can be formed in an upper region of the semiconductor pattern 1015b. Also, a second semiconductor region 1042n may be formed in a lower region of the semiconductor pattern 1015b disposed under the first semiconductor region 1042p.

Next, another modified example of the method of fabricating a semiconductor device according to the example embodiments will be described with reference to FIGS. 40A through 40C.

Figure 40A:
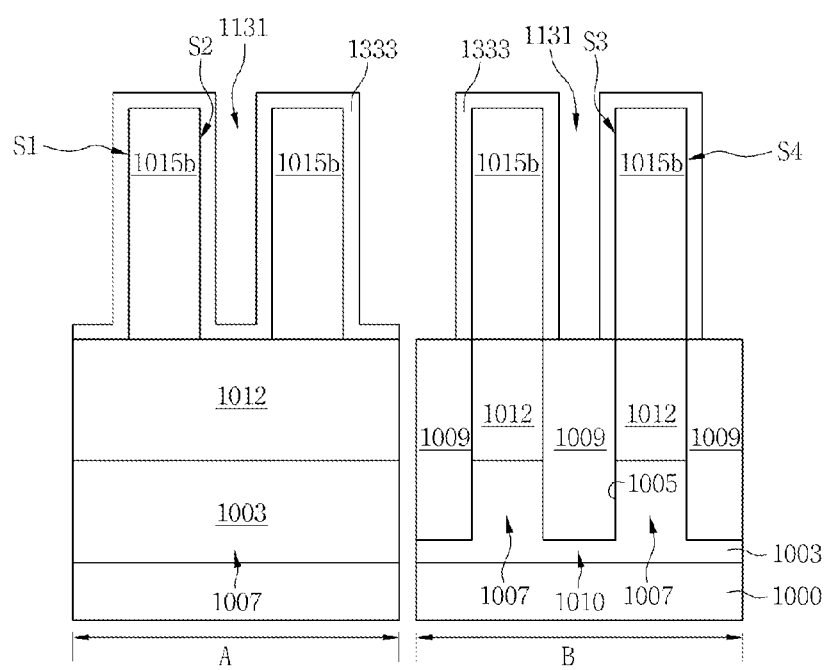
FIGS. 40A through 40C are cross-sectional views illustrating a method of fabricating a semiconductor device according to another modified example of the example embodiments.

Referring to FIGS. 1 and 40A, a semiconductor substrate 1000 may be provided as described with reference to FIG. 37A. For example, as shown in FIG. 37A, a field region 1010 defining an active region 1007 may be formed in a semiconductor substrate 1000 having a well region 1003. The formation of the field region 1010 may include forming a trench 1005 in the semiconductor substrate 1000, and forming an isolation pattern 1009 to fill the trench 1005. Impurities may be implanted into the active region 1007 to form a lower impurity region 1012.

A semiconductor layer may be formed on the semiconductor substrate 1000 having the field region 1010 and the active region 1007, and patterned to form a semiconductor pattern 1015b. A plurality of the semiconductor patterns 1015b may be formed. A vacant space 1131 may be formed between the plurality of semiconductor patterns 1015b. For example, the semiconductor patterns 1015b may be formed using the method described with reference to FIGS. 38A through 38C.

A dielectric layer 1333 may be formed on exposed portions of the semiconductor pattern 1015b and the active region 1007. The dielectric layer 1333 may be formed of silicon oxide. The dielectric layer 1333 may be formed of silicon oxide using a thermal oxidation process.

Figure 40B:
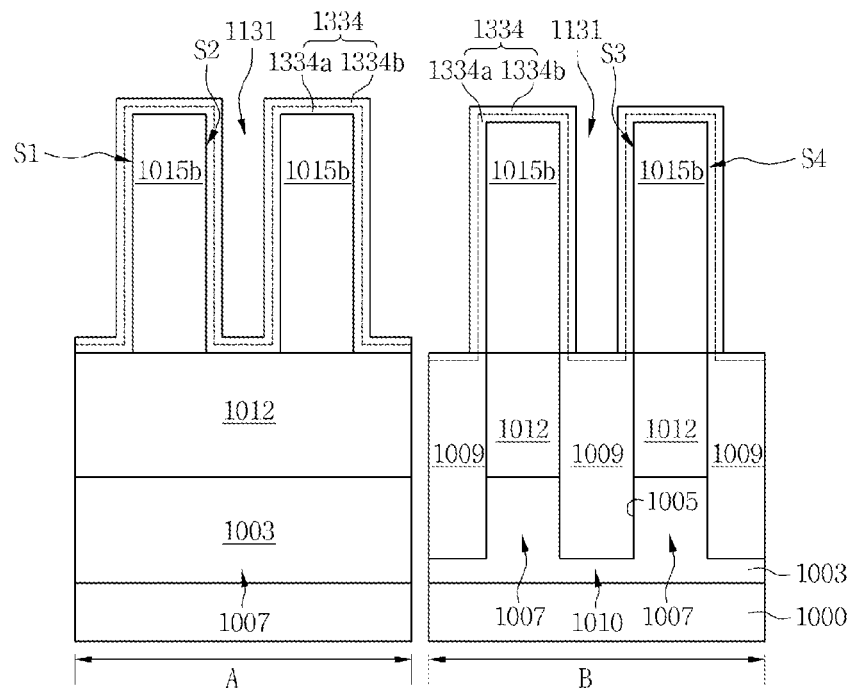

Referring to FIGS. 1 and 40B, an ion implantation process, which is substantially the same as described with reference to FIG. 39B, may be performed on the substrate 1000 having the dielectric layer 1333 so that impurities may be implanted into the first dielectric layer 1333 to form a doped dielectric material 1334. The implanted impurities may contain at least one element of N, C, Cl, F, Ar or Xe.

The doped dielectric material 1334 may be formed by doping impurities into a portion of the dielectric layer 1333 or the entire dielectric layer 1333. For instance, when impurities are implanted into the portion of the dielectric layer 1333, the doped dielectric material 1334 may include a first region 1334a and a second region 1334b. The first region 1334a of the doped dielectric material 1334 may be formed of undoped silicon oxide, while the second region 1334b of the doped dielectric material 1334 may be formed of a doped silicon oxide. The first region 1334a may be formed between the second region 1334b and the semiconductor pattern 1015b. Meanwhile, impurities may be implanted into an upper region of the isolation pattern 1009 during the ion implantation process.

Figure 40C:
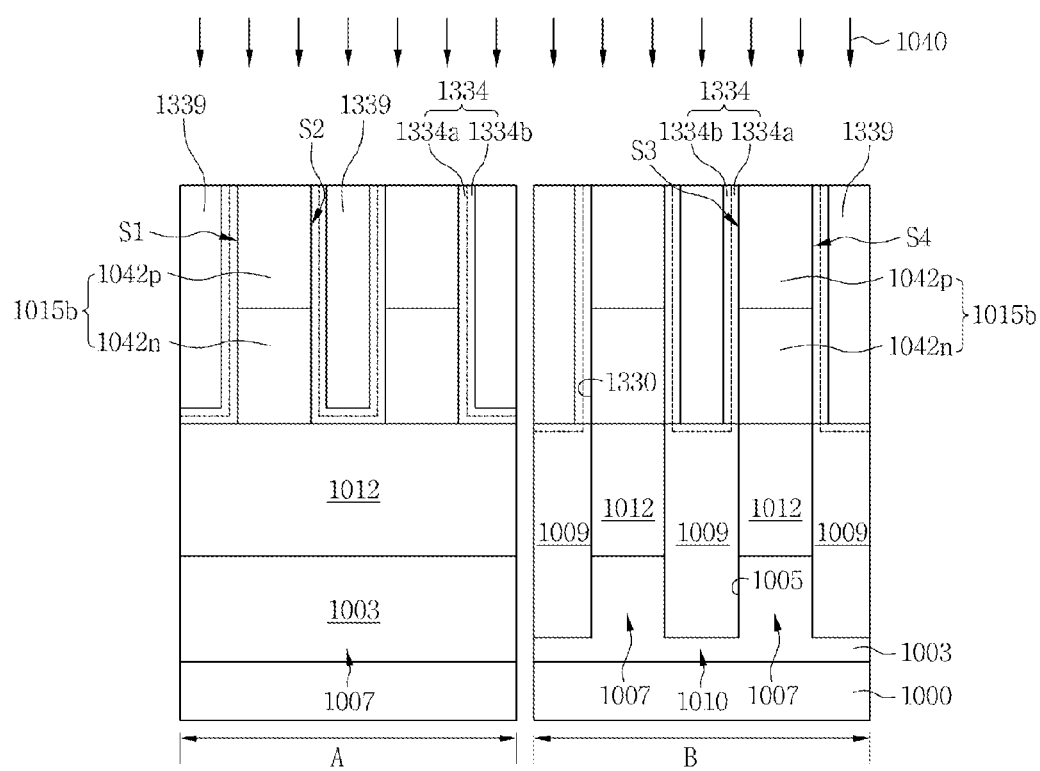

Referring to FIGS. 1 and 40C, an insulating pattern 1339 may be formed to fill the vacant space 1131. The formation of the insulating pattern 1339 may include forming an insulating layer on the substrate 1000 having the doped dielectric material 1334, and planarizing the insulating layer until the semiconductor pattern 1015b is exposed. A portion of the doped dielectric material 1334 disposed on the semiconductor pattern 1015b may be removed during the formation of the insulating pattern 1339. Accordingly, the doped dielectric material 1334 may surround the side surfaces S1, S2, S3, and S4 of the semiconductor pattern 1015b and extend onto the active region 1007.

Thereafter, as described with reference to FIG. 26I, an ion implantation process 1040 for doping impurities into the semiconductor pattern 1015b may be performed, thereby forming a first semiconductor region 1042p in an upper region of the semiconductor pattern 1015b. Also, a second semiconductor region 1042n may be formed in a lower region of the semiconductor pattern 1015b disposed under the first semiconductor region 1042p.

Next, another modified example of the method of fabricating a semiconductor device according to the example embodiments will be described with reference to FIGS. 41A through 41D.

Figure 41A:
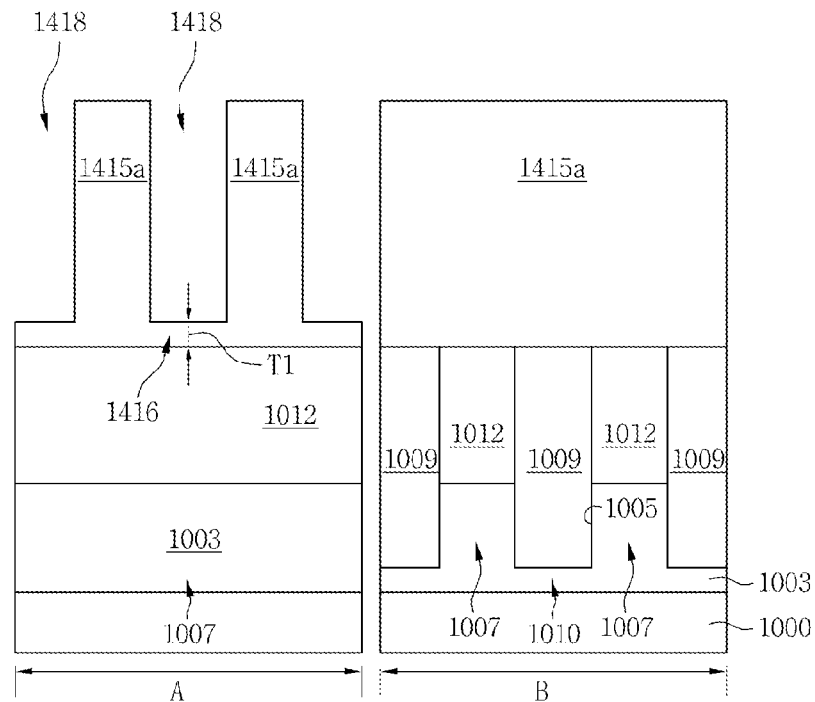
FIGS. 41A through 41D are cross-sectional views illustrating a method of fabricating a semiconductor device according to another modified example of the example embodiments.

Referring to FIGS. 1 and 41A, a semiconductor substrate 1000 may be provided as described with reference to FIG. 37A. For example, as shown in FIG. 37A, a field region 1010 defining an active region 1007 may be formed in a semiconductor substrate 1000 having a well region 1003. The formation of the field region 1010 may include forming a trench 1005 in the semiconductor substrate 1000, and forming a isolation pattern 1009 to fill the trench 1005. The active region 1007 may have a line shape parallel to the first direction X. Impurities may be implanted into the active region 1007 to form a lower impurity region 1012.

A semiconductor layer may be formed on the semiconductor substrate 1000 having the active region 1007 and the field region 1010.

The semiconductor layer may be patterned to form a semiconductor line 1415a. The semiconductor line 1415a may have a line shape parallel to the first direction X, and cross the active region 1007. A plurality of semiconductor lines 1415a may be formed. The semiconductor layer may be left to a first thickness T1 on the active region 1007 between the plurality of semiconductor lines 1415a to form a subsidiary semiconductor pattern 1416. A first opening 1418 may be formed between the plurality of semiconductor lines 1415a.

Figure 41B:
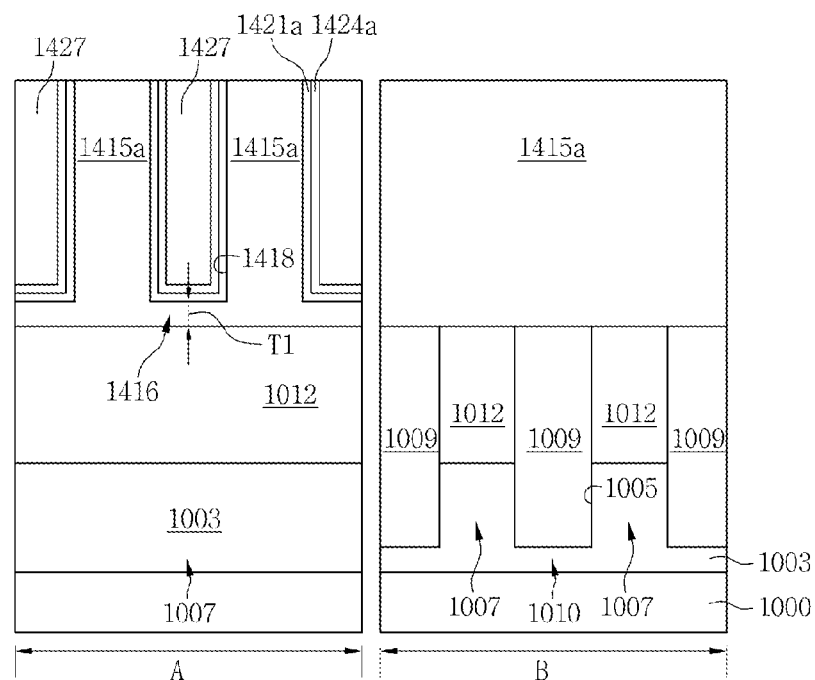

Referring to FIGS. 1 and 41B, as described with reference to FIG. 37D, a first layer 1421a may be formed on the semiconductor substrate 1000 having the semiconductor lines 1415a, and a second layer 1424a may be conformally formed on the substrate 1000 having the first layer 1421a. The first layer 1421a may be formed of silicon oxide obtained using a thermal oxidation process, while the second layer 1424a may be formed of a silicon-nitride-based material, for example, at least one of SiN, SiCN, SiBN, SiON, SiOCN, or SiBCN. As shown in FIG. 37E, an insulating layer may be formed on the substrate 1000 having the first and second layers 1421a and 1424a, and planarized to form a first insulating pattern 1427. The first and second layers 1421a and 1424a may be defined as first and second dielectric materials 1421a and 1424a provided to cover side and bottom surfaces of the first insulating pattern 1427.

Figure 41C:
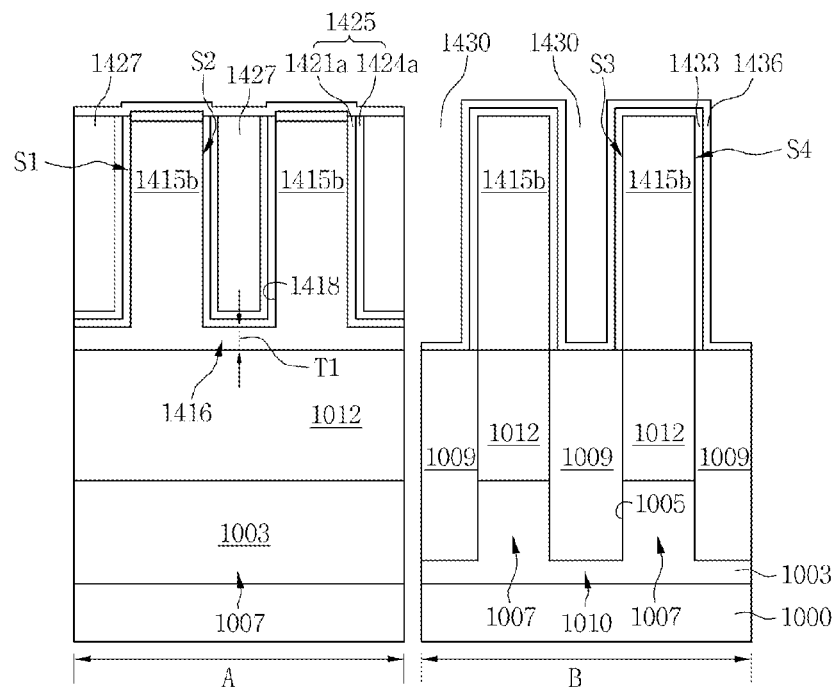

Referring to FIGS. 1 and 41C, the semiconductor line 1415a may be patterned to form a semiconductor pattern 1415b. The patterning of the semiconductor line 1415a may be performed until an isolation pattern 1009 is exposed. A plurality of the semiconductor patterns 1415b may be formed. A second opening 1430 may be formed to expose the isolation pattern 1009 between the plurality of semiconductor patterns 1415b.

A third layer 1433 may be formed on the exposed portions of the semiconductor patterns 1415b, and a fourth layer 1436 may be conformally formed on the substrate 1000 having the third layer 1433. The third layer 1433 may be formed of silicon oxide obtained using a thermal oxidation process, while the fourth layer 1436 may be formed of a silicon-nitride-based material, for example, at least one of SiN, SiCN, SiBN, SiON, SiOCN, or SiBCN.

Figure 41D:
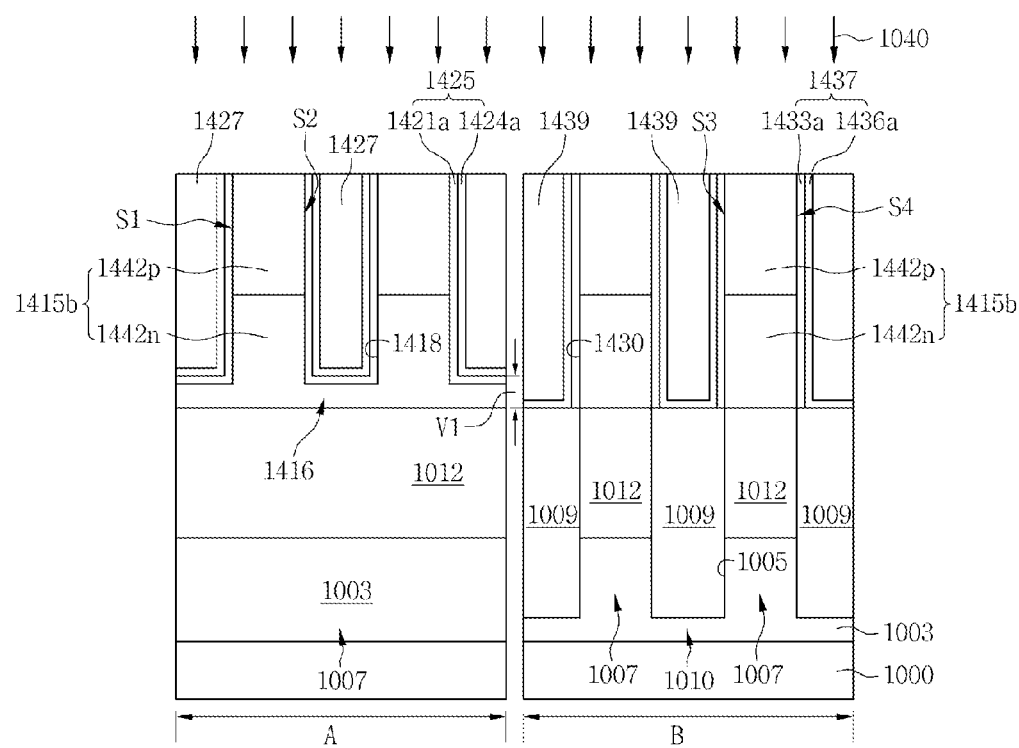

Referring to FIGS. 1 and 41D, a second insulating pattern 1439 may be formed to fill the second opening 1430. The formation of the second insulating pattern 1439 may include forming an insulating layer on the substrate 1000 having the third and fourth layers 1433 and 1436, and planarizing the insulating layer until the semiconductor pattern 1415b is exposed. Portions of the third and fourth layers 1433 and 1436 disposed on the semiconductor line 1415b may be removed during the formation of the second insulating pattern 1439. Here, the third and fourth layers 1433 and 1436 may be defined as third and fourth dielectric materials 1433a, 1436a.

A bottom portion of the second dielectric material 1424a may be disposed at a different level from a bottom portion of the fourth dielectric material 1436a. For example, the bottom portion of the second dielectric material 1424a may be disposed at a higher level than the bottom portion of the fourth dielectric layer 1436a by a first height V1.

Thereafter, as described with reference to FIG. 26I, an ion implantation process 1040 for implanting impurities into the semiconductor pattern 1415b may be performed so that a first semiconductor region 1442p can be formed in an upper region of the semiconductor pattern 1415b. Also, a second semiconductor region 1442n may be formed in a lower region of the semiconductor pattern 1415b disposed under the first semiconductor region 1442p.

Next, another modified example of the method of fabricating a semiconductor device according to the example embodiments will be described with reference to FIGS. 42A through 42C.

Figure 42A:
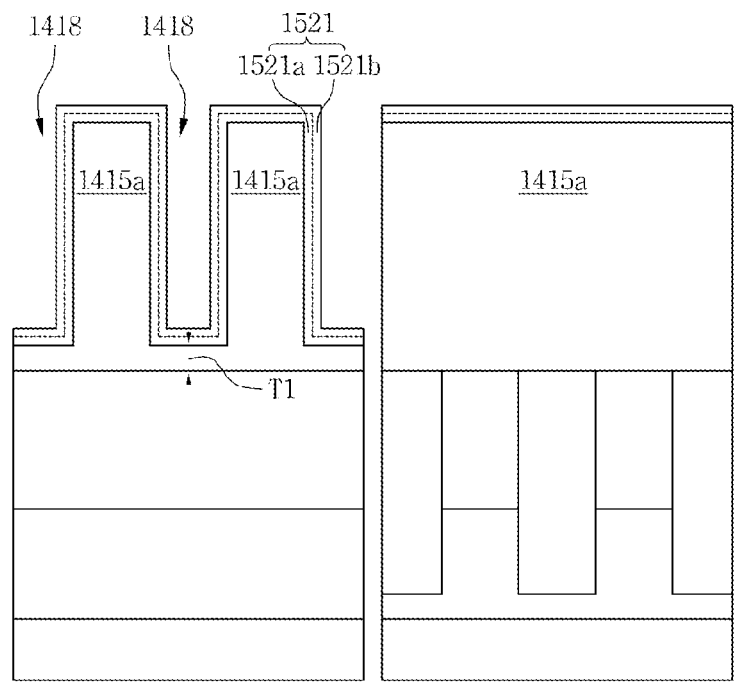
FIGS. 42A through 42C are cross-sectional views illustrating a method of fabricating a semiconductor device according to another modified example of the example embodiments.

Referring to FIGS. 1 and 42A, a semiconductor substrate 1000 may be prepared as described with reference to FIG. 41A. For example, a semiconductor substrate 1000 having the first opening 1418 and the semiconductor line 1415a described with reference to FIG. 41A may be prepared.

A first dielectric layer may be formed on the semiconductor line 1415a. The first dielectric layer may be formed of silicon oxide. The first dielectric layer may be formed of silicon oxide using a thermal oxidation process.

An ion implantation process described with reference to FIG. 39B may be performed on the substrate 1000 having the first dielectric layer so that impurities may be implanted into the first dielectric layer to form a first doped dielectric material 1521. The implanted impurities may include at least one element of N, C, Cl, F, Ar or Xe. The first doped dielectric material 1521 may be formed by implanting impurities to a portion of the first dielectric layer or the entire first dielectric layer. For instance, when the impurities are implanted into the portion of the first dielectric layer, the doped dielectric material 1521 may include a first region 1521a and a second region 1521b. The first region 1521a of the first doped dielectric material 1521 may be formed of undoped silicon oxide, while the second region 1521b of the first doped dielectric material 1521 may be formed of a doped silicon oxide. The first region 1521a may be formed between the second region 1521b and the semiconductor line 1415a, and between the second region 1521b and the active region 1007.

Figure 42B:
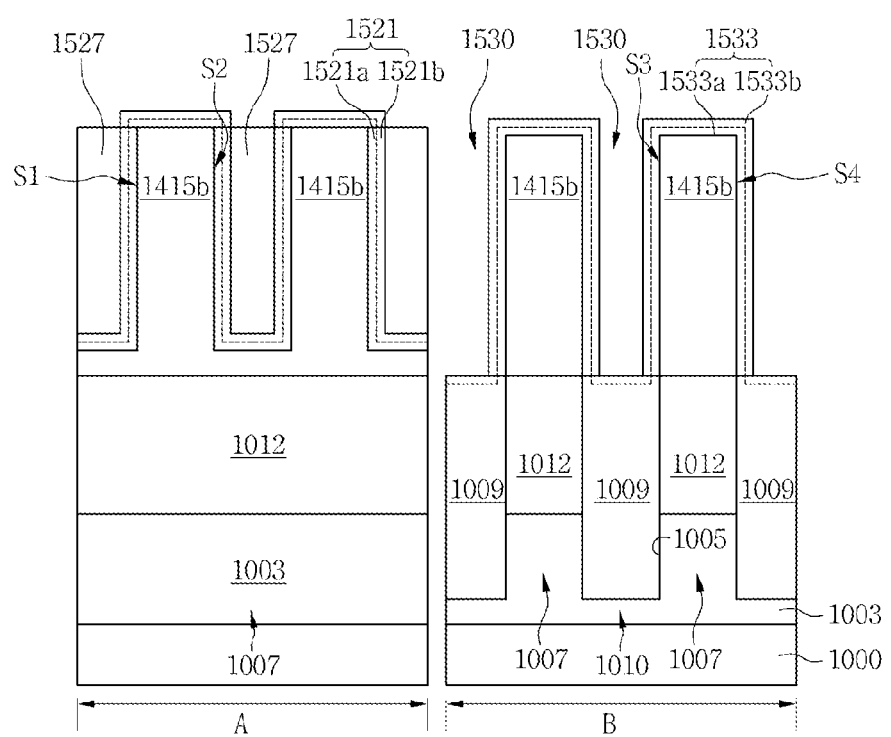

Referring to FIGS. 1 and 42B, as described with reference to FIG. 41B, a first insulating pattern 1527 may be formed to fill the first opening 1418 formed in the substrate 1000 having the first doped dielectric material 1521. As described with reference to FIG. 41C, the semiconductor line 1415a may be patterned to form a semiconductor pattern 1415b. Also, a second opening 1530 may be formed to expose the isolation pattern 1009.

A second dielectric layer may be formed on the substrate 1000 having the semiconductor pattern 1415b. The second dielectric layer may be formed of silicon oxide. The second dielectric layer may be formed of silicon oxide obtained using a thermal oxidation process.

As described with reference to FIG. 42A, an ion implantation process may be performed on the substrate 1000 having the second dielectric layer so that impurities may be implanted into the second dielectric layer to form a second doped dielectric material 1533. The second doped dielectric material 1533 may be a dielectric material doped with at least one element of N, C, Cl, F, Ar or Xe. The second doped dielectric material 1533 may be formed by implanting impurities to a portion of the second dielectric layer 1533 or the entire second dielectric layer 1533. For example, when impurities are implanted into the portion of the second dielectric layer, the second doped dielectric material 1533 may include a first region 1533a and a second region 1533b. The first region 1533a of the second doped dielectric material 1533 may be formed of undoped silicon oxide, while the second region 1533b of the second doped dielectric material 1533 may be formed of a doped silicon oxide. The first region 1533a may be formed between the second region 1533b and the semiconductor pattern 1415b.

Meanwhile, impurities may be implanted into an upper region of the isolation pattern 1009 during the ion implantation process.

Figure 42C:
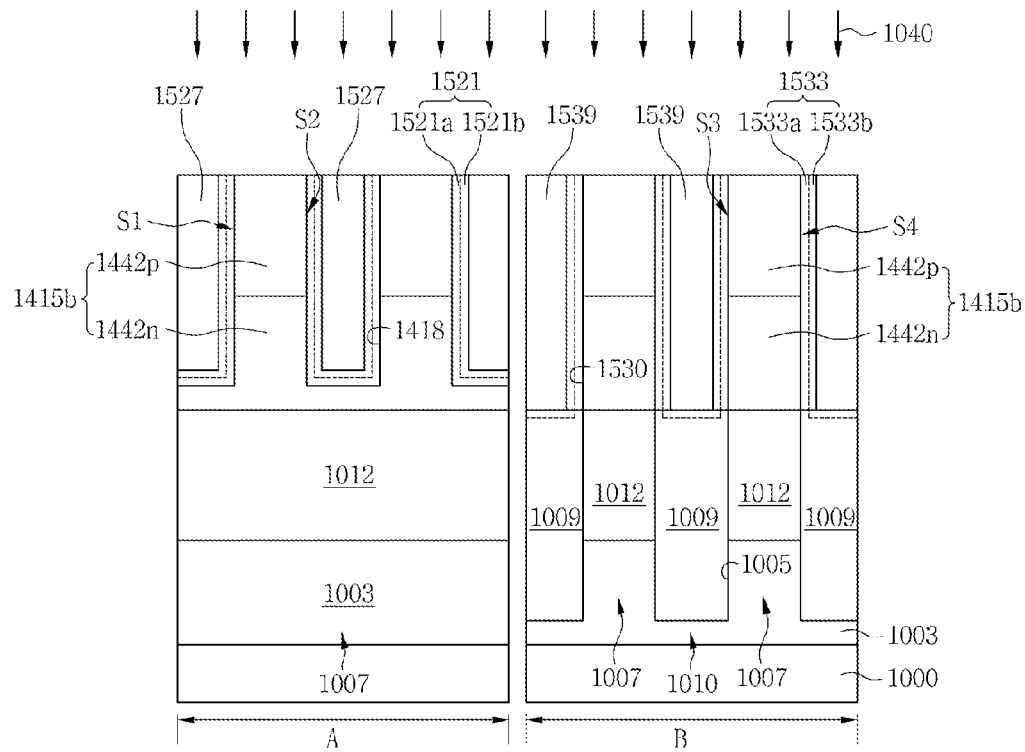

Referring to FIGS. 1 and 42C, a second insulating pattern 1539 may be formed to fill the second opening 1018. The formation of the second insulating pattern 1539 may include forming an insulating layer on the substrate 1000 having the second doped dielectric material 1533, and planarizing the insulating layer until the semiconductor pattern 1415b is exposed.

The second doped dielectric material 1533 may be defined on the opposite third and fourth side surfaces S3 and S4 of the semiconductor pattern 1415b. The first doped dielectric material 1521 may cover the opposite first and second side surfaces S1 and S2 of the semiconductor pattern 1415b and extend onto the active region 1007.

Thereafter, as described with reference to FIG. 26I, an ion implantation process 1040 for implanting impurities into the semiconductor pattern 1415b may be performed so that a first semiconductor region 1442p can be formed in an upper region of the semiconductor pattern 1415b. Also, a second semiconductor region 1442n may be formed in a lower region of the semiconductor pattern 1415b disposed under the first semiconductor region 1442p.

Next, another modified example of the method of fabricating a semiconductor device according to the example embodiments will be described with reference to FIGS. 43A through 43E.

Figure 43A:
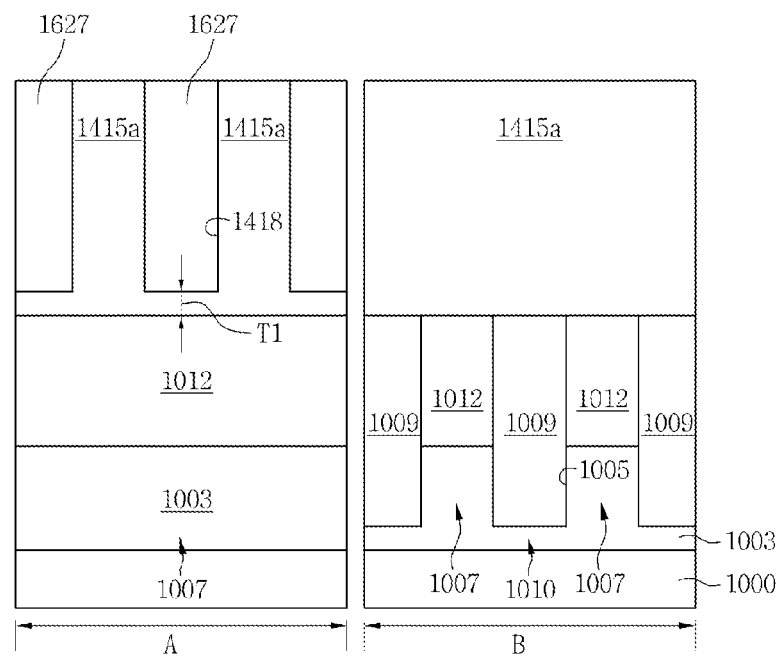
FIGS. 43A through 43E are cross-sectional views illustrating a method of fabricating a semiconductor device according to another modified example of the example embodiments.

Referring to FIGS. 1 and 43A, a semiconductor substrate 1000 having the first opening 1418 and the semiconductor line 1415a may be prepared as described with reference to FIG. 41A.

A sacrificial filling layer 1627 may be formed to fill the first opening 1418.

Figure 43B:
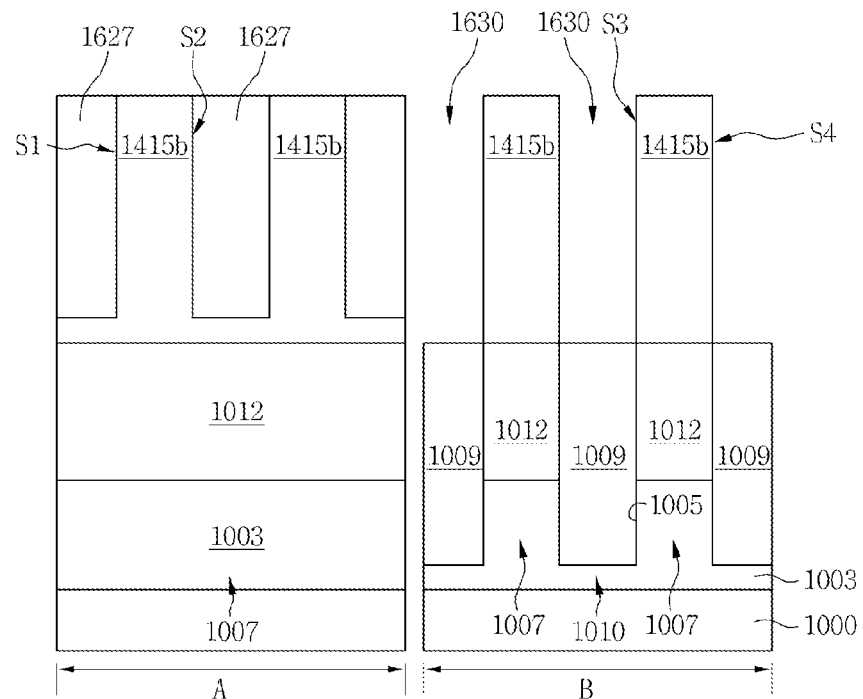

Referring to FIGS. 1 and 43B, as described with reference to FIG. 41C, the semiconductor line 1415a may be patterned to form a semiconductor pattern 1415b. A plurality of the semiconductor patterns 1415b may be provided. A second opening 1630 may be formed to expose the isolation pattern 1009 between the plurality of semiconductor patterns 1415b.

Figure 43C:
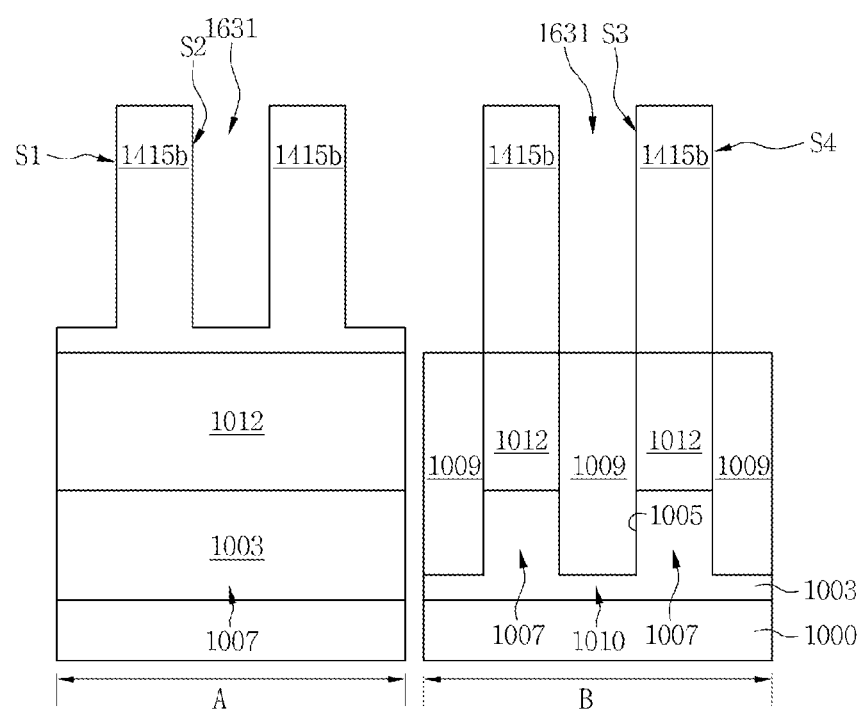

Referring to FIGS. 1 and 43C, the sacrificial filling layer 1627 may be removed. Accordingly, a vacant space 1631 may be formed to expose the semiconductor pattern 1415b.

Figure 43D:
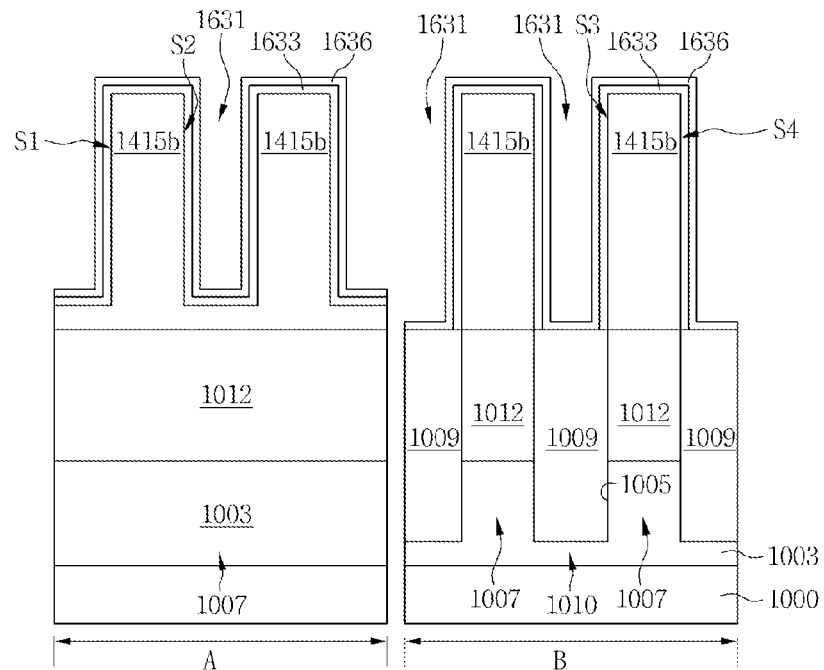

Referring to FIGS. 1 and 43D, a first layer 1633 and a second layer 1636 may be sequentially formed on the semiconductor substrate 1000 having the semiconductor patterns 1415b. The first layer 1633 may be formed of silicon oxide. The first layer 1633 may be formed of silicon oxide obtained using a thermal oxidation process, while the second layer 1636 may be formed of a silicon-nitride-based material, for example, at least one of SiN, SiCN, SiBN, SiON, SiOCN, or SiBCN.

Figure 43E:
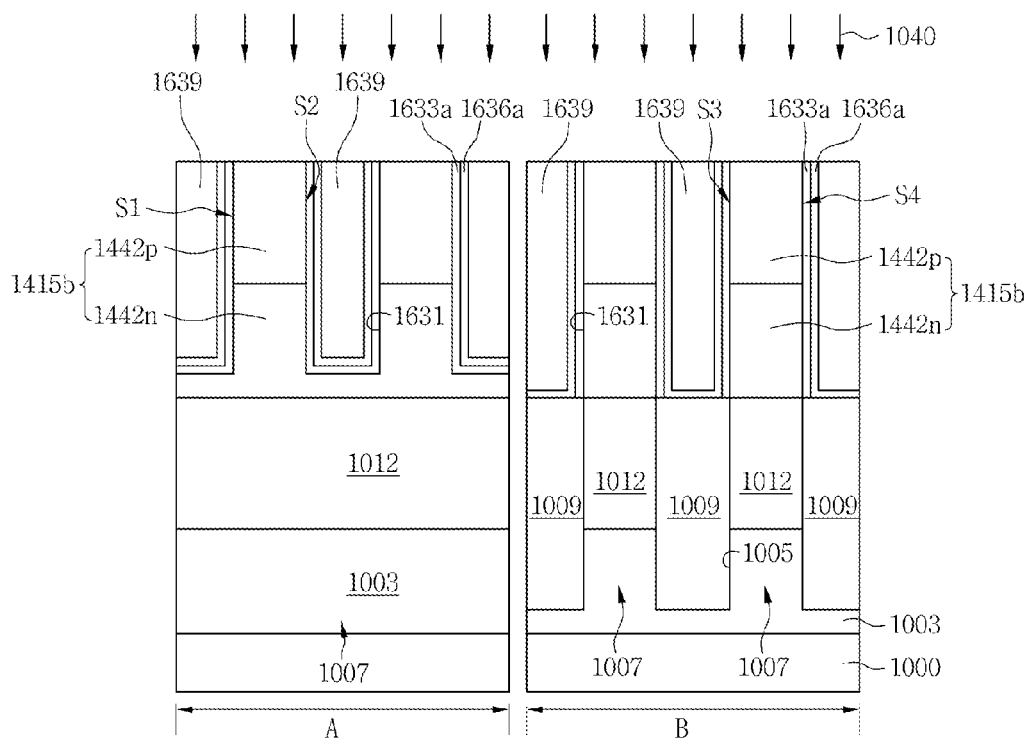

Referring to FIGS. 1 and 43E, an insulating pattern 1639 may be formed to fill the vacant space 1631. The formation of the insulating pattern 1639 may include forming an insulating layer on the substrate 1000 having the first and second layers 1633 and 1636, and planarizing the insulating layer until the semiconductor pattern 1415b is exposed. Portions of the first and second layers 1633 and 1636 disposed on the semiconductor line 1415b may be removed during the formation of the insulating pattern 1639. Accordingly, the remaining first and second layers 1633 and 1636 may be defined as first and second dielectric materials 1633a and 1636a.

Thereafter, as described with reference to FIG. 26I, an ion implantation process 1040 for implanting impurities into the semiconductor pattern 1415b may be performed so that a first semiconductor region 1442p can be formed in an upper region of the semiconductor pattern 1415b. Also, a second semiconductor region 1442n may be formed in a lower region of the semiconductor pattern 1415b disposed under the first semiconductor region 1442p.

Next, another modified example of the method of fabricating a semiconductor device according to the example embodiments will be described with reference to FIGS. 44A through 44E.

Figure 44A:
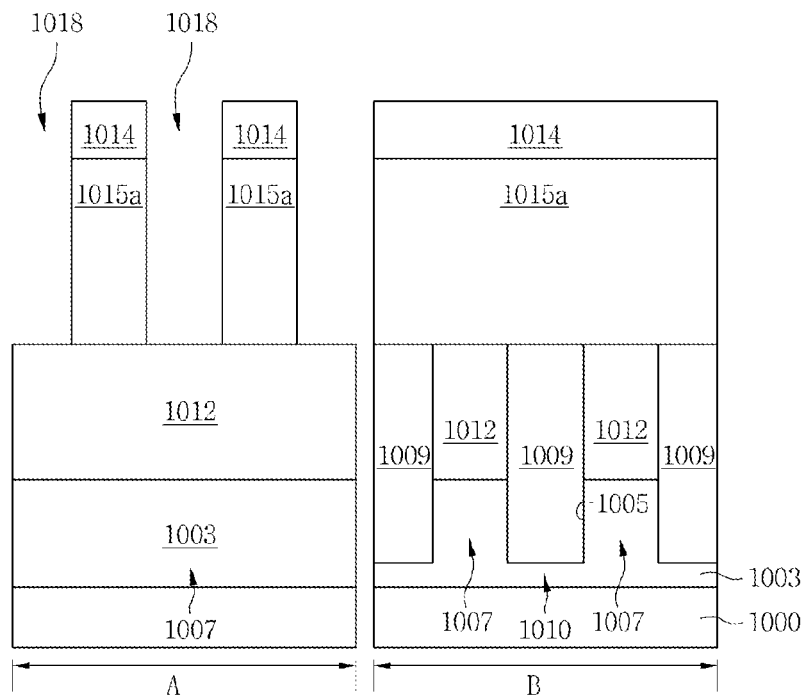
FIGS. 44A through 44E are cross-sectional views illustrating a method of fabricating a semiconductor device according to another modified example of the example embodiments.

Referring to FIGS. 1 and 44A, a semiconductor substrate may be prepared as described with reference to FIGS. 37A and 37B. For example, a semiconductor substrate having the semiconductor layer 1015 described with reference to FIG. 37B may be prepared.

A hard mask 1014 may be formed on the semiconductor layer 1015. The hard mask 1014 may be formed of a material having an etch selectivity with respect to the semiconductor layer 1015, for example, silicon nitride or carbon-doped oxide.

The semiconductor layer 1015 may be etched using the hard mask 1014 as an etch mask to form a semiconductor line 1015a. A plurality of the semiconductor lines 1015a may be formed. A first opening 1018 may be formed between the plurality of semiconductor lines 1015a.

Figure 44B:
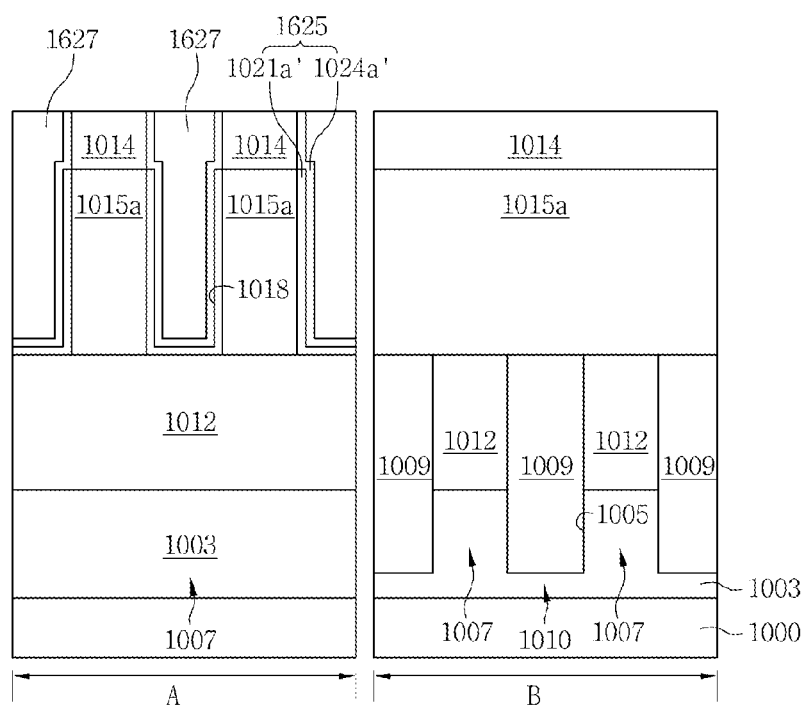

Referring to FIGS. 1 and 44B, in substantially the same manner as described with reference to FIGS. 37D and 37E, first and second dielectric materials 1021a' and 1024a' may be sequentially formed on side surfaces of the semiconductor line 1015a and the active region 1007 disposed on both sides of the semiconductor line 1015a, and a first insulating pattern 1627 may be formed to fill the first opening 1018.

The first and second dielectric materials 1021a' and 1024a' may constitute a first barrier region 1625. The second dielectric material 1024a' may be formed to cover side surfaces of the hard mask 1014. The first and second dielectric materials 1021a' and 1024a' may be formed of the same material as the first and second dielectric materials 1021a and 1024a described with reference to FIG. 37F.

The formation of the first and second dielectric materials 1021a' and 1024a' and the first insulating pattern 1627 may include forming first and second layers on the substrate having the first opening 1018, forming an insulating layer on the second layer, and planarizing the insulating layer until the hard mask 1014 is exposed. Thus, the first insulating pattern 1627 may be formed to fill the first opening 1018, while the first and second dielectric materials 1021a' and 1024a' may be defined within the first opening 1018.

Figure 44C:
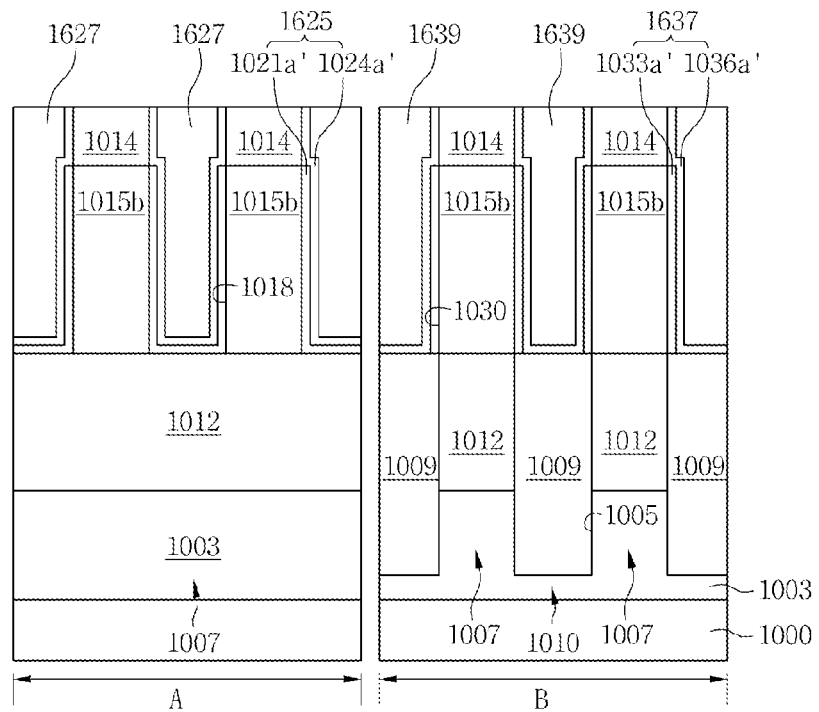

Referring to FIGS. 1 and 44C, the hard mask 1014 and the semiconductor line 1015a may be patterned to form a semiconductor pattern 1015b and a hard mask pattern 1014 stacked sequentially. In this case, a second opening 1030 may be formed to expose opposite side surfaces of the semiconductor pattern 1015b and the hard mask pattern 1014.

A second barrier region 1637 may be formed on side and bottom surfaces of the second opening 1030, while a second insulating pattern 1639 may be formed to fill the second opening 1030. The second barrier region 1637 may include a third dielectric material 1033a' and a fourth dielectric material 1036a'. The third and fourth dielectric materials 1033a' and 1036a' may be formed of substantially the same material as the third and fourth dielectric materials 1033a and 1036a described with reference to FIG. 37.

The semiconductor pattern 1015b may be formed to partially fill the holes 1018 and 1030 defined by the first and second insulating patterns 1639.

Figure 44D:
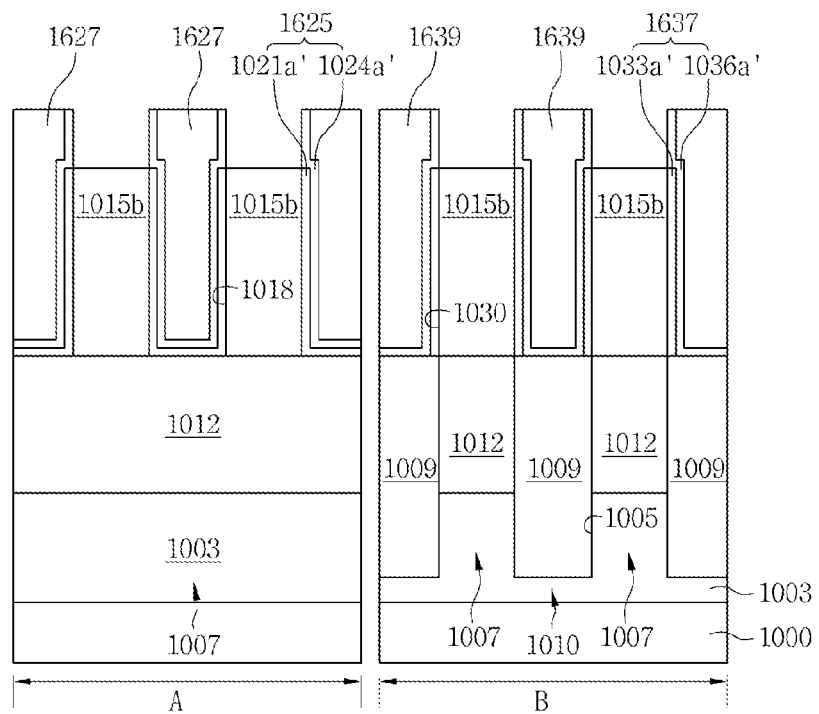

Referring to FIGS. 1 and 44D, the hard mask pattern 1014 may be selectively removed. A vacant space may be formed during the removal of the hard mask pattern 1014.

Figure 44E:
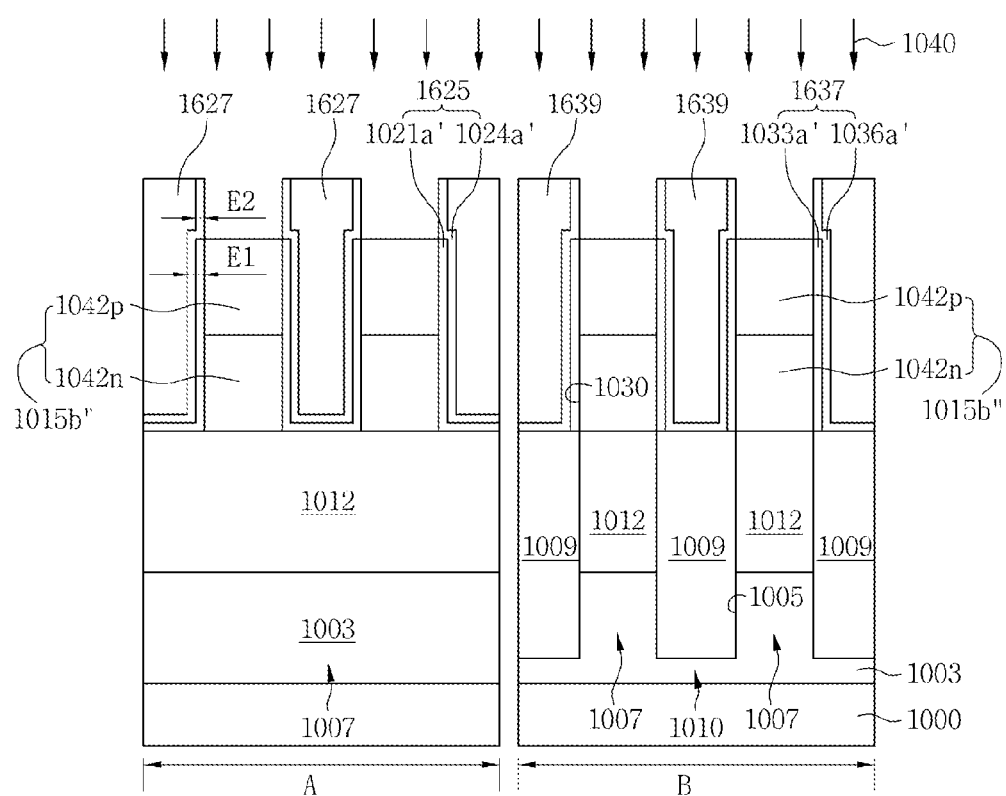

Referring to FIGS. 1 and 44E, as described with reference to FIG. 26I, an ion implantation process 1040 for implanting impurities into the semiconductor pattern 1015b may be performed so that a first semiconductor region 1042p can be formed in an upper region of the semiconductor pattern 1015b". Also, a second semiconductor region 1042n may be formed in a lower region of the semiconductor pattern 1015b" of the first semiconductor region 1042p.

Next, another modified example of the method of fabricating a semiconductor device according to the example embodiments will be described with reference to FIGS. 45A through 45G.

Figure 45A:
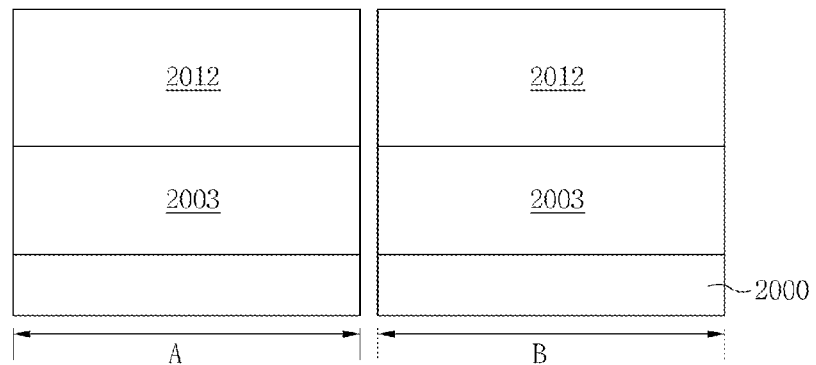
FIGS. 45A through 45G are cross-sectional views illustrating a method of fabricating a semiconductor device according to another modified example of the example embodiments.

Referring to FIGS. 1 and 45A, a well region 2003 may be formed in a semiconductor substrate 2000. The semiconductor substrate 2000 may be a silicon substrate.

Impurities may be implanted into the semiconductor substrate 2000 to form a lower impurity region 2012. The well region 2003 may have a different conductivity type from the lower impurity region 2012. For instance, the well region 2003 may be a P type, while the lower impurity region 2012 may be an N type.

Figure 45B:
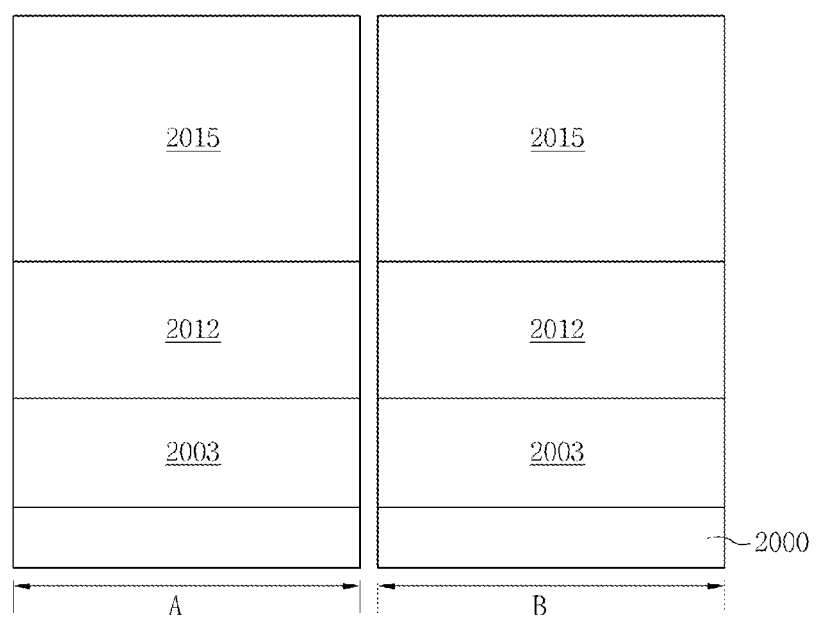

Referring to FIGS. 1 and 45B, a semiconductor layer 2015 may be formed on the semiconductor substrate 2000 having the lower impurity region 2012. The semiconductor layer 2015 may be formed of crystalline silicon. For example, the semiconductor layer 2015 may be formed of single crystalline silicon grown from the active region 1007 using a SEG process, but example embodiments are not limited thereto. For instance, the formation of the semiconductor layer 2015 may include forming a noncrystalline silicon layer, and crystallizing the noncrystalline silicon layer into a crystalline silicon layer using an annealing process. The crystalline silicon layer may be a poly-Si layer or a single crystalline silicon layer.

Figure 45C:
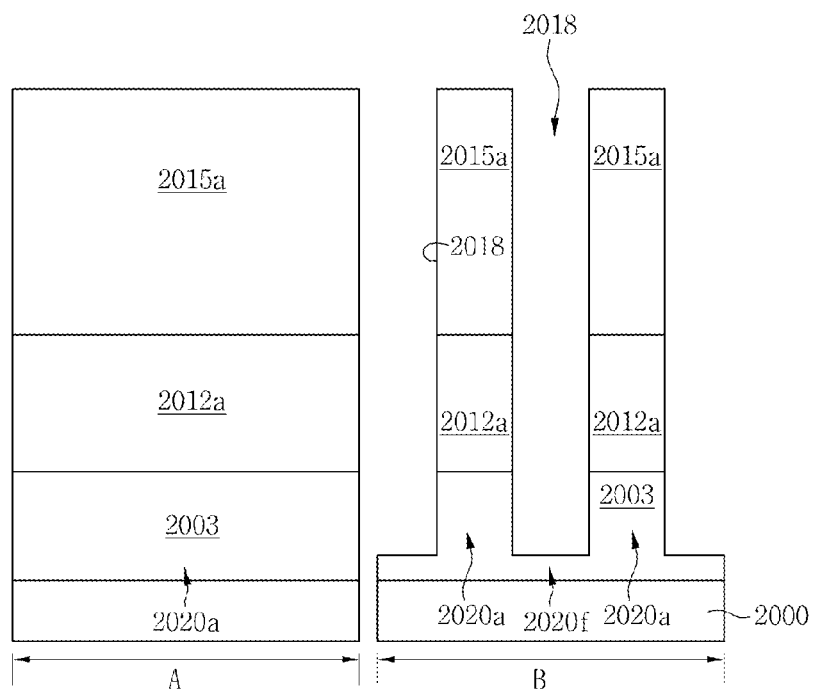

Referring to FIGS. 1 and 45C, the semiconductor layer 2015 and the semiconductor substrate 2000 may be patterned, thereby forming a first opening 2018 to penetrate the semiconductor layer 2015 and penetrate the lower impurity region 2012 of the semiconductor substrate 2000. A bottom region of the first opening 2018 may be disposed at a lower level than the lower impurity region 2012.

Due to the first opening 2018, the semiconductor layer 2015 may be defined as a semiconductor line 2015a, and an active region 2020a may be defined in an upper region of the semiconductor substrate 2000. From a plan view, the active region 2020a may have a line shape. A plurality of the active regions 2020a may be formed. A region between the plurality of active regions 2020a may be defined as a field region 2020f.

The impurity region 2012 may be defined in an upper region of the line-shaped active region 2020a to form a line-shaped impurity region 2012a.

A semiconductor layer 2015a may be formed on the semiconductor substrate 2000 having the lower impurity region 2012. The semiconductor layer 2015a may be formed of crystalline silicon. For example, the semiconductor layer 2015a may include single crystalline silicon grown from the active region 1007 using a SEG process, but example embodiments are not limited thereto. For instance, the semiconductor layer 2015a may include forming a noncrystalline silicon layer, and crystallizing the noncrystalline silicon layer into a crystalline silicon layer using an annealing process. The crystalline silicon layer may be a poly-Si layer or a single crystalline silicon layer.

Figure 45D:
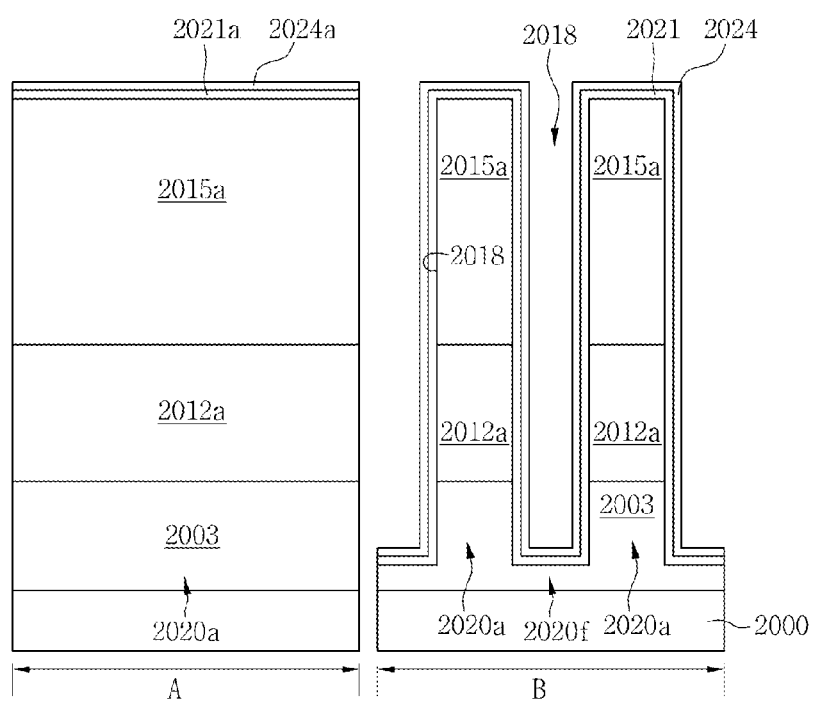

Referring to FIGS. 1 and 45D, a first layer 2021 and a second layer 2024 may be sequentially formed on the semiconductor layer 2015a exposed by the first opening 2018 and the semiconductor substrate 1000. The first layer 2021 may be formed of silicon oxide. The first layer 2021 may be formed of silicon oxide obtained using a thermal oxidation process, while the second layer 2024 may be formed of a silicon-nitride-based material, for example, at least one of SiN, SiCN, SiBN, SiON, SiOCN, or SiBCN.

Figure 45E:
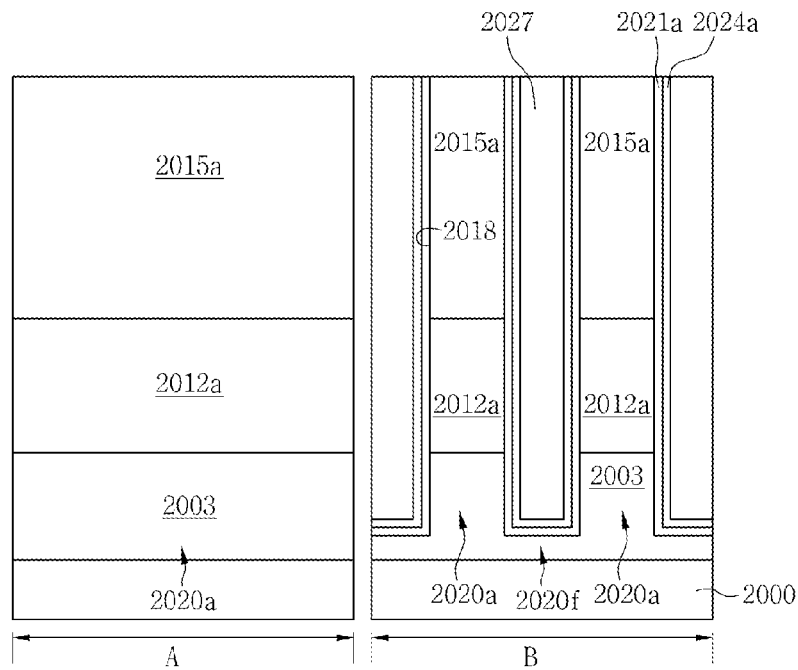

Referring to FIGS. 1 and 45E, a first insulating pattern 2027 may be formed to fill the first opening 2018. The first insulating pattern 2027 may include silicon oxide or a silicon-oxide-based insulating material. The formation of the first insulating pattern 2027 may include forming an insulating layer on the substrate 1000 having the first and second layers 2021 and 2024, and planarizing the insulating layer.

Meanwhile, the first and second layers 2021 and 2024a may remain within the first opening 2018 and be defined as first and second dielectric materials 2021a and 2024a.

Figure 45F:
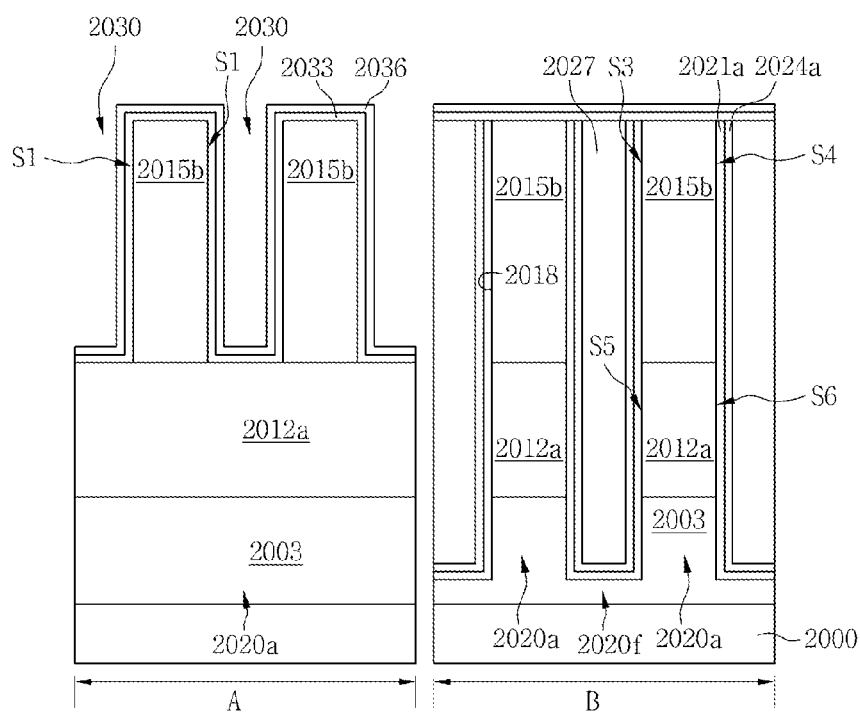

Referring to FIGS. 1 and 45F, the semiconductor layer 2015a may be patterned to form a semiconductor pattern 2015b. A plurality of the semiconductor patterns 2015b may be formed. A second opening 2030 may be formed between the plurality of semiconductor patterns 2015b. A bottom region of the second opening 2030 may be disposed at a higher level than the bottom region of the first opening 2018. The bottom region of the second opening 2030 may be disposed on the lower impurity region 2012a, while the bottom region of the first opening 2018 may be disposed at a lower level than the lower impurity region 2012a.

The semiconductor pattern 2015b may have first and second side surfaces S1 and S2 disposed opposite each other, and third and fourth side surfaces S3 and S4 disposed opposite each other. The first and second side surfaces S1 and S2 may be parallel to the second direction Y, while the third and fourth side surfaces S3 and S4 may be parallel to the first direction X. The first direction X may be a direction crossing the second direction Y.

The third and fourth side surfaces S3 and S4 of the semiconductor pattern 2015b may be vertically aligned with the opposite side surfaces S5 and S6 of the active region 2020a.

A third layer 2033 and a fourth layer 2036 may be sequentially formed on the semiconductor substrate 1000 having the semiconductor pattern 2027. The third layer 2033 may be formed of silicon oxide. The third layer 2033 may be formed of silicon oxide obtained using a thermal oxidation process, while the fourth layer 2036 may be formed of a silicon-nitride-based material, for example, at least one of SiN, SiCN, SiBN, SiON, SiOCN, or SiBCN.

Figure 45G:
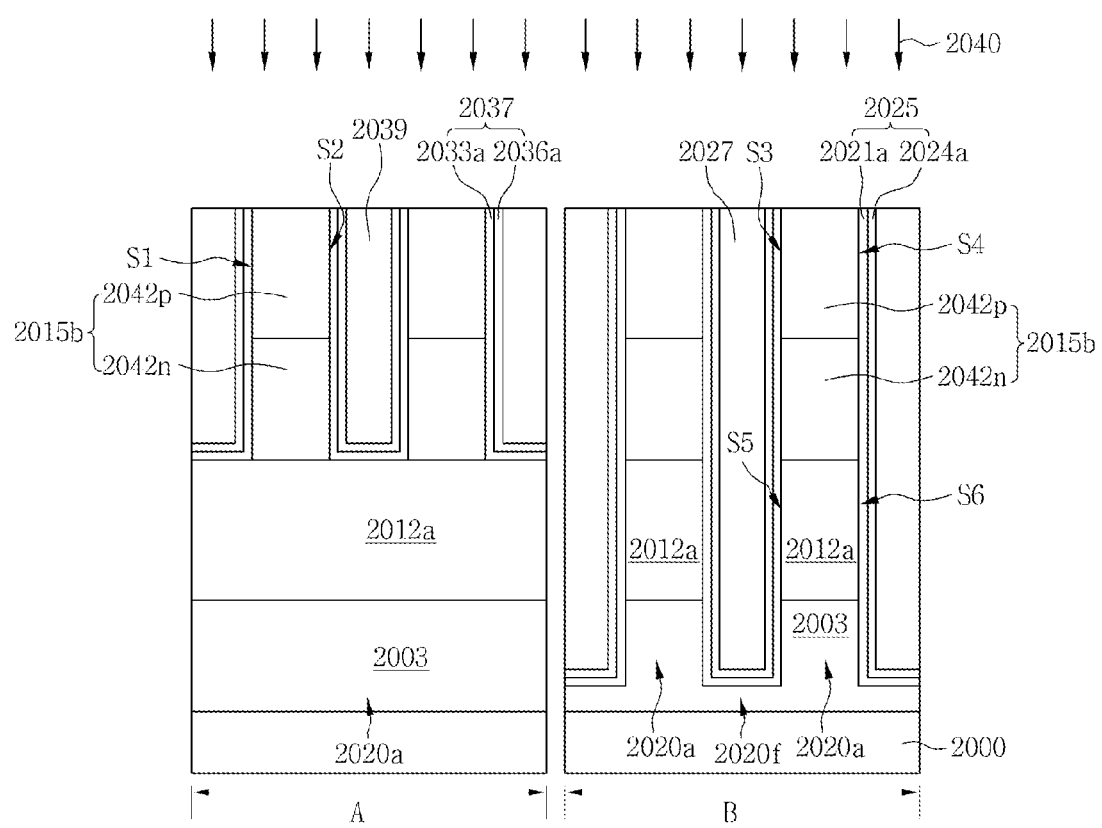

Referring to FIGS. 1 and 45G, a second insulating pattern 2039 may be formed to fill the second opening 2030. The second insulating pattern 2039 may include silicon oxide or a silicon-oxide-based insulating material. The formation of the second insulating pattern 2039 may include forming an insulating layer on the substrate 1000 having the third and fourth layers 2033 and 2036, and planarizing the insulating layer until the semiconductor pattern 2015b is exposed.

Meanwhile, the third and fourth layers 2033 and 2036 may remain within the second opening 2030 and be defined as third and fourth dielectric materials 2033a and 2036a. The third and fourth dielectric materials 2033a and 2036a may be defined as a second barrier region 2037, while the first and second dielectric materials 2021a and 2024a may be defined as a first barrier region 2025.

Thereafter, as described with reference to FIG. 26I, an ion implantation process 2040 for implanting impurities into the semiconductor pattern 2015b may be performed so that a first semiconductor region 2042p can be formed in an upper region of the semiconductor pattern 2015b. Also, a second semiconductor region 2042n may be formed in a lower region of the semiconductor pattern 2015b disposed under the first semiconductor region 2042p.

Next, another modified example of the method of fabricating a semiconductor device according to the example embodiments will be described with reference to FIGS. 46A and 46B.

Figure 46A:
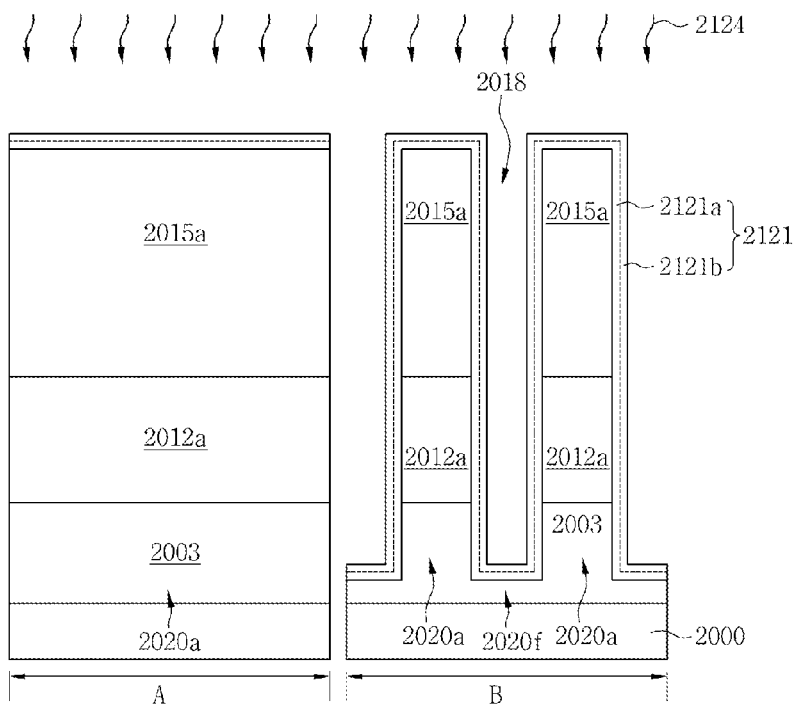
FIGS. 46A and 46B are cross-sectional views illustrating a method of fabricating a semiconductor device according to another modified example of the example embodiments.

Referring to FIGS. 1 and 46A, a semiconductor substrate 2000 having the first opening 2018 and the semiconductor line 2015a may be prepared as described with reference to FIG. 45C.

A dielectric layer may be formed on the semiconductor substrate 2000 having the semiconductor line 2015a. The dielectric layer may be formed of silicon oxide obtained using a thermal oxidation process.

An ion implantation process 2124 may be performed on the substrate 2000 having the dielectric layer so that impurities may be implanted into the dielectric layer to form a first doped dielectric material 2121. The implanted impurities may contain at least one element of N, C, Cl, F, Ar or Xe.

Figure 46B:
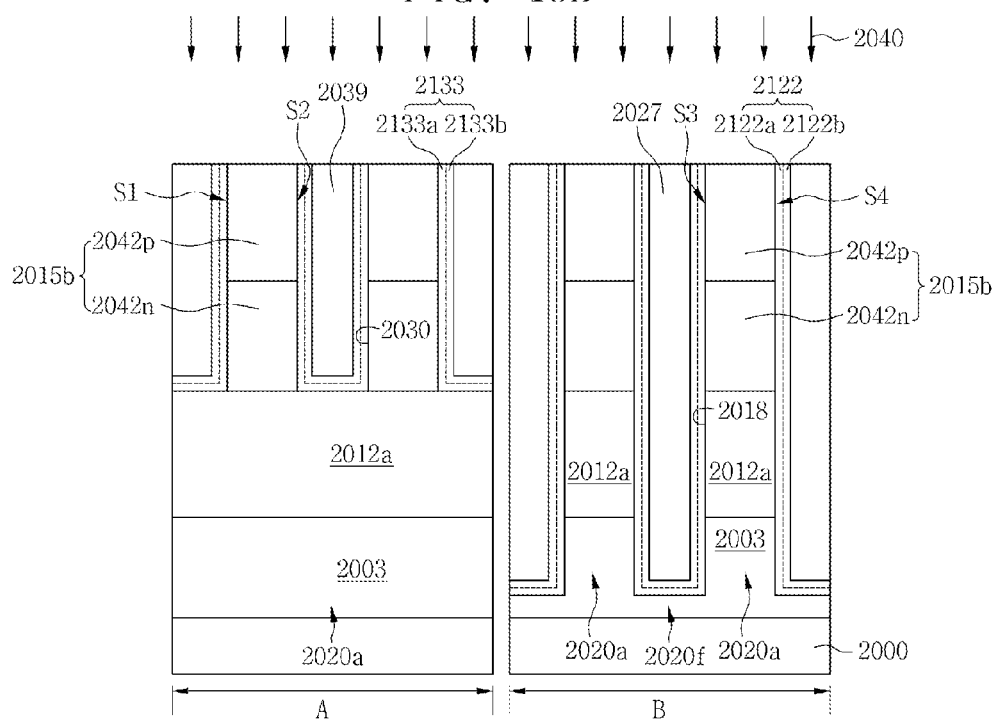

Referring to FIGS. 1 and 46B, as described with reference to FIG. 45E, a first insulating pattern 2027 filling the first opening 2018 may be formed on the substrate 2000 having the first doped dielectric material 2121.

Thereafter, the semiconductor line 2015a may be patterned, thereby forming a semiconductor pattern 2015b and a second opening 2030 exposing both side surfaces of the semiconductor pattern 2015b. A second dielectric layer may be formed on sidewalls and bottom surface of the second opening 2030, and an ion implantation process may be performed to form a second doped dielectric material 2122. Thereafter, a second insulating pattern 2039 may be formed to fill the second opening 2030.

The first and second doped dielectric materials 2122 and 2133 may be defined as first and second barrier regions 2122 and 2133. The first and second doped dielectric materials 2122 and 2133 may include buffer dielectric regions 2122a and 2133a and barrier dielectric regions 2122b and 2133b, respectively. The buffer dielectric region 2122a and 2133a may be closer to the semiconductor pattern 2015b than the barrier dielectric regions 2122b and 2133b. The barrier dielectric regions 2122b and 2133b, which may be formed by doping at least one of N, C, Cl, F, Ar or Xe, may prevent or cut off the diffusion of impurities, such as boron (B).

Thereafter, as described with reference to FIG. 26I, an ion implantation process 2040 for implanting impurities into the semiconductor pattern 2015b may be performed so that a first semiconductor region 2042p can be formed in an upper region of the semiconductor pattern 2015b. Also, a second semiconductor region 2042n may be formed in a lower region of the semiconductor pattern 2015b disposed under the first semiconductor region 2042p.

Next, another modified example of the method of fabricating a semiconductor device according to the example embodiments will be described with reference to FIGS. 47A through 47D.

Figure 47A:
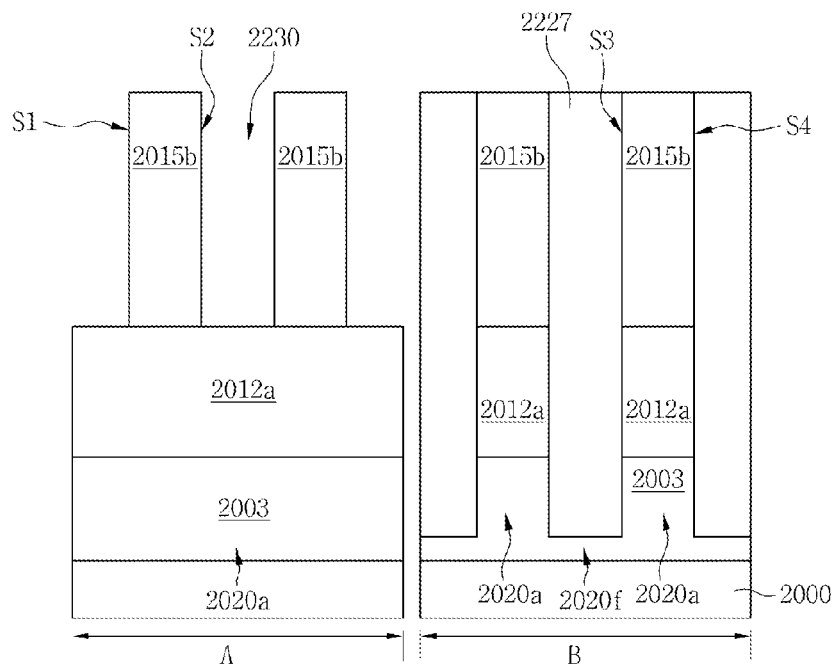
FIGS. 47A through 47D are cross-sectional views illustrating a method of fabricating a semiconductor device according to another modified example of the example embodiments.

Referring to FIGS. 1 and 47A, a substrate may be prepared as described with reference to FIGS. 45A through 45C. For instance, a substrate 2000 having the semiconductor layer 2015a and the first opening 2018 may be prepared as described with reference to FIG. 45C. A sacrificial filling layer 2227 may be formed to fill the first opening 2018.

The semiconductor layer 2015a may be patterned, thereby forming a semiconductor pattern 2015b, which is substantially the same as described with reference to FIG. 45F.

Figure 47B:
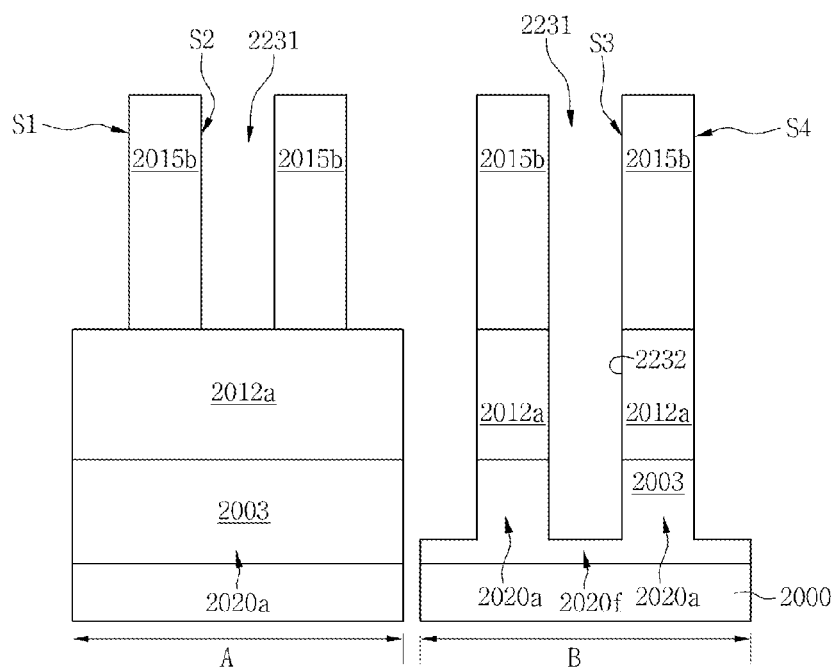

Referring to FIGS. 1 and 47B, the sacrificial filling layer 2227 may be selectively removed, thereby forming an opening 2231 exposing side surfaces of the semiconductor pattern 2015b, and a trench 2232 defining the active region 2020a. Here, the trench 2232 may be a portion of the first opening 2018, which may be disposed in the semiconductor substrate 2000 to define the active region 2020a.

Figure 47C:
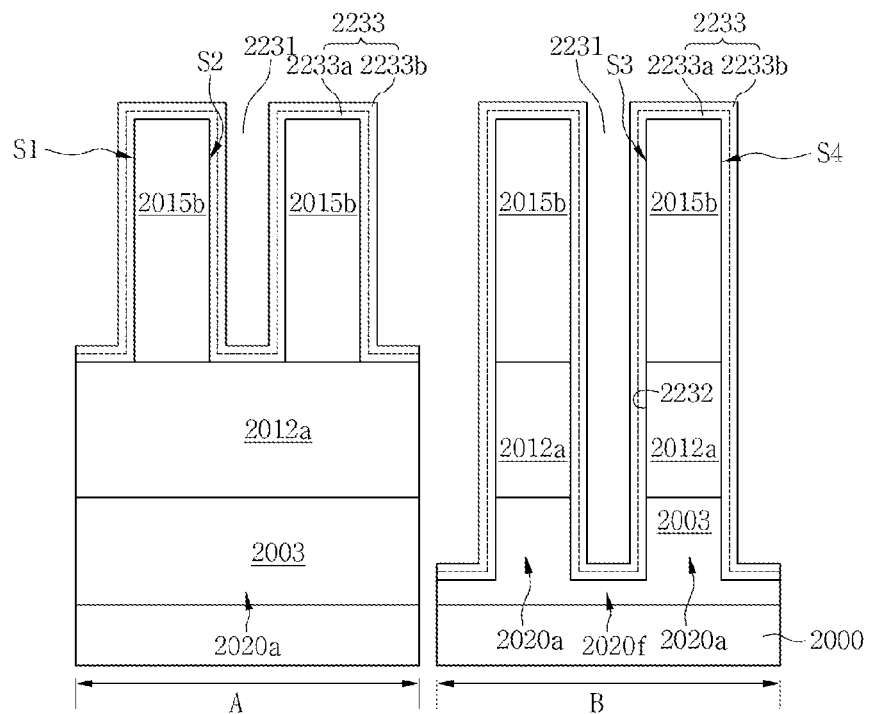

Referring to FIGS. 1 and 47C, a dielectric layer may be formed on the substrate 2000 having the opening 2231 and the trench 2232, and doped to form a doped dielectric material 2233. The doped dielectric material 2233 may include a buffer dielectric region 2233a and a barrier dielectric region 2233b. The buffer dielectric region 2233a may be closer to the semiconductor pattern 2015b than the barrier dielectric region 2233b. The barrier dielectric region 2233b may be a region doped with at least one of N, C, Cl, F, Ar or Xe and prevent or cut off the diffusion of impurities, such as boron (B).

Figure 47D:
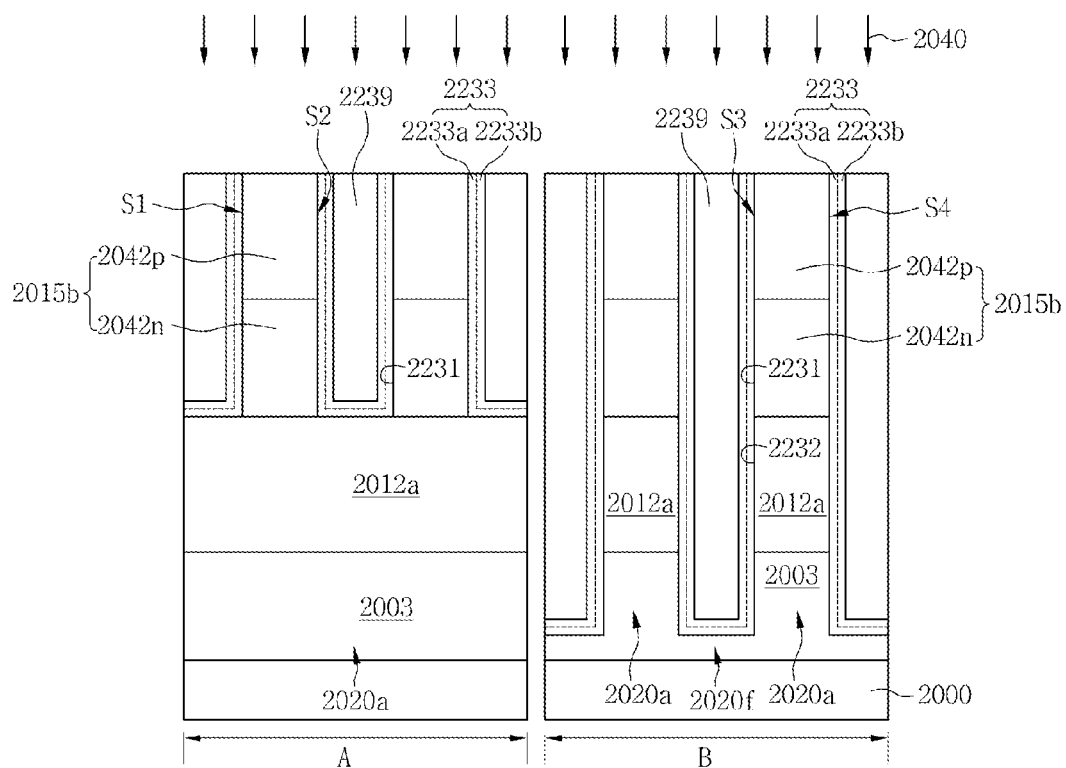

Referring to FIGS. 1 and 47D, an insulating layer may be formed on the substrate 2000 having the doped dielectric material 2233 and planarized, thereby forming an insulating pattern 2239 filling the opening 2231 and the trench 2232.

Thereafter, as described with reference to FIG. 26I, an ion implantation process 2040 for implanting impurities into the semiconductor pattern 2015b may be performed so that a first semiconductor region 2042p can be formed in an upper region of the semiconductor pattern 2015b. Also, a second semiconductor region 2042n may be formed in a lower region of the semiconductor pattern 2015b disposed under the first semiconductor region 2042p.

Next, another modified example of the method of fabricating a semiconductor device according to the example embodiments will be described with reference to FIGS. 48A and 48B.

Figure 48A:
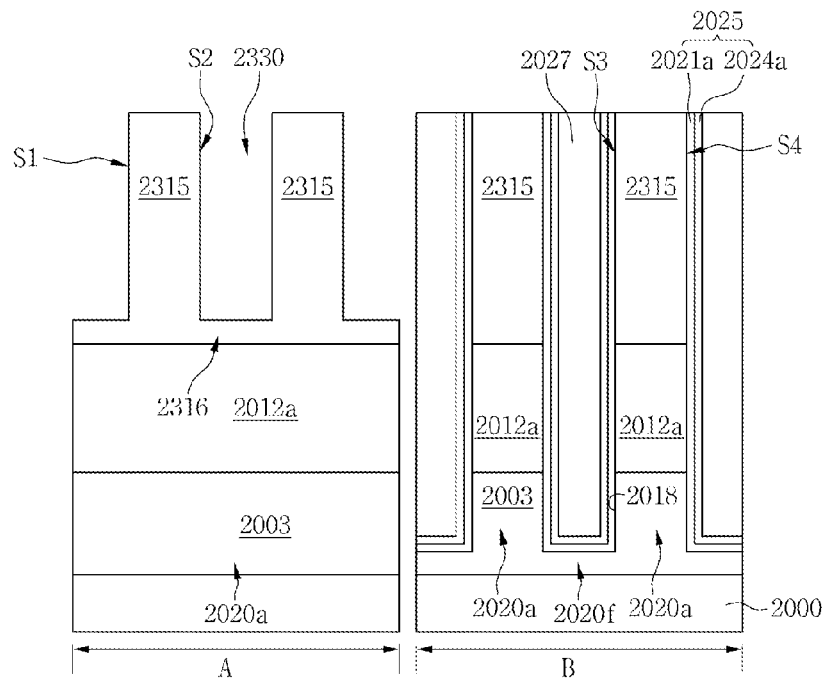
FIGS. 48A and 48B are cross-sectional views illustrating a method of fabricating a semiconductor device according to another modified example of the example embodiments.

Referring to FIGS. 1 and 48A, a semiconductor substrate may be prepared as described with reference to FIGS. 45A through 45E. For example, a semiconductor substrate having the semiconductor line 2015a, the first barrier region 2025, and the first insulating pattern 2027 may be prepared.

The semiconductor line 2015a may be patterned, thereby forming a second opening 2330 and a semiconductor pattern 2315.

A subsidiary semiconductor pattern 2316 may be formed between the plurality of semiconductor patterns 2315 on the active region 2020a. The subsidiary semiconductor pattern 2316 may be formed to a given thickness on the active region 2020a.

Figure 48B:
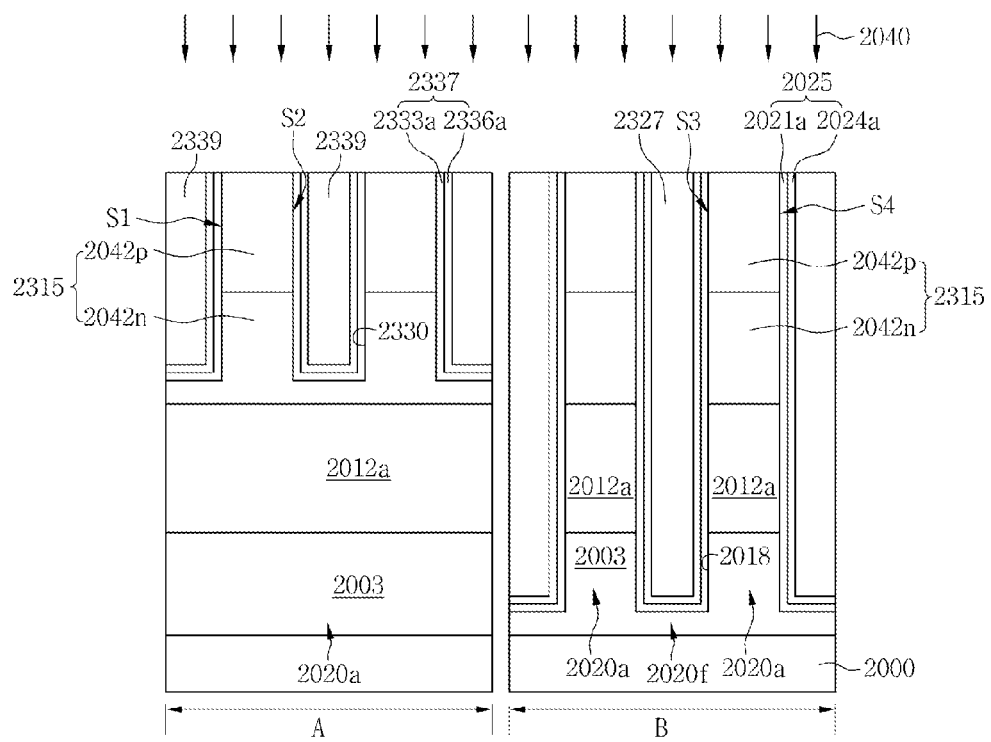

Referring to FIGS. 1 and 48B, a second barrier region 2337 may be formed on side surfaces of the semiconductor pattern 2315 and the subsidiary semiconductor pattern 2316, which are exposed by the second opening 2330, and a second insulating pattern 2339 may be formed to fill the second opening 2330. The second barrier region 2337 may include a second buffer dielectric material 2333a and a second barrier dielectric material 2336a. The second buffer dielectric material 2333a may be closer to the semiconductor pattern 2315 than the second barrier dielectric material 2336a.

Thereafter, as described with reference to FIG. 26I, an ion implantation process 2040 for implanting impurities into the semiconductor pattern 2315 may be performed so that a first semiconductor region 2042p can be formed in an upper region of the semiconductor pattern 2315. Also, a second semiconductor region 2042n may be formed in a lower region of the semiconductor pattern 2315 disposed under the first semiconductor region 2042p.

Next, another modified example of the method of fabricating a semiconductor device according to the example embodiments will be described with reference to FIGS. 49A through 49D.

Figure 49A:
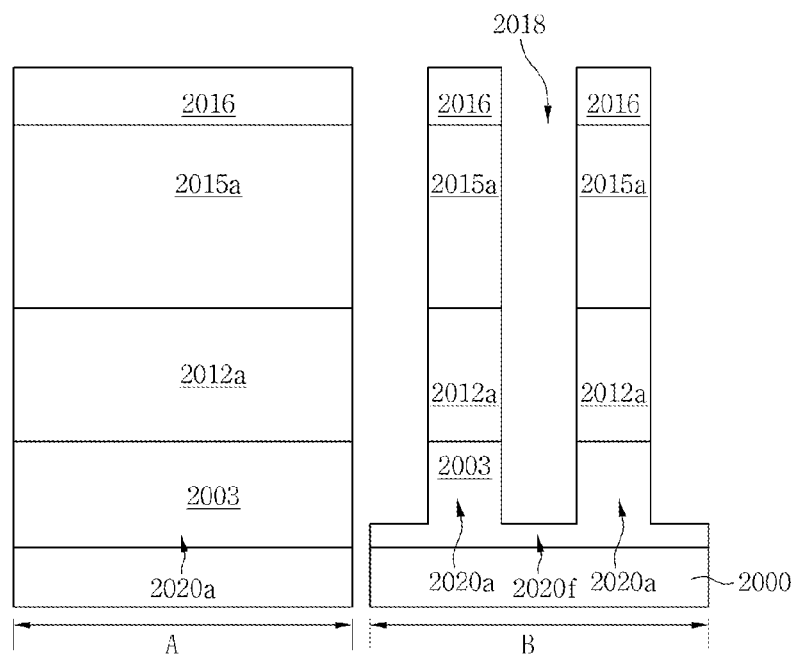
FIGS. 49A through 49D are cross-sectional views illustrating a method of fabricating a semiconductor device according to another modified example of the example embodiments.

Referring to FIGS. 1 and 49A, a semiconductor substrate 2000 may be prepared as described with reference to FIGS. 45A and 45B. For example, a semiconductor substrate 2000 having the semiconductor layer 2015 described with reference to FIG. 45B may be prepared.

A hard mask 2016 may be formed on the semiconductor layer 2015, and the semiconductor layer 2015 and the semiconductor substrate 2000 may be sequentially etched using the hard mask 2016 as an etch mask. As a result, a semiconductor line 2015a and a trench 2018 defining the active region 2020a may be formed.

Figure 49B:
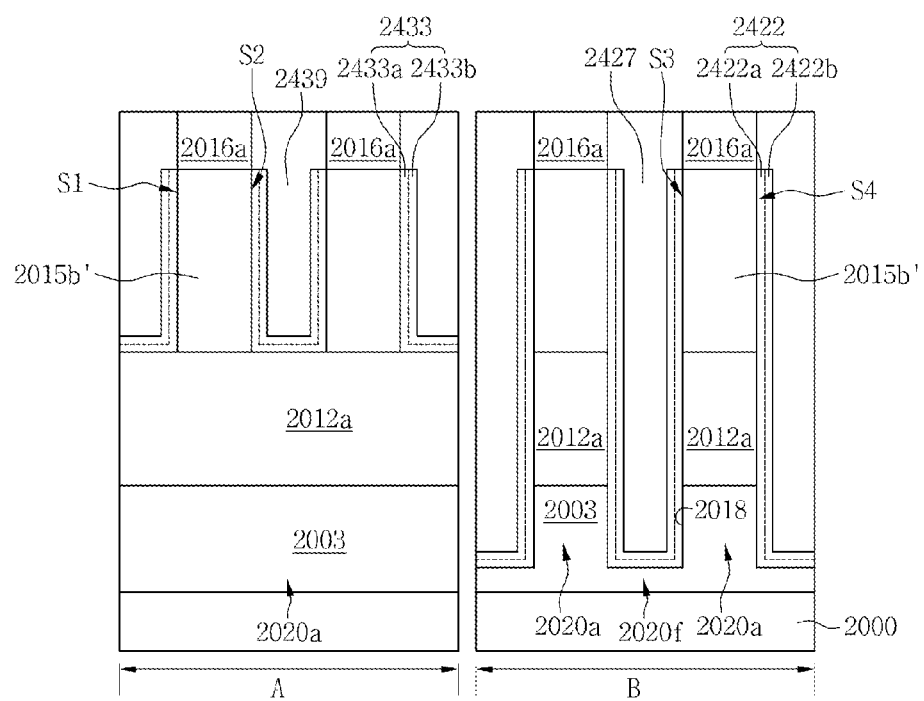

Referring to FIGS. 1 and 49B, a first barrier region 2422 may be formed on side surfaces of the semiconductor line 2015a and side surfaces of the active region 2020a, which may be exposed by the trench 2018. The first barrier region 2422 may include a first buffer dielectric region 2422a and a first barrier dielectric region 2422b. The first buffer dielectric region 2422a may be closer to the semiconductor line 2015a and the active region 2020a than the first barrier dielectric region 2422b. The formation of the first barrier region 2422 may include forming oxide on the side surfaces of the semiconductor line 2015a and the side surfaces of the active region 2020a, which are exposed by the trench 2018, using a thermal oxidation process, and implanting impurities into the oxide. Alternatively, the formation of the first barrier region 2422 may include forming oxide on the side surfaces of the semiconductor line 2015a and the side surfaces of the active region 2020a, which are exposed by the trench 2018, using a thermal oxidation process, and forming a silicon-nitride-based material on the substrate 2000 having the oxide using a deposition process.

An insulating layer may be formed on the substrate 2000 having the first barrier region 2422, and planarized until the hard mask 2016 is exposed, thereby forming a first insulating pattern 2427.

The hard mask 2016 and the semiconductor line 2015a may be patterned, thereby forming a hard mask pattern 2016a and a semiconductor pattern 2015b'. A second opening may be formed to expose side surfaces of the semiconductor pattern 2015b' and the hard mask pattern 2016a stacked sequentially. Thereafter, a dielectric layer may be formed on the substrate 2000 having the semiconductor pattern 2015b', and doped to form a doped dielectric material 2433. The doped dielectric material 2433 may be defined as a second barrier region 2433.

The second barrier region 2433 may include a second buffer dielectric region 2433a and a second barrier dielectric region 2433b. The second buffer dielectric region 2433a may be closer to the semiconductor pattern 2015b' and the active region 2020a than the second barrier dielectric region 2433b. The formation of the second barrier region 2433 may include forming oxide on two opposite side surfaces of the semiconductor pattern 2015b and a surface of the active region 2020a using a thermal oxidation process, and implanting impurities into the oxide. Alternatively, the formation of the second barrier region 2433 may include forming oxide on the two opposite side surfaces of the semiconductor pattern 2015b and the surface of the active region 2020a using a thermal oxidation process, and forming a silicon-nitride-based material on the substrate 2000 having the oxide using a deposition process.

Thereafter, an insulating layer may be formed on the substrate 2000 having the second barrier region 2433, and planarized until the hard mask pattern 2016a is exposed, thereby forming a second insulating pattern 2439.

Figure 49C:
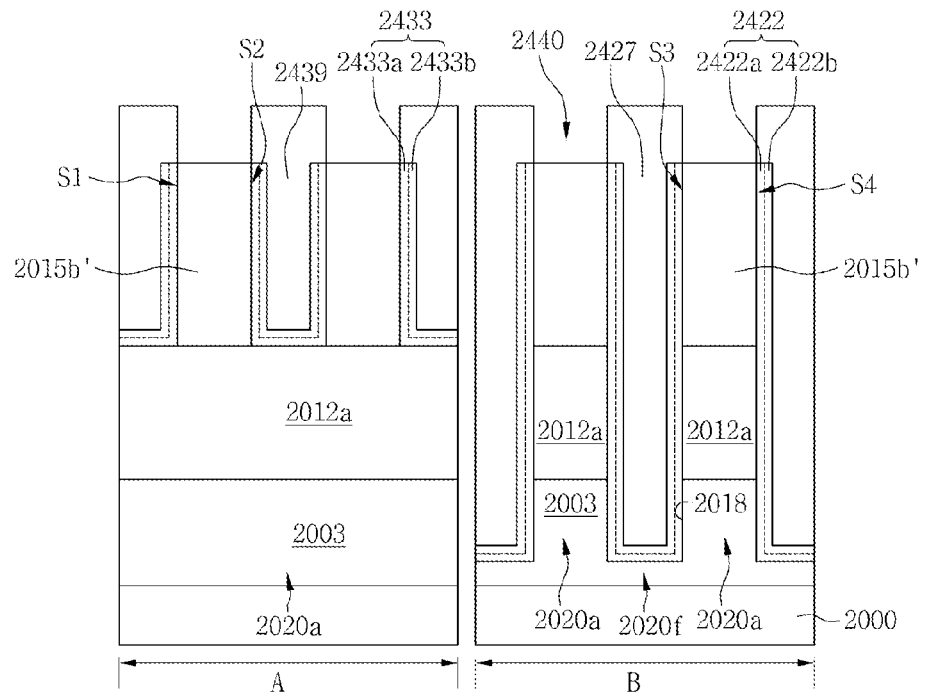

Referring to FIGS. 1 and 49C, the hard mask pattern 2016a may be selectively removed to form a vacant space 2440.

Figure 49D:
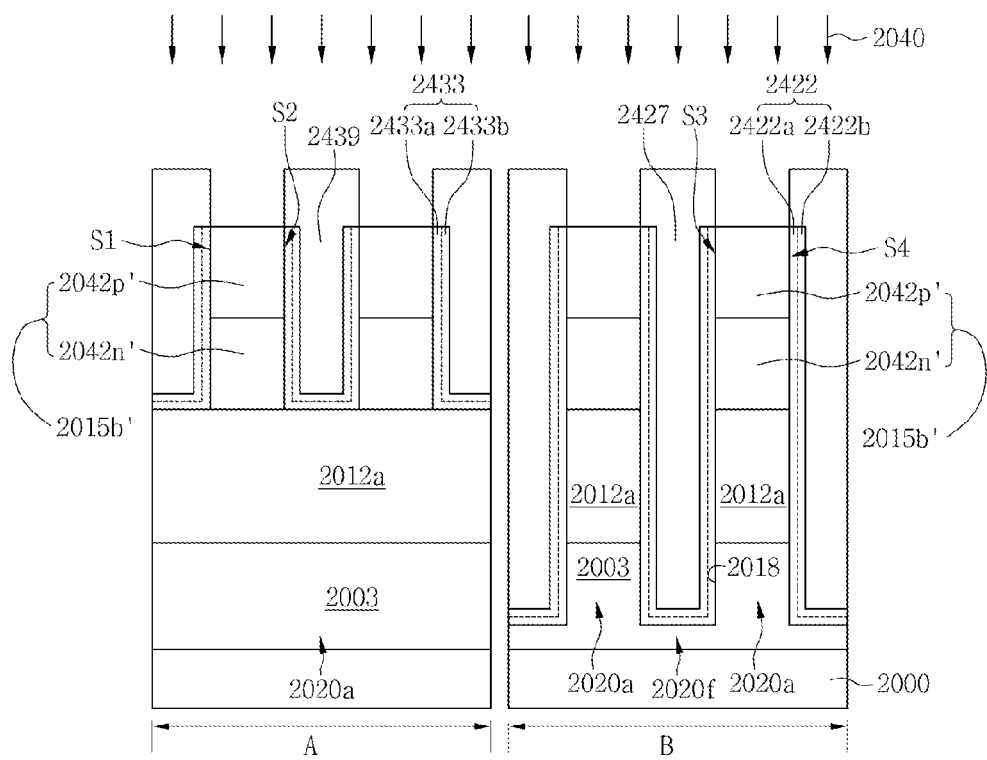

Referring to FIGS. 1 and 49D, as described with reference to FIG. 26I, an ion implantation process 2040 for implanting impurities into the semiconductor pattern 2015b' may be performed so that a first semiconductor region 2042p can be formed in an upper region of the semiconductor pattern 2015b'. Also, a second semiconductor region 2042n may be formed in a lower region of the semiconductor pattern 2015b' disposed under the first semiconductor region 2042p.

According to the example embodiments, a highly integrated vertical diode can be provided without degrading electrical properties. To prevent degradation of the electrical properties of the vertical diode, a barrier region can be provided to surround side surfaces of the vertical diode. The barrier region can prevent or cut off the diffusion of impurities, such as boron (B), from the diode into an interlayer insulating layer disposed around the diode. Accordingly, since a reduction in the concentration of impurities contained in the vertical diode can be prevented, degradation of the electrical properties of the vertical diode can be prevented. Also, the barrier region can include a doped oxide, or include a nitride spaced apart from the diode. Therefore, since the vertical diode is not in direct contact with the nitride, degradation of the electrical properties or reliability of the vertical diode due to the nitride can be prevented.

Figure 50:
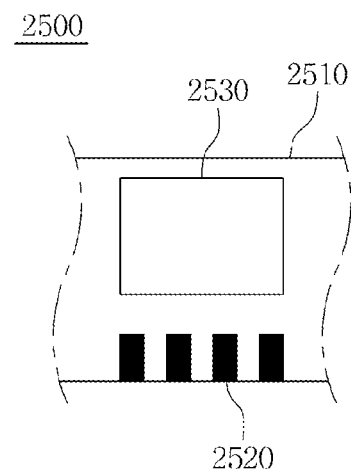
FIG. 50 is a schematic view of a memory card including a semiconductor device according to example embodiments.

FIG. 50 is a schematic view of a memory card including a semiconductor device according to example embodiments.

Referring to FIG. 50, a memory card 2500 may include a card substrate 2510, one semiconductor device or a plurality of semiconductor devices 2530 disposed on the card substrate 2510, and contact terminals 2520 formed in a row on one edge of the card substrate 2510, and electrically connected to the semiconductor devices 2530, respectively. Here, each of the semiconductor devices 2530 may be a memory chip or semiconductor package including one of the above-described semiconductor devices according to the example embodiments and modified examples thereof. The memory card 2500 may be a memory card used for an electronic device, such as a digital camera, a computer, or a portable storage device.

The card substrate 2510 may be a printed circuit board (PCB). Both surfaces of the card substrate 2510 may be used. That is, the semiconductor devices 2530 may be disposed on front and rear surfaces of the card substrate 2510. The semiconductor devices 2530 disposed on the front surface and/or rear surface of the card substrate 2510 may be electrically or mechanically connected to the card substrate 2510.

The contact terminals 2520 may be formed of a metal and have oxidation resistance. The contact terminals 2520 may be variously determined according to the kind and standards of the memory card 2500. Therefore, the number of shown contact terminals 2520 is not particularly significant.

Figure 51:
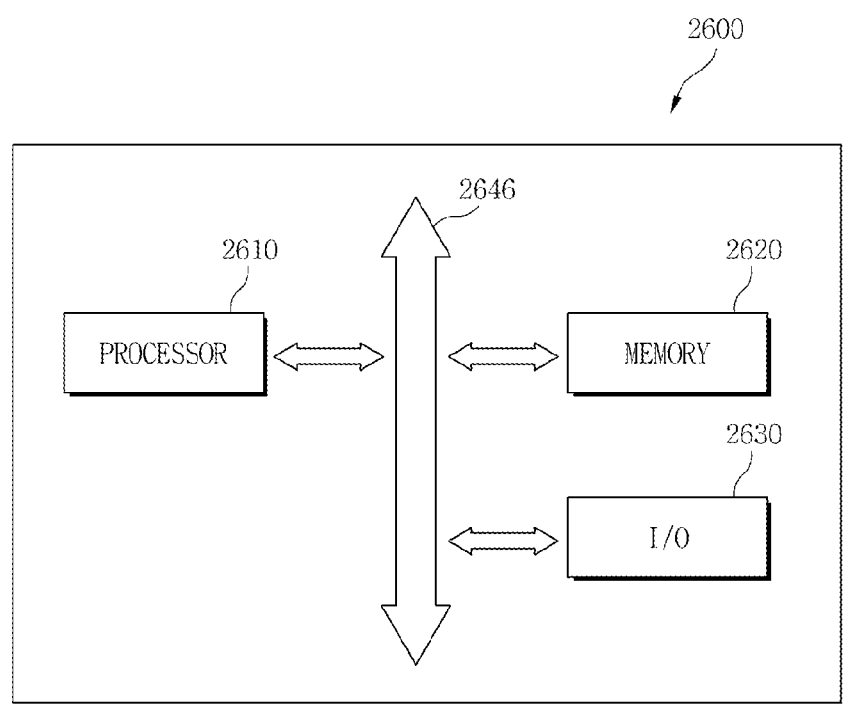
FIG. 51 is a block diagram of an electronic system including a semiconductor device according to example embodiments.

FIG. 51 is a block diagram of an electronic system including a semiconductor device according to example embodiments.

Referring to FIG. 51, an electronic system 2600 may be provided. The electronic system 2600 may include a processor 2610, a memory 2620, and an input/output (I/O) device 2630. The processor 2610, the memory 2620, and the I/O device 2630 may be connected through a bus 2646.

The memory 2620 may receive control signals, such as RAS*, WE*, and CAS*, from the processor 2610. The memory 2620 may store codes and data for operations of the processor 2610. The memory 2620 may be used to store data accessed through the bus 2646.

The memory 2620 may include a memory device having any one of the semiconductor devices according to the example embodiments and modified examples thereof. For specific realization and modification of example embodiments, additional circuits and control signals may be provided.

The electronic system 2600 may constitute various electronic control systems that may require the memory 2620. For example, the electronic system 2600 may be used for a computer system, a wireless communication system (e.g., a personal digital assistant (PDA), a laptop computer, a portable computer, a web tablet, a wireless phone, a portable phone, a digital music player, an MP3 player, a navigation, a solid-state disk (SSD), or a household appliance), or any device capable of transceiving information in wireless environments.

Specifically embodied and modified examples of the electronic system 2600 will now be described with reference to FIGS. 52 and 53.

Figure 52:
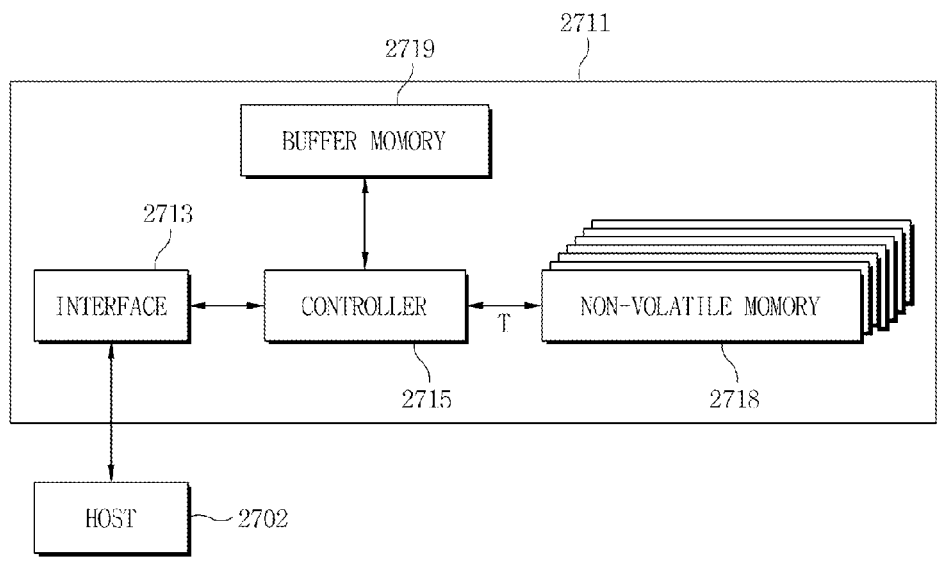
FIG. 52 is a block diagram of a data storage device including a semiconductor device according to example embodiments.

FIG. 52 is a block diagram of a data storage device including a semiconductor device according to example embodiments.

Referring to FIG. 52, an electronic device may be a data storage device, such as an SSD 2711. The SSD 2711 may include an interface 2713, a controller 2715, a non-volatile memory 2718, and a buffer memory 2719.

The SSD 2711 may store information using a semiconductor device. As compared with a hard disk drive (HDD), the SSD 2711 may operate at high speed, reduce mechanical delay, failure rate, generation of heat, and noise, and be downscaled and made lightweight. The SSD 2711 may be widely used for laptop personal computers (laptop PCs), netbooks, desktop PCs, MP3 players, or portable storage devices.

The controller 2715 may be formed close to and electrically connected to the interface 2713. The controller 2715 may be a microprocessor (MP) including a memory controller and a buffer controller. The non-volatile memory 2718 may be formed close to and electrically connected to the controller 2715 through a connection terminal T. The SSD 2711 may have data capacity corresponding to the non-volatile memory 2718. The buffer memory 2719 may be formed close to and electrically connected to the controller 2715.

The interface 2713 may be connected to a host 2702 and serve to transmit and receive electric signals, such as data. For example, the interface 2713 may be an apparatus using a standard, such as serial advanced technology attachment (SATA), integrated drive electronics (IDE), small computer system interface (SCSI), and/or a combination thereof. The non-volatile memory 2718 may be connected to the interface 2713 through the controller 2715.

The non-volatile memory 2718 may function to store data received through the interface 2713. The non-volatile memory 2718 may include a semiconductor device according to example embodiments.

Even if power supplied to the SSD 2711 is interrupted, the non-volatile memory 2718 may be characterized by retaining the stored data.

The buffer memory 2719 may include a volatile memory device. The volatile memory device may be a dynamic random access memory (DRAM) and/or a static random access memory (SRAM). The buffer memory 2719 may operate at a higher speed than the non-volatile memory device 2718.

Data processing speed of the interface 2713 may be higher than operation speed of the non-volatile memory device 2718. Here, the buffer memory 2719 may function to temporarily store data. After data received through the interface 2713 is temporarily stored in the buffer memory 2719 through the controller 2715, the received data may be permanently stored in the non-volatile memory 2718 at a data write speed of the non-volatile memory 2718. Also, among the data stored in the non-volatile memory 2718, frequently used data may be previously read and temporarily stored in the buffer memory 2719. That is, the buffer memory 2719 may function to increase effective operating speed of the SSD 2711 and reduce error rate.

Figure 53:
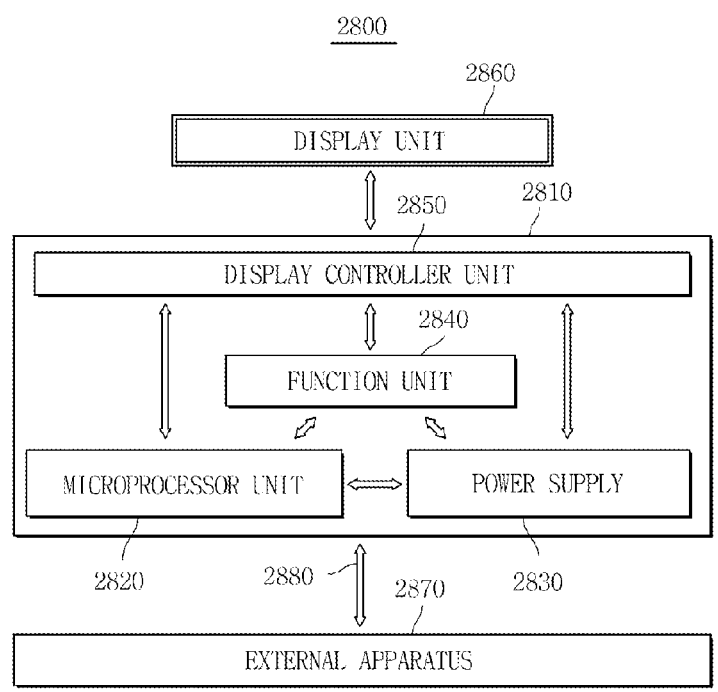

FIG. 53 is a block diagram of an electronic system including a semiconductor device according to example embodiments.

Referring to FIG. 53, a semiconductor device according to an example embodiment may be applied to an electronic system 2800. The electronic system 2800 may include a body 2810, a microprocessor (MP) unit 2820, a power supply unit 2830, a function unit 2840, and a display controller unit 2850. The body 2810 may be a mother board including a printed circuit board (PCB). The MP unit 2820, the power supply unit 2830, the function unit 2840, and the display controller unit 2850 may be mounted on the body 2810. The display unit 2860 may be disposed inside or outside the body 2810. For example, the display unit 2860 may be disposed on the surface of the body 2810 and display an image processed by the display controller unit 2850.

The power supply unit 2830 may function to receive a given voltage from an external battery (not shown), divide the voltage into required voltage levels, and supply the divided voltages to the MP unit 2820, the function unit 2840, and the display controller unit 2850. The MP unit 2820 may receive a voltage from the power supply unit 2830 and control the function unit 2840 and the display unit 2860. The function unit 2840 may serve various functions of the electronic system 2800. For example, when the electronic system 2800 is a portable phone, the function unit 2840 may include several components capable of serving various functions of the portable phone, for example, outputting an image to the display unit 2860 or outputting a voice to a speaker, by dialing or communicating with an external apparatus 2870. When a camera is also mounted, the function unit 2840 may serve as a camera image processor.

In applied example embodiments, when the electronic system 2800 is connected to a memory card to increase capacity, the function unit 2840 may be a memory card controller. The function unit 2840 may transmit/receive signals to/from the external apparatus 2870 through a wired or wireless communication unit 2880. Furthermore, when the electronic system 2800 requires a universal serial bus (USB) to increase functionality, the function unit 2840 may serve as an interface controller. A semiconductor device according to example embodiments may be applied to at least one of the MP unit 2820 and the function unit 2840.

The foregoing is illustrative of example embodiments and is not to be construed as limiting thereof. Although a few example embodiments have been described, those skilled in the art will readily appreciate that many modifications are possible without materially departing from the novel teachings and advantages. Accordingly, all such modifications are intended to be included within the scope of this disclosure as defined in the claims. In the claims, means-plus-function clauses are intended to cover the structures described herein as performing the recited function, and not only structural equivalents but also equivalent structures.

What is claimed is:

1. A semiconductor device, comprising:
   a field region in a semiconductor substrate to define an active region;
   an interlayer insulating layer on the semiconductor substrate;
   a semiconductor pattern within a hole vertically extending through the interlayer insulating layer, the semiconductor pattern being in contact with the active region; and
   a barrier region between the semiconductor pattern and the interlayer insulating layer, the barrier region including a first buffer dielectric material and a barrier dielectric material,
   wherein the first buffer dielectric material is between the barrier dielectric material and the semiconductor pattern, and the barrier dielectric material is spaced apart from both the semiconductor pattern and the active region.

2. The device of claim 1, wherein the semiconductor pattern includes a first semiconductor region and a second semiconductor region under the first semiconductor region,
   wherein the first semiconductor region includes impurities of a first conductivity type, and the second semiconductor region includes impurities of a second conductivity type different from the first conductivity type of the first semiconductor region, and
   wherein the barrier region is between the second semiconductor region and the interlayer insulating layer.

3. The device of claim 1, wherein the barrier region further includes a second buffer dielectric material between the barrier dielectric material and the active region.

4. The device of claim 1, wherein the field region includes a trench in the semiconductor substrate and an isolation pattern filling the trench.

5. The device of claim 4, wherein the barrier region includes a first portion between the active region and the interlayer insulating layer, and a second portion between the isolation pattern and the interlayer insulating layer, the first portion has a first vertical thickness, and the second portion has a second vertical thickness less than the first vertical thickness.

6. The device of claim 4, further comprising:
   a lower insulating layer between the interlayer insulating layer and the active region, and between the interlayer insulating layer and the isolation pattern,
   wherein a vertical thickness of the lower insulating layer is greater than a horizontal width of the barrier region.

7. The device of claim 4, wherein a portion of the isolation pattern extends upward and penetrates the interlayer insulating layer.

8. The device of claim 1, wherein a top surface of the active region, which is spaced apart from the semiconductor pattern and close to the barrier region, is disposed at a higher level than a bottom end of the semiconductor pattern.

9. The device of claim 1, wherein the first buffer dielectric material includes a silicon oxide, and the barrier dielectric material includes a doped silicon oxide having a higher dielectric constant than the first buffer dielectric material.

10. The device of claim 1, wherein the semiconductor pattern has first and second side surfaces disposed opposite each other,
the active region has a line shape having first and second side surfaces disposed opposite each other, and
the first and second side surfaces of the active region are vertically aligned with the first and second side surfaces of the semiconductor pattern.

11. The device of claim 1, wherein the semiconductor pattern partially fills the hole, and
the barrier region is between the semiconductor pattern and the interlayer insulating layer and extends on a sidewall of the hole at a higher level than the semiconductor pattern.

12. A semiconductor device, comprising:
an active region in a semiconductor substrate;
a lower insulating layer and an upper insulating layer sequentially stacked on the active region;
a semiconductor pattern extending through the upper and lower insulating layers, the semiconductor pattern including a first semiconductor region and a second semiconductor region under the first semiconductor region; and
a barrier region on lateral surfaces of the first semiconductor region of the semiconductor pattern,
wherein the barrier region includes a doped silicon oxide.

13. The device of claim 12, wherein the barrier region is a portion of the upper insulating layer close to the semiconductor pattern.

14. The device of claim 12, further comprising:
an oxide region between the semiconductor pattern and the lower insulating layer.

15. The device of claim 12, wherein the barrier region has a higher dielectric constant than the upper insulating layer, and the lower insulating layer has a higher dielectric constant than the barrier region.

16. A semiconductor device, comprising:
a semiconductor substrate having an active region and a field region delimiting the active region;
an interlayer insulating layer on the semiconductor substrate;
a barrier layer structure extending along lateral surfaces of the interlayer insulating layer; and
a semiconductor pattern extending through the interlayer insulating layer and in contact with the active region, the barrier layer structure is configured to prevent diffusion of impurities from the semiconductor pattern into the interlayer insulating layer,
wherein the barrier layer structure includes a barrier dielectric material and a first buffer dielectric material insulating the barrier dielectric material from the active region and the semiconductor pattern.

17. The semiconductor device of claim 16, wherein the barrier dielectric material is integral with the first buffer dielectric material.

18. The semiconductor device of claim 16, wherein the barrier layer structure is a two layer structure.

19. The semiconductor device of claim 18, wherein the barrier layer structure has a height equal to, or greater than, a height of the semiconductor pattern.

20. The semiconductor device of claim 16, wherein the interlayer insulating layer extends into the active region.

* * * * *